(12) United States Patent
Enomoto et al.

(10) Patent No.: US 6,492,255 B2
(45) Date of Patent: Dec. 10, 2002

(54) SEMICONDUCTOR CHIP AND METHOD MANUFACTURING THE SAME

(75) Inventors: Ryo Enomoto, Gifu (JP); Hideo Yabashi, Gifu (JP); Tadashi Sugiyama, Gifu (JP); Kenzo Hatada, Katano (JP)

(73) Assignee: Ibiden Co., LTD, Ogaki (JP)

( * ) Notice: Subject to any disclaimer, the term of this patent is extended or adjusted under 35 U.S.C. 154(b) by 61 days.

(21) Appl. No.: 09/821,070

(22) Filed: Mar. 30, 2001

(65) Prior Publication Data

US 2001/0049187 A1 Dec. 6, 2001

Related U.S. Application Data

(63) Continuation of application No. PCT/JP99/05285, filed on Sep. 27, 1999.

(30) Foreign Application Priority Data

| Sep. 30, 1998 | (JP) | 10-294637 |
| Sep. 30, 1998 | (JP) | 10-294638 |
| Aug. 2, 1999 | (JP) | 11-219249 |
| Aug. 2, 1999 | (JP) | 11-219250 |
| Aug. 2, 1999 | (JP) | 11-219251 |

(51) Int. Cl.$^7$ .................... H01L 21/44; H01L 23/48; H01L 23/52
(52) U.S. Cl. ............... 438/614; 438/613; 438/637; 438/658; 438/687; 257/737; 257/748; 257/750; 257/781
(58) Field of Search .......................... 257/737, 739, 257/748, 750, 759, 762, 765, 766, 771, 772, 774, 781; 438/106, 614, 612, 613, 615, 637, 638, 642, 652, 658, 678, 687, 688

(56) References Cited

U.S. PATENT DOCUMENTS

| 3,772,077 A | * | 11/1973 | Magee ................... 438/612 |
| 4,167,459 A | * | 9/1979 | Lee et al. ................ 205/239 |
| 4,482,596 A | * | 11/1984 | Gulla et al. ............. 428/131 |
| 4,613,069 A | * | 9/1986 | Falke et al. ............. 228/211 |
| 4,908,078 A | * | 3/1990 | Muramatsu et al. ..... 148/439 |
| 5,492,863 A | * | 2/1996 | Higgins, III ........... 438/610 |
| 5,508,228 A | * | 4/1996 | Nolan et al. ........... 438/614 |
| 5,830,563 A | * | 11/1998 | Shimoto et al. ........ 428/209 |
| 5,933,713 A | * | 8/1999 | Farnworth ............. 438/127 |
| 6,051,879 A | * | 4/2000 | Jiang ..................... 257/751 |
| 6,093,971 A | * | 7/2000 | Oppermann et al. ... 257/783 |
| 6,228,678 B1 | * | 5/2001 | Gilleo et al. ........... 438/108 |
| 6,370,768 B1 | * | 4/2002 | Itabashi ................. 29/852 |

FOREIGN PATENT DOCUMENTS

| JP | 2-232928 | 9/1990 |
| JP | 5-47768 | 2/1993 |
| JP | 9-312295 | 12/1997 |
| JP | 9-321049 | 12/1997 |

* cited by examiner

*Primary Examiner*—Matthew Smith
*Assistant Examiner*—Lex H. Malsawma
(74) *Attorney, Agent, or Firm*—Oblon, Spivak, McClelland, Maier & Neustadt, P.C.

(57) ABSTRACT

A via 42 is formed by copper plating on a surface of an aluminum electrode pad 32 of a semiconductor chip 30. Since the via 42 having flexibility absorbs a stress generated due to a difference in thermal expansion between the semiconductor chip 30 and a substrate, the semiconductor chip 30 can be mounted onto the substrate 50 with high reliability and connection reliability of the semiconductor chip 30 can be enhanced.

65 Claims, 43 Drawing Sheets

Fig. 6
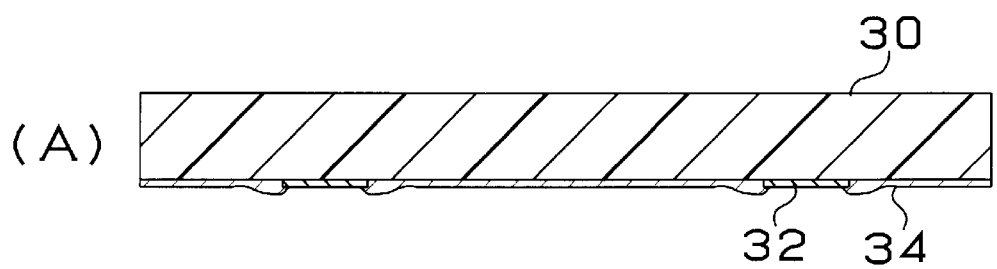
(A)
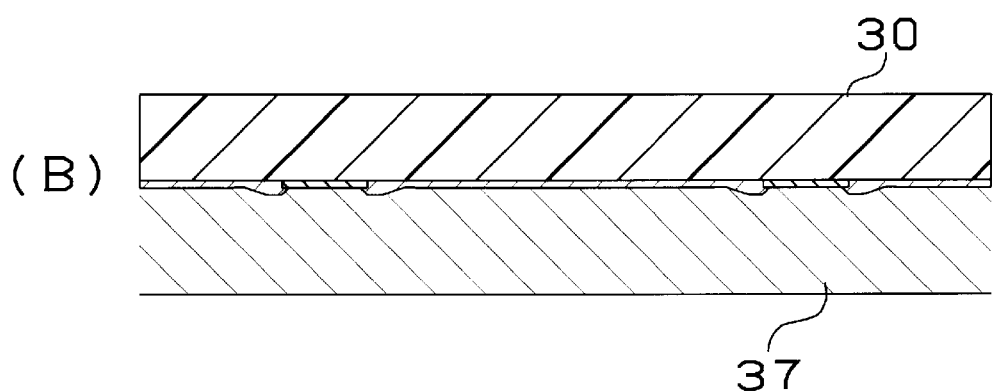
(B)
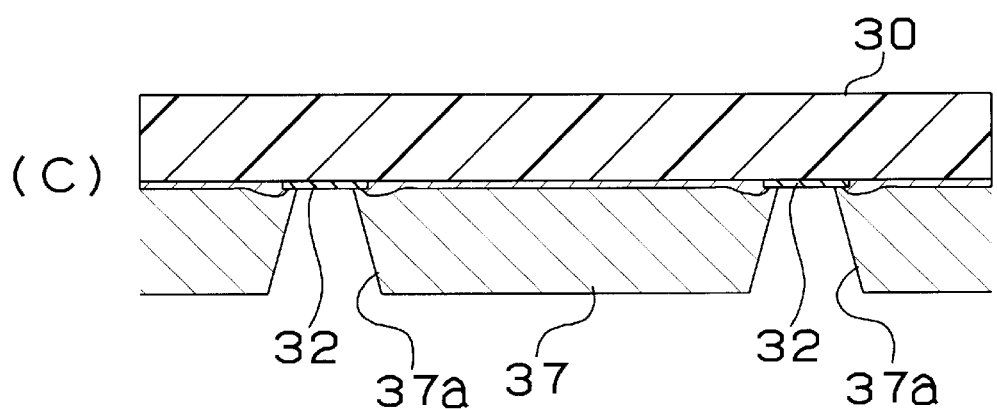
(C)
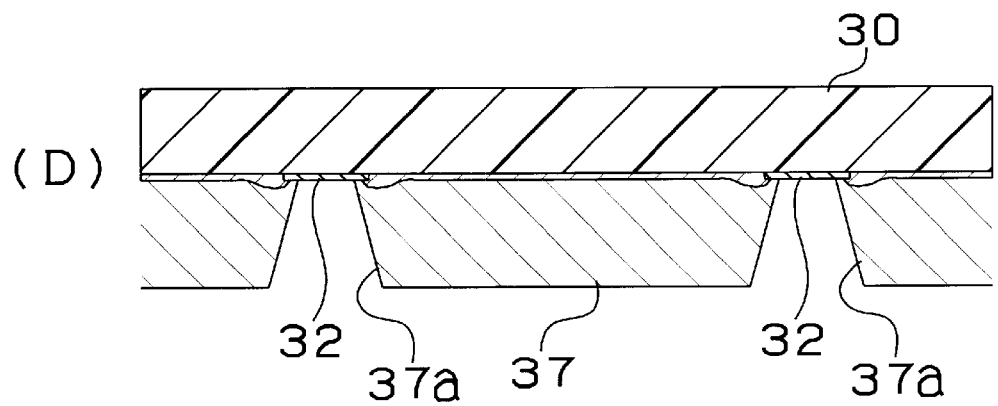
(D)

Fig. 10
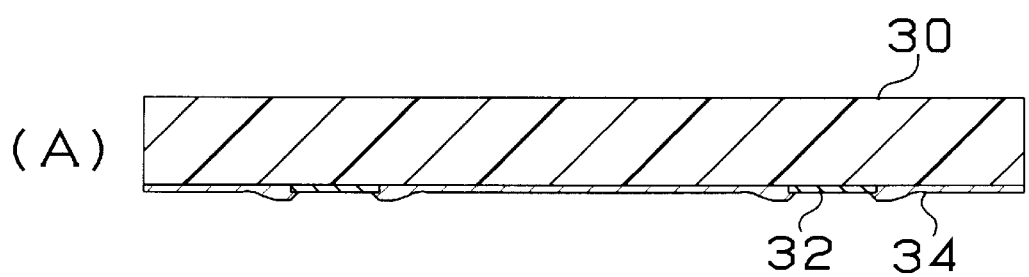
(A)
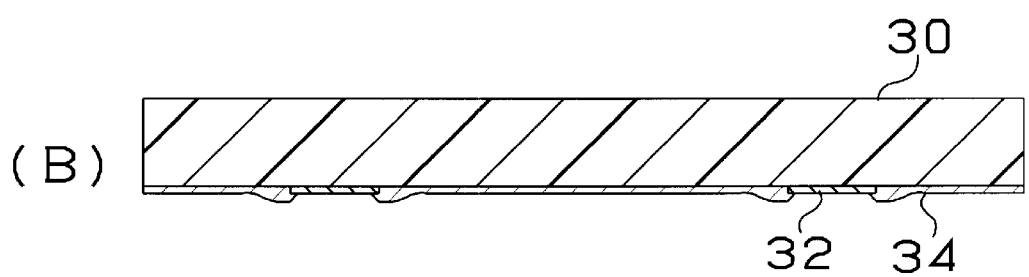
(B)
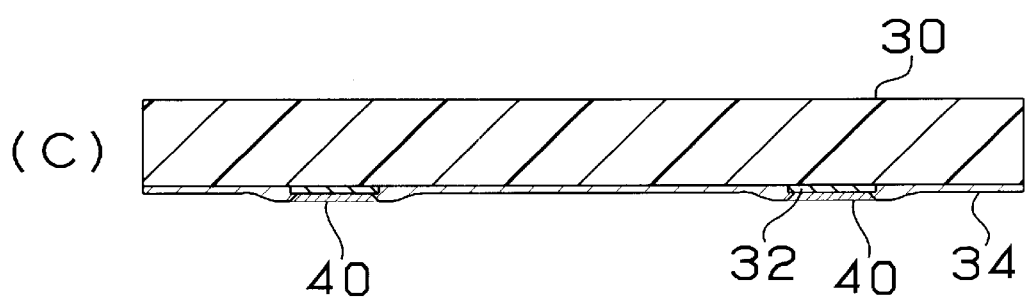
(C)
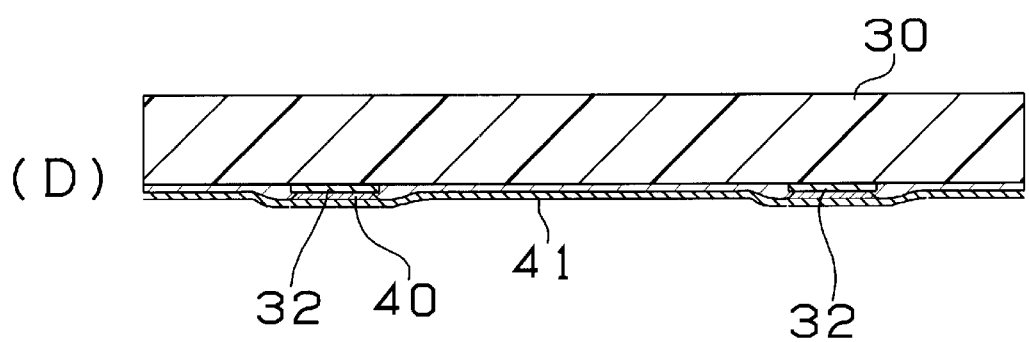
(D)

Fig. 11
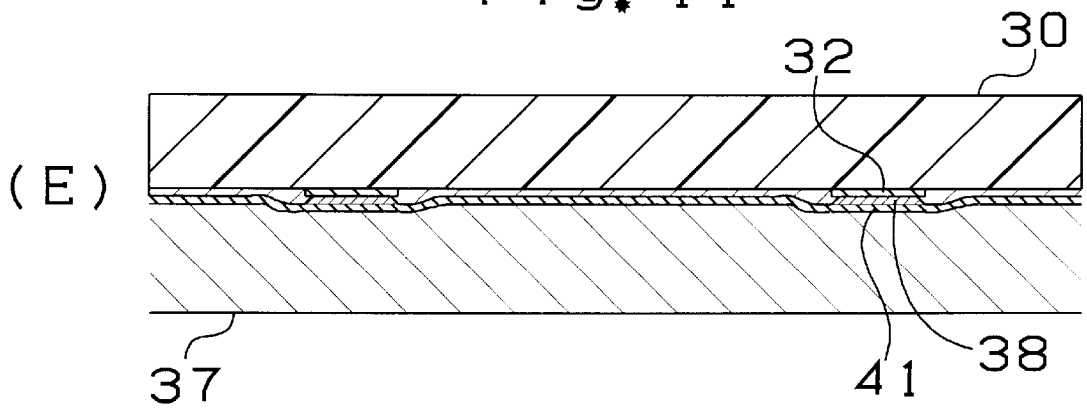
(E)
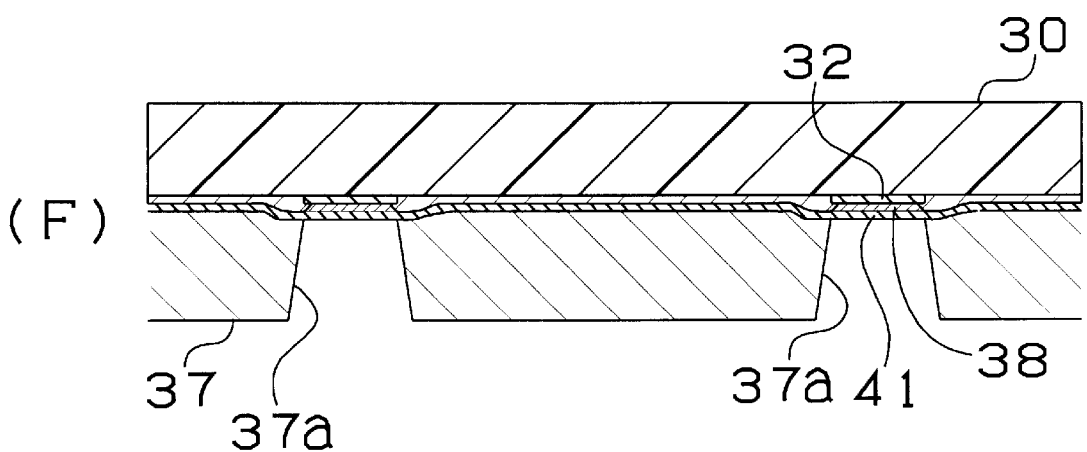
(F)
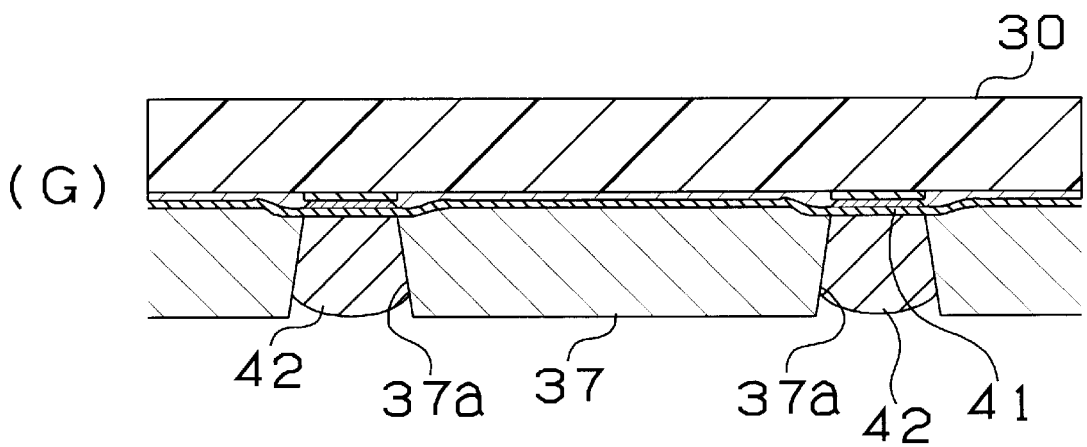
(G)

Fig. 14
(A) 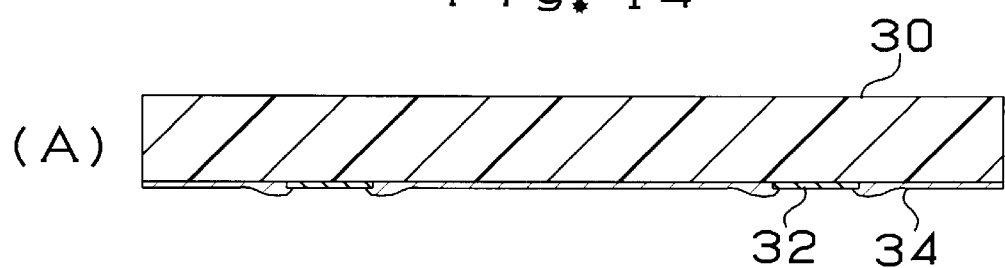
(B) 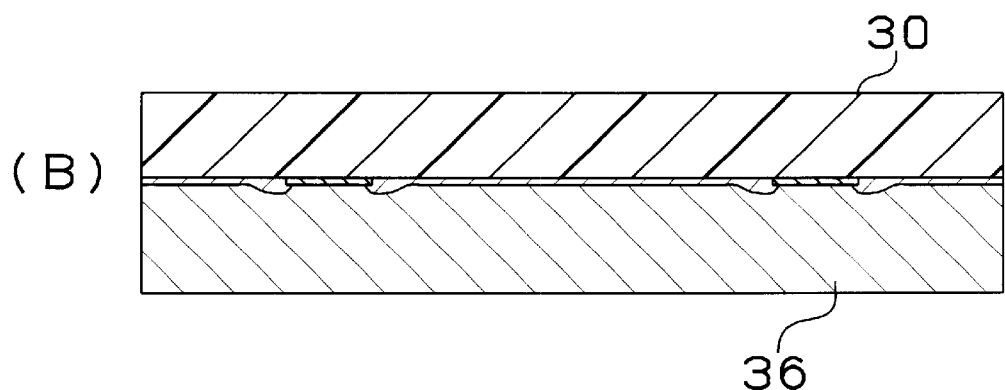
(C) 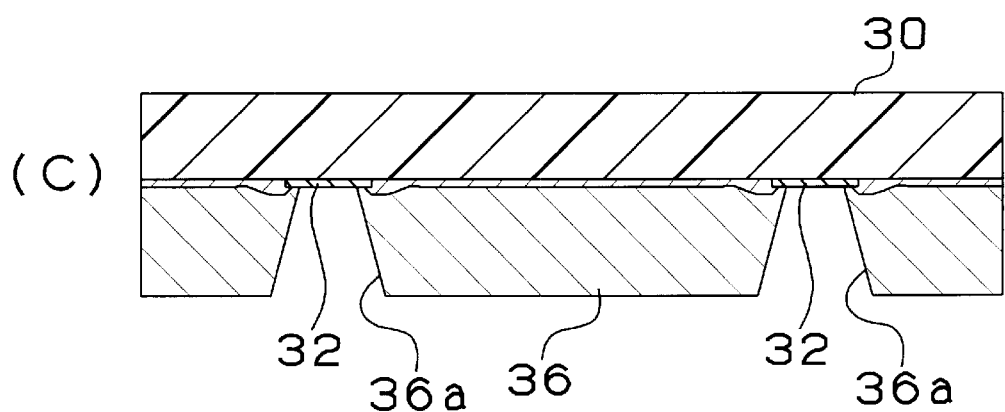
(D) 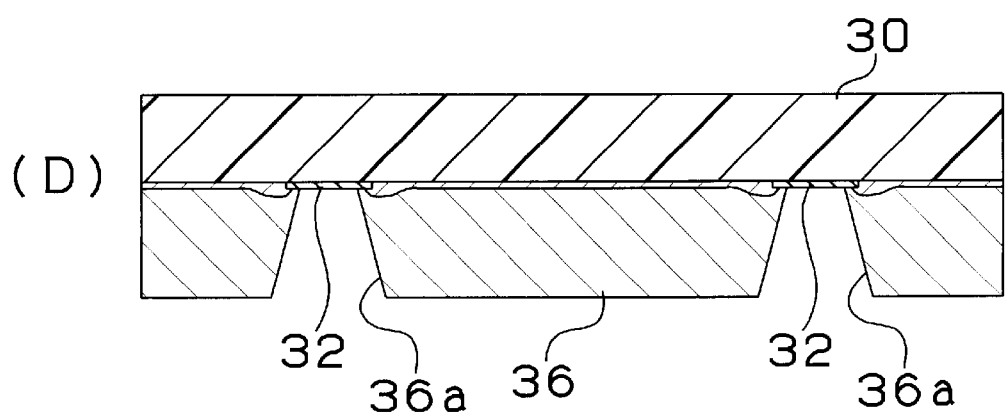

Fig. 23
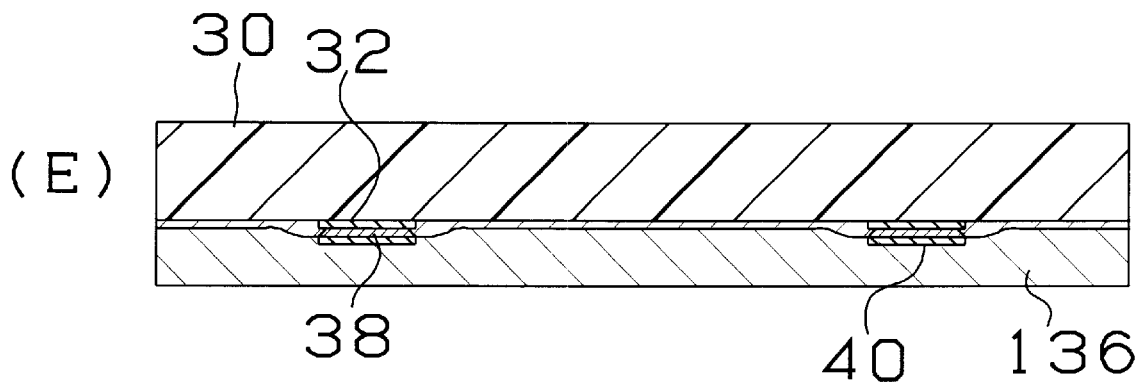
(E)
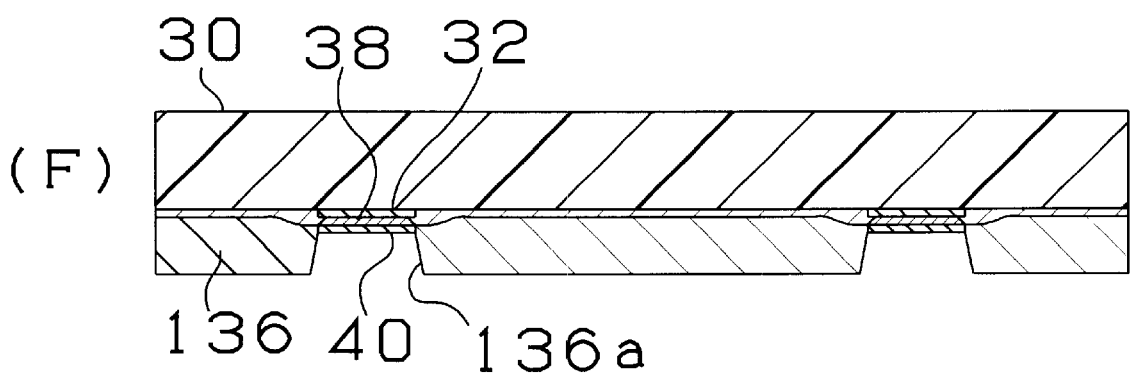
(F)
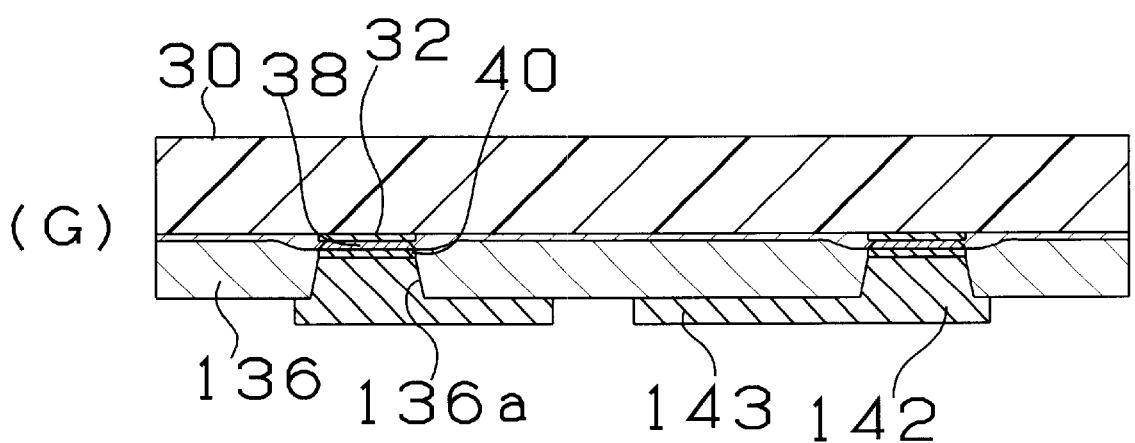
(G)

Fig. 24
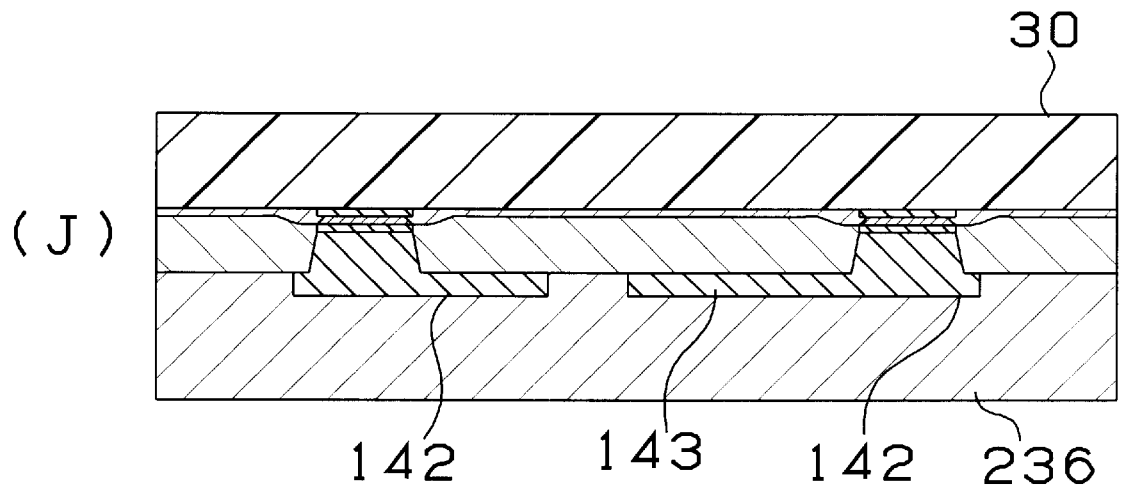
(J)
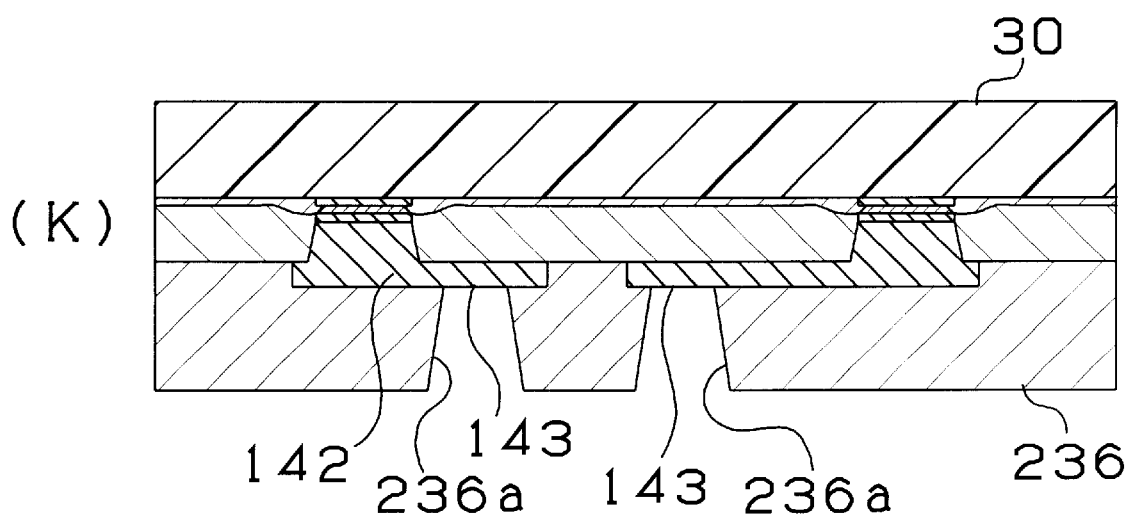
(K)

Fig. 25
(L)
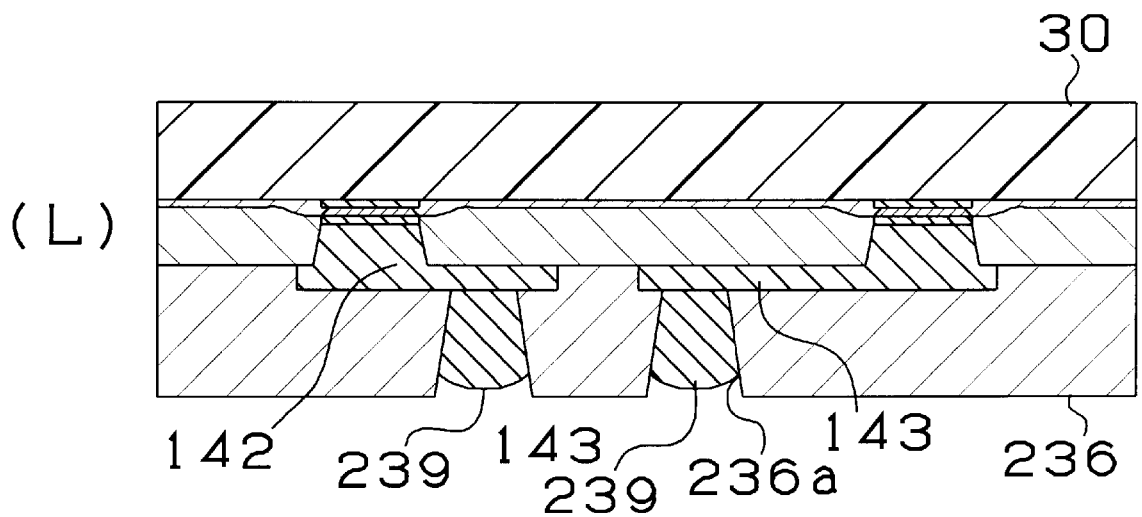
(M)
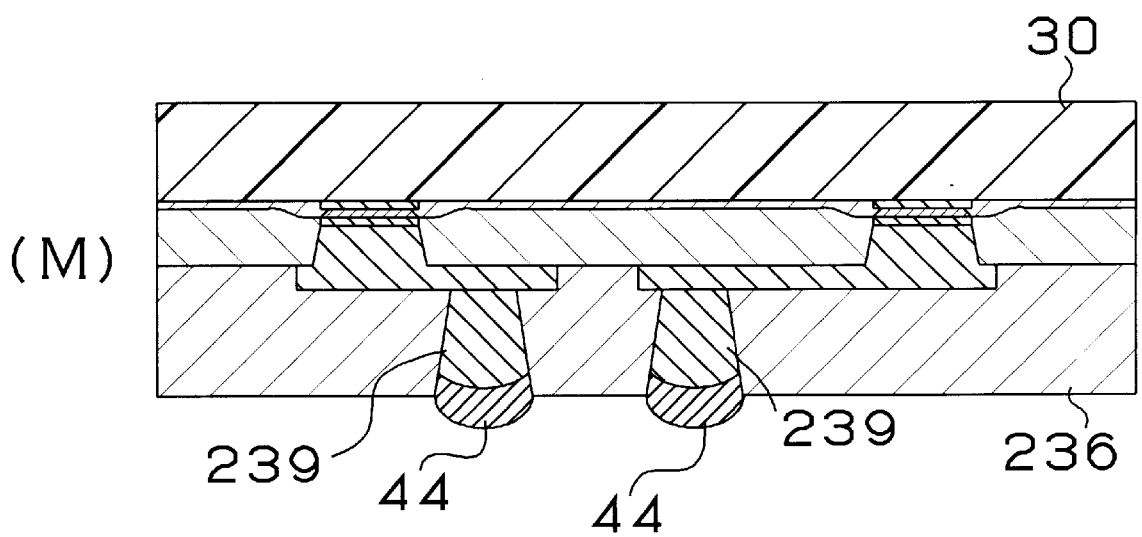

Fig. 27
(A) 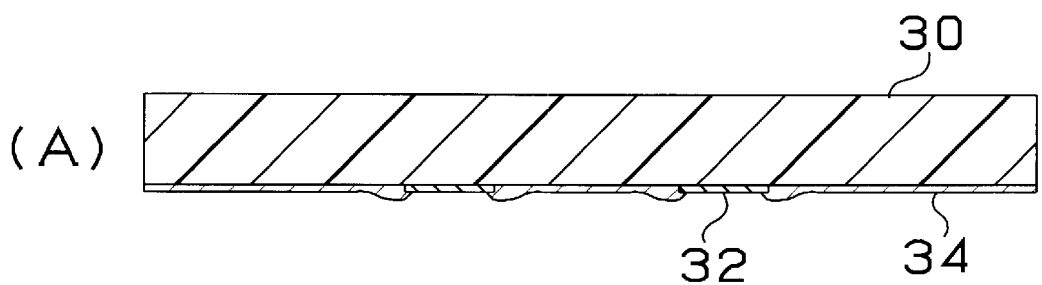
(B) 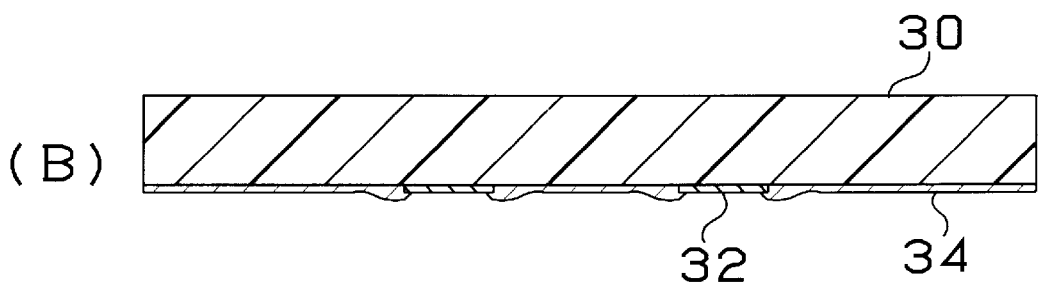
(C) 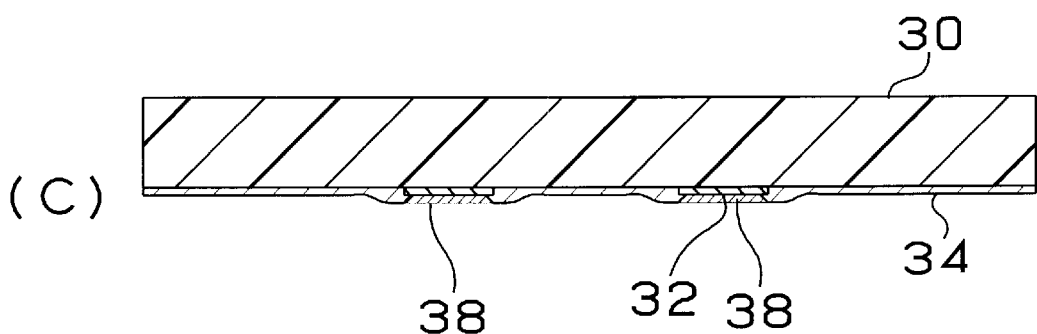
(D) 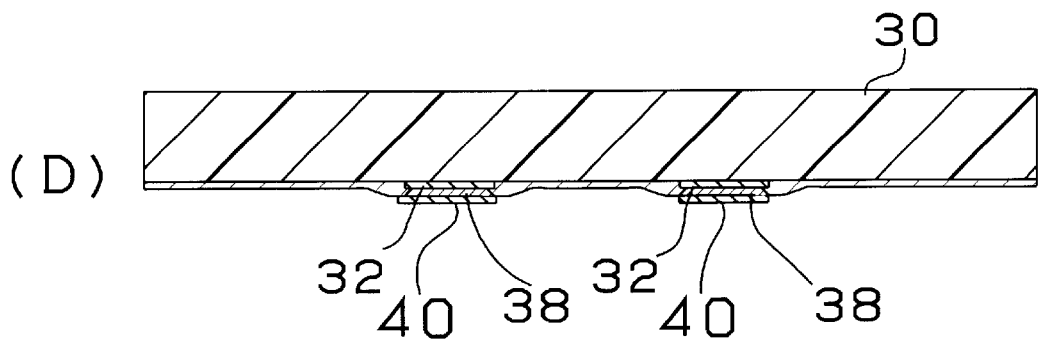

Fig. 30
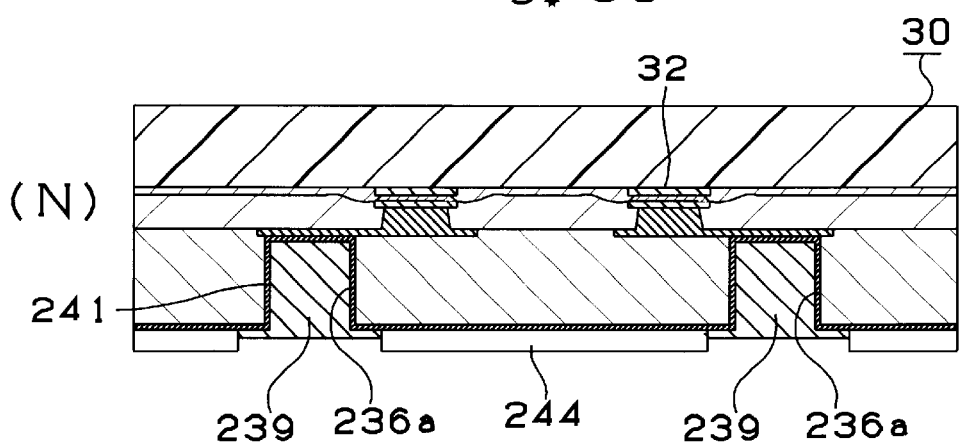
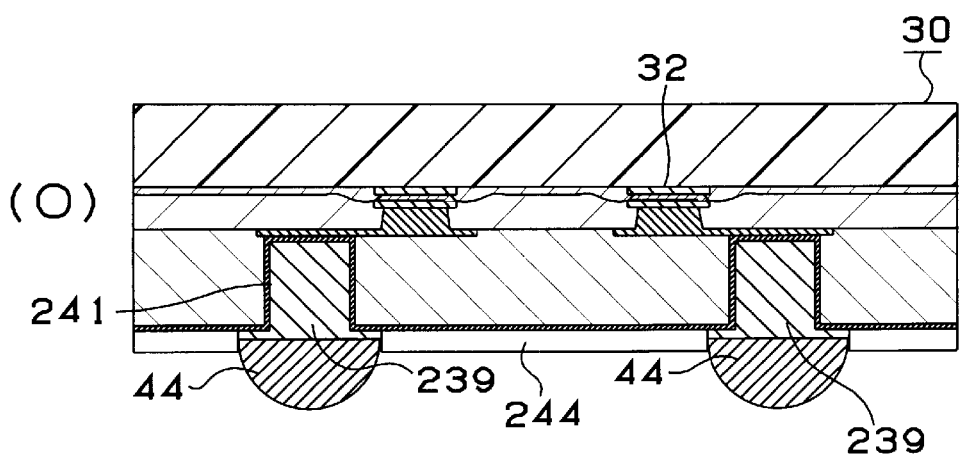
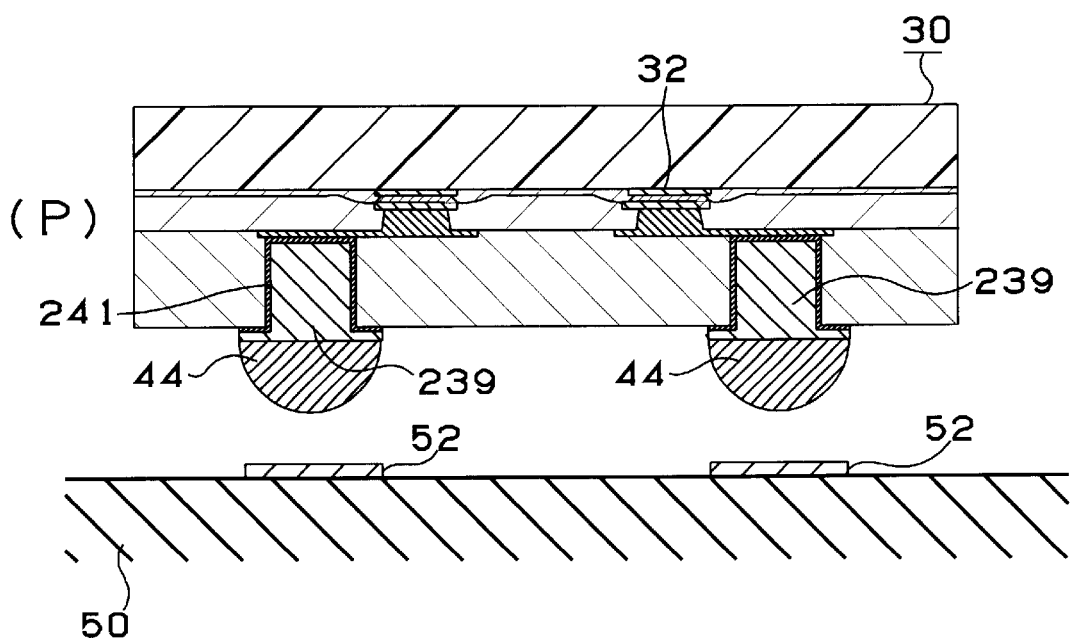

Fig. 33
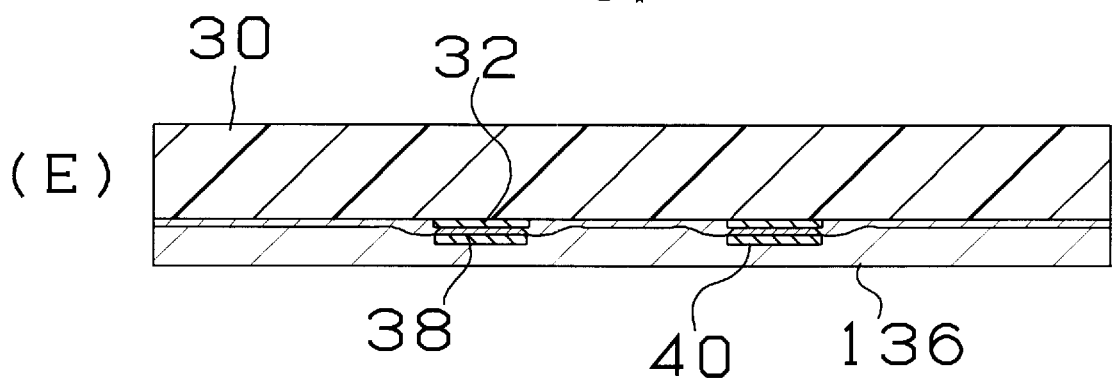
(E)
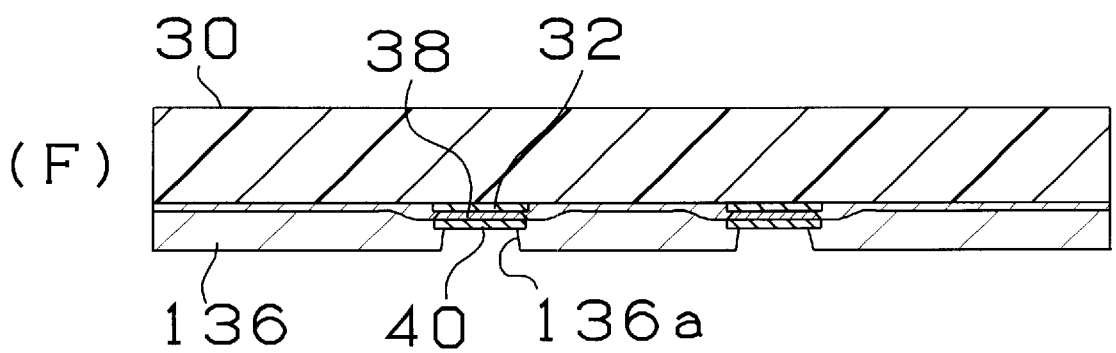
(F)
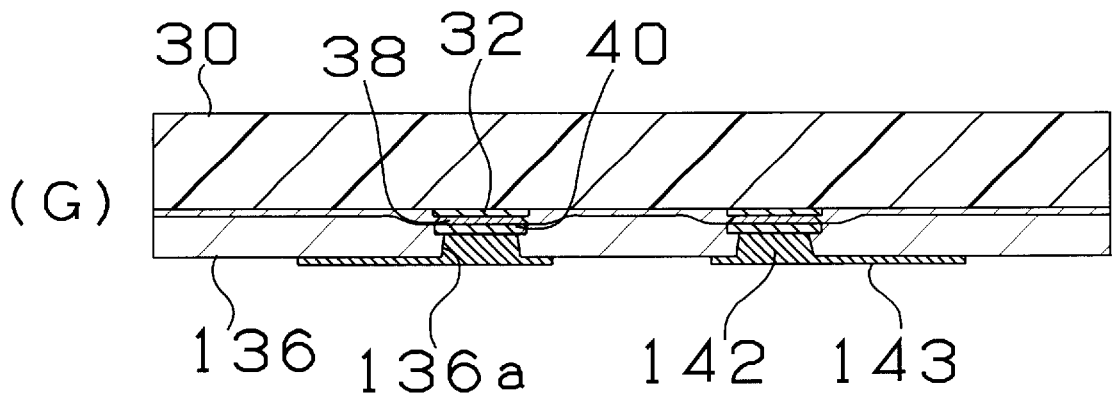
(G)

Fig. 35
(A)
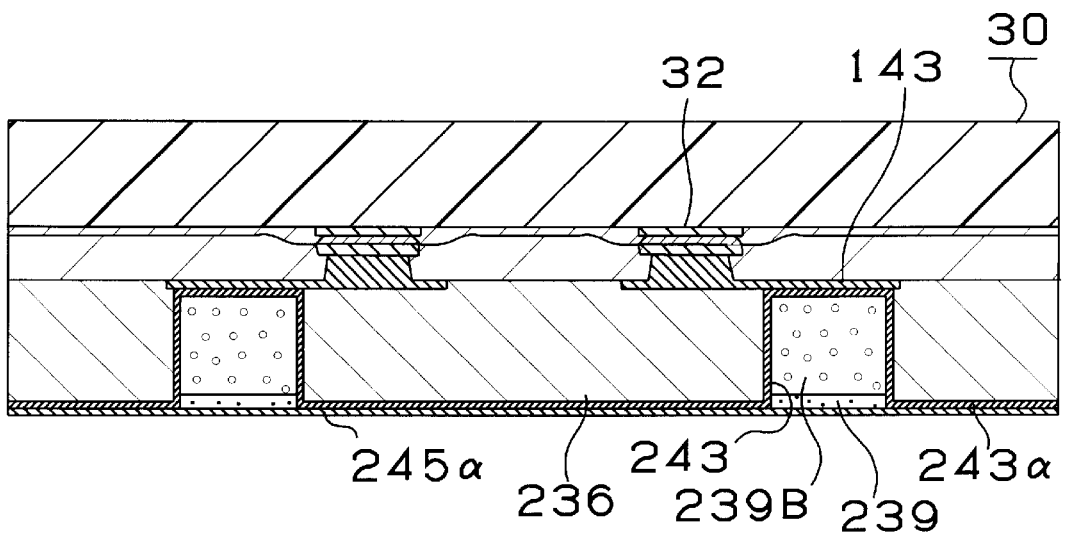
(B)
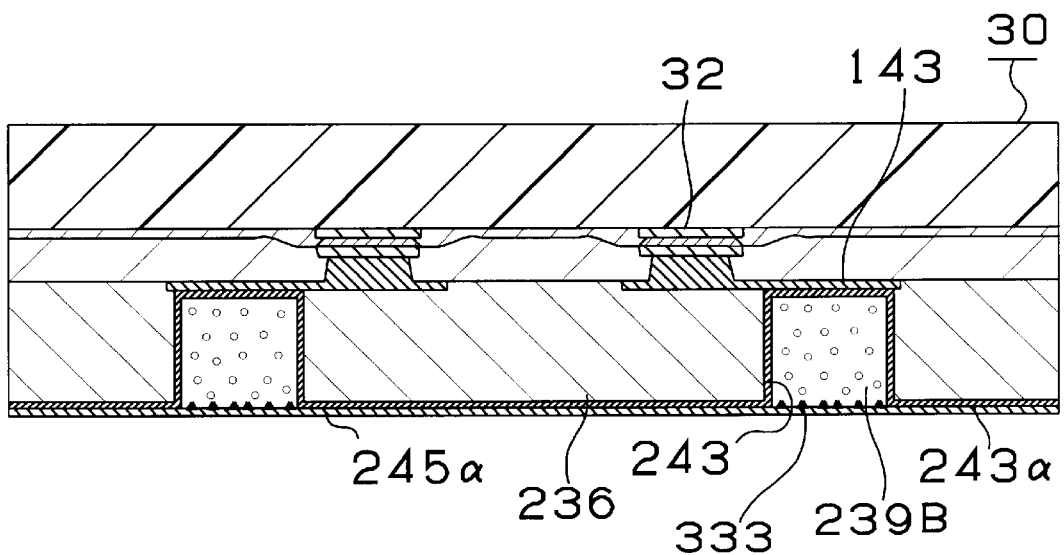

Fig. 38
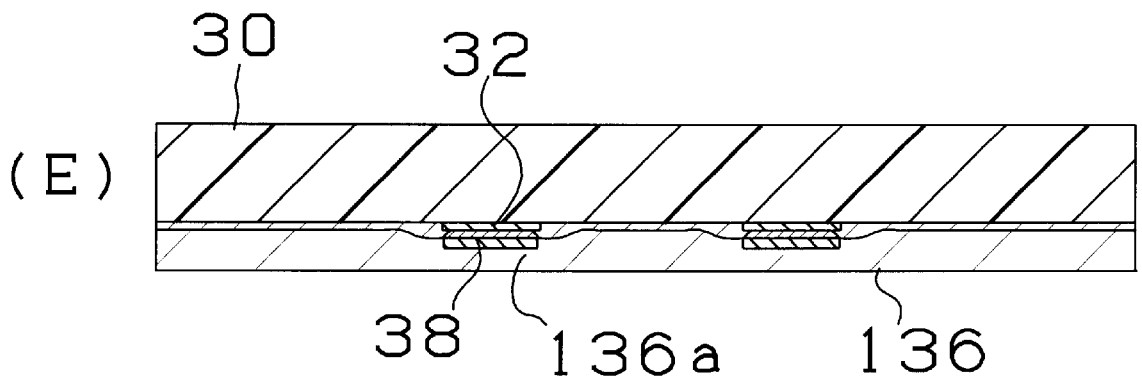
(E)
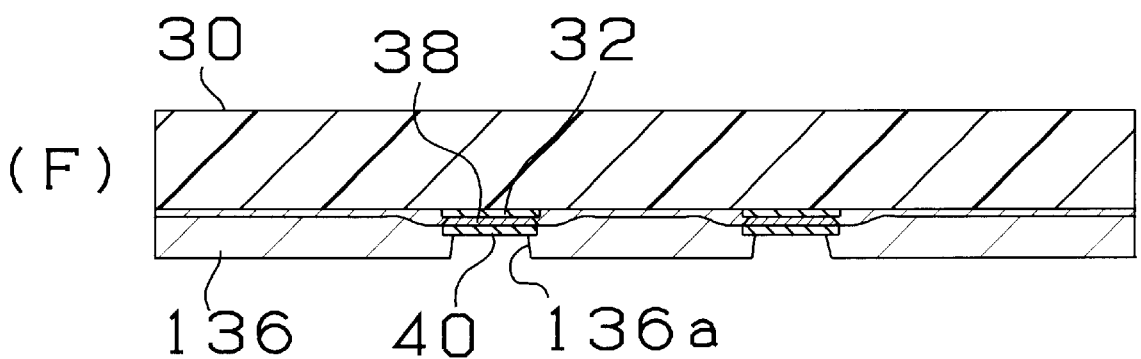
(F)
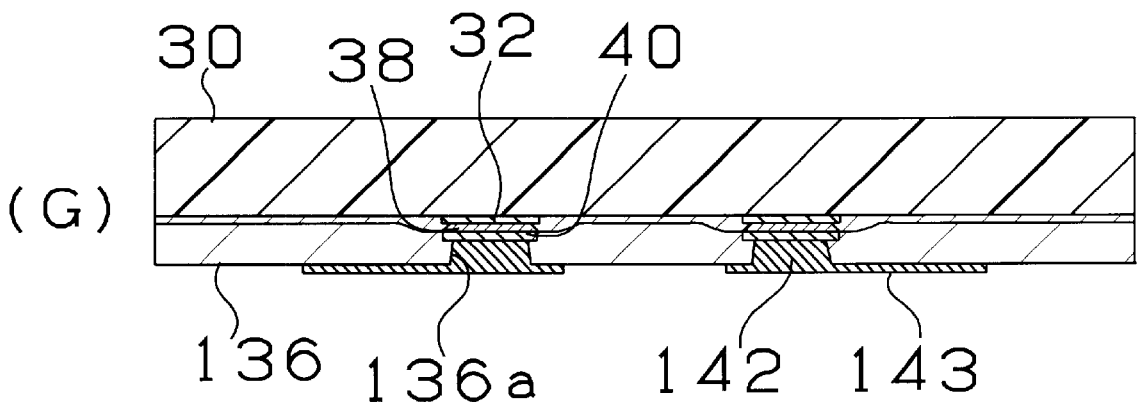
(G)

Fig. 41
(A)
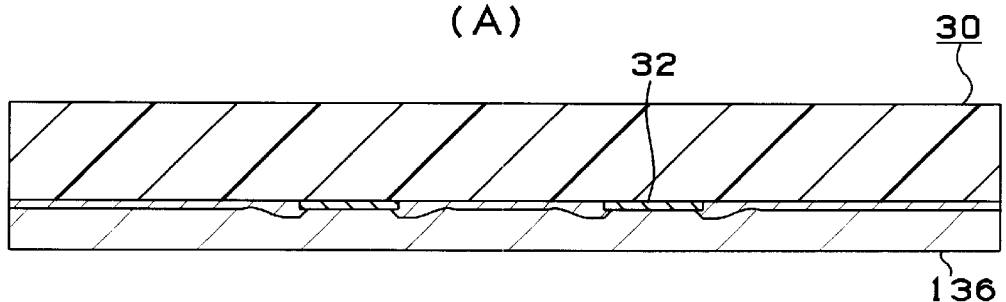
(B)
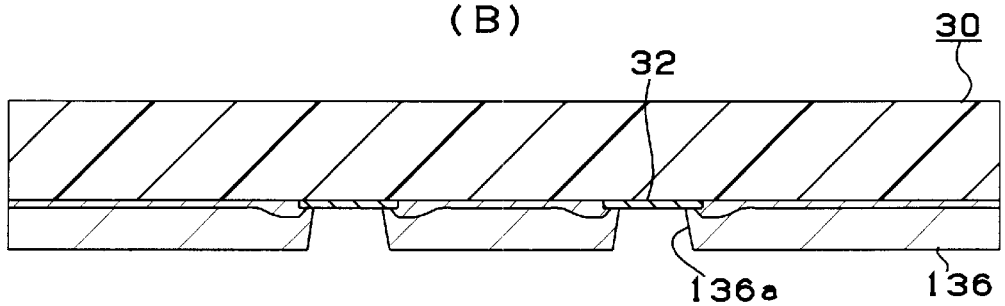
(C)
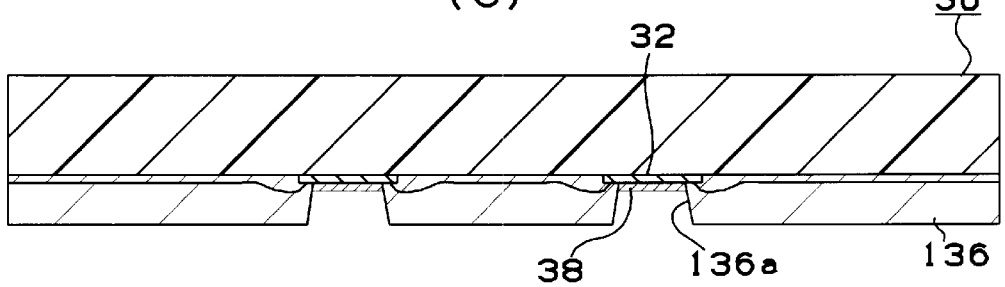
(D)
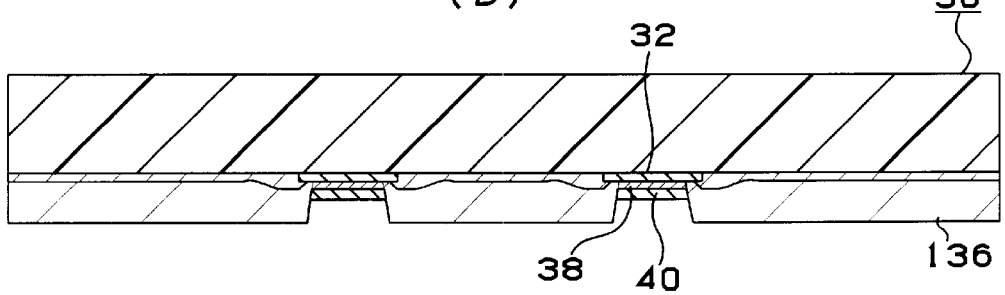
(E)
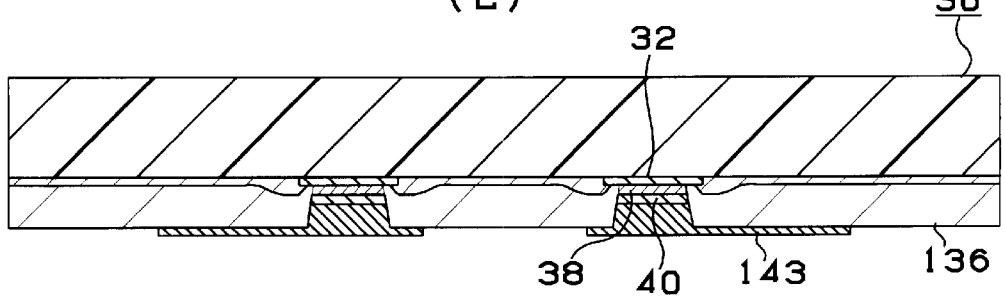

Fig. 42
(A)
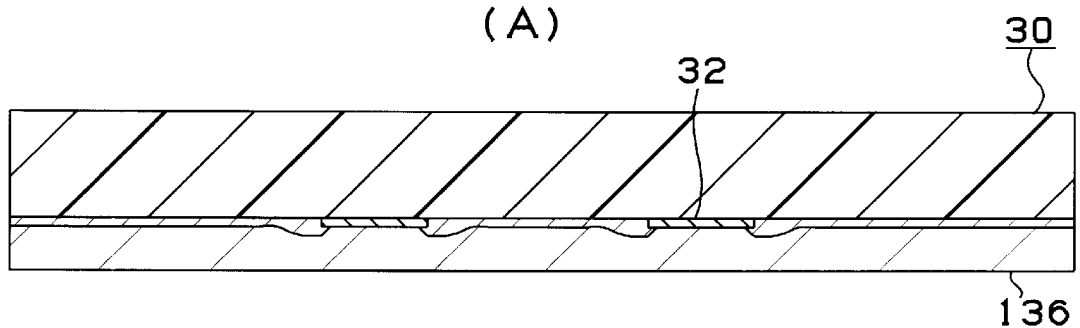
(B)
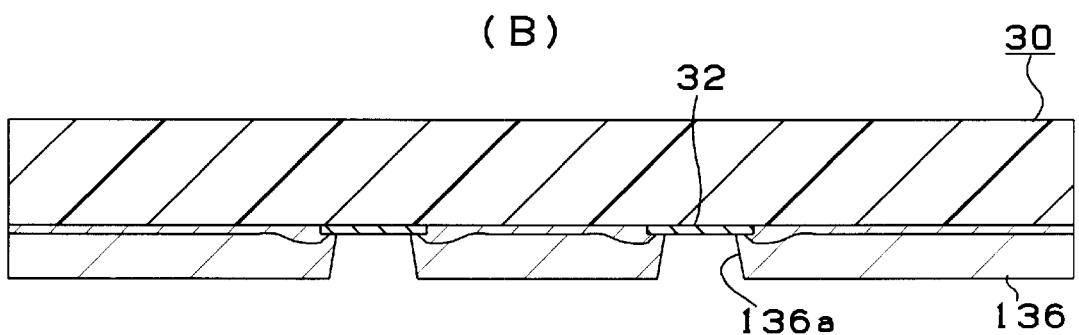
(C)
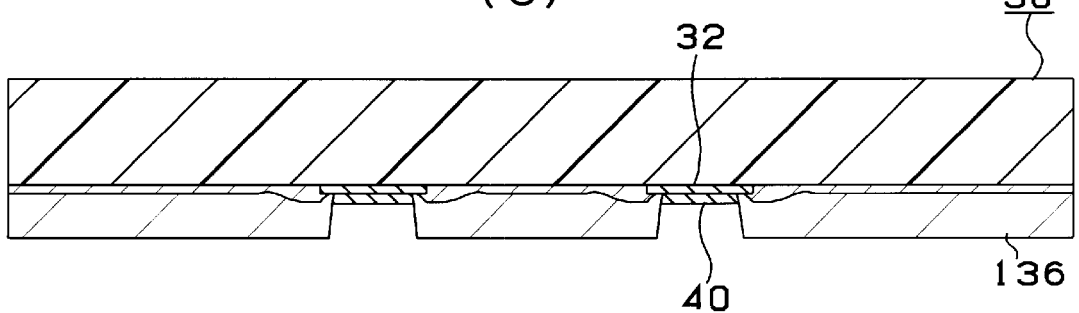
(D)
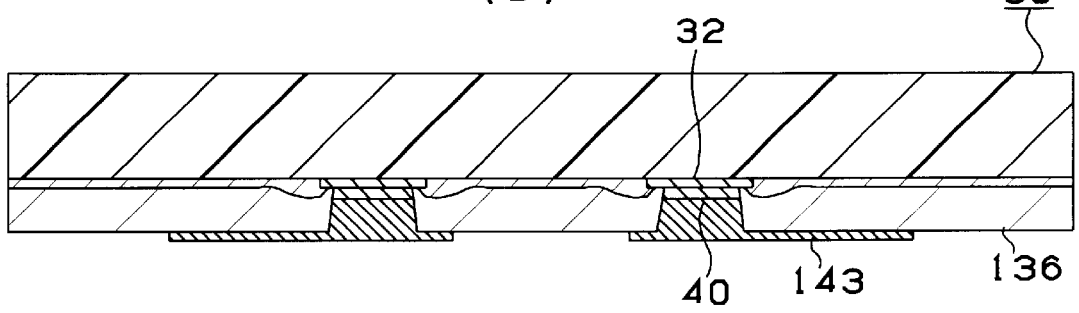

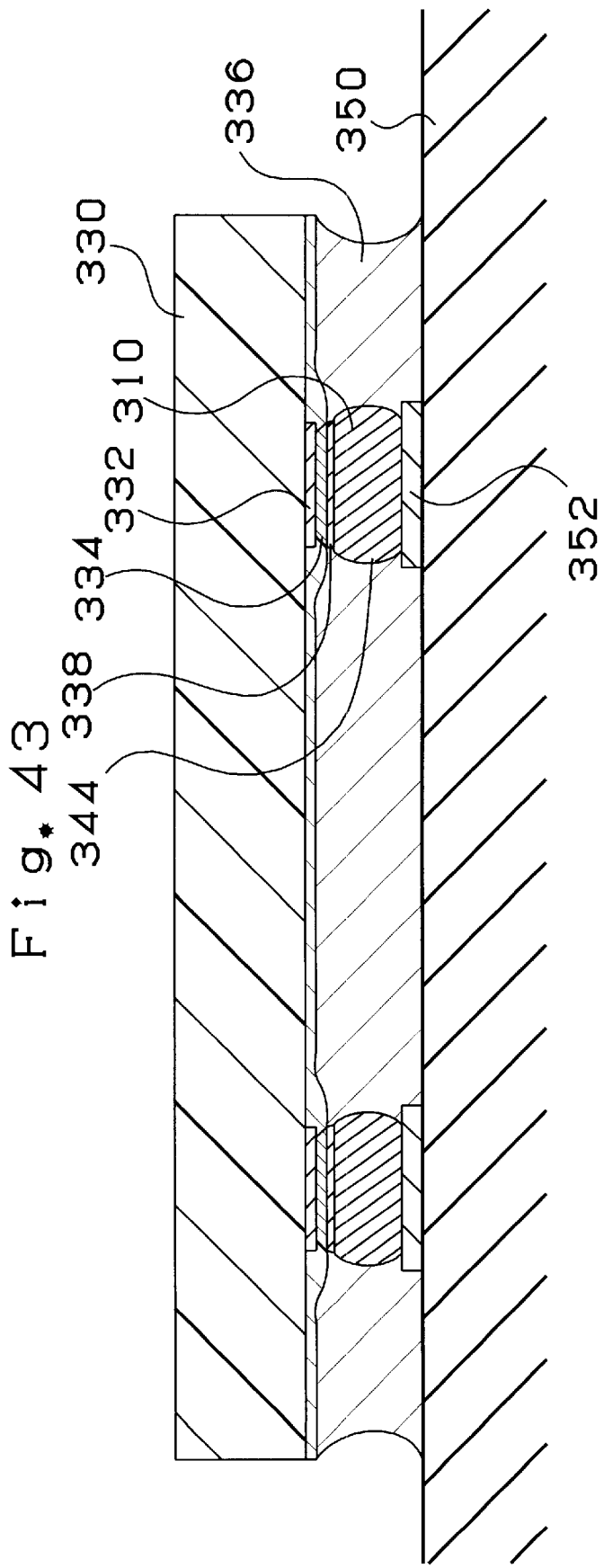

SEMICONDUCTOR CHIP AND METHOD MANUFACTURING THE SAME

CROSS-REFERENCE TO RELATED APPLICATION

The present application claims priority under 35 U.S.C. §119 to Japanese Patent Application Nos. 10-294637, 10-294638, 10-219249, 10-219250 and 10-219251, filed Sep. 30, 1998, Sep. 30, 1998, Aug. 2, 1999, Aug. 2, 1999, and Aug. 2, 1999, respectively. Further, the present application is a continuation and claims priority under 35 U.S.C. §120 to International Application No. PCT/JP99/05285, filed Sep. 27, 1999, entitled "SEMICONDUCTOR CHIP AND MANUFACTURING METHOD THEREOF." The contents of these applications are incorporated herein by reference in their entirety.

BACKGROUND OF THE INVENTION

1. Field of the Invention

The present invention relates to a semiconductor chip and a semiconductor chip manufacturing method.

2. Discussion of the Background

FIG. 43 shows a conventional semiconductor chip 330 and a mounting state thereof. A solder 344 forming a bump 310 is provided on the aluminum electrode pad 332 of the semiconductor chip 330 through a nickel plated layer 334 and a gold plated layer 338. Here, the semiconductor chip 330 is electrically connected to an electrode pad 352 on a package 350 side through the bump 310.

Meanwhile, due to the difference in coefficient of thermal expansion between the semiconductor chip 330 and the package 350, it is necessary to relax a stress generated between the semiconductor chip 330 and the package 350. In a mounting state shown in FIG. 43, an under-fill 336 is provided between the semiconductor chip 330 and the package 350 to fixedly attach them, thereby avoiding the concentration of a stress on a electrical connection section to prevent the occurrence of a break on the electrical connection sections.

However, following the recent high integration of semiconductor chips, the bumps of a semiconductor chip become smaller in size. In the mounting state described above, too, the electrical connection section thus made small in size is sometimes broken due to the stress between the semiconductor chip 330 and the package 350.

To address such a problem, there is proposed forming a flexible copper post on the aluminum electrode pad 332 through a barrier metal film and allowing the post to absorb the stress generated between the semiconductor chip 330 and the package. However, the barrier metal film formed by sputtering which is normally used, is not only inferior in productivity but also has a residual stress and adversely affects the function of the semiconductor chip in the vicinity of the aluminum electrode pad. Due to this, it is difficult to apply the above proposal to a semiconductor chip having an area pad type aluminum electrode pad formed thereon.

SUMMARY OF THE INVENTION

According to one aspect of the present invention, a semiconductor chip includes a copper plated member. A copper plated member is formed on and electrically connected to a surface of an aluminum electrode pad through a nickel-copper composite layer. The surface of the aluminum electrode pad is subjected to a zincate treatment.

According to another aspect of the present invention, a semiconductor chip includes an aluminum electrode pad which is provided on a chip surface of the semiconductor chip and an electrode surface of which is subjected to a zincate treatment. A resin insulating layer is provided on the chip surface of the semiconductor chip and has a hole in which the electrode surface of the aluminum electrode pad locates. A nickel-copper composite layer is formed on and electrically connected to the surface of the aluminum electrode pad in the hole. A via is made of a copper plated member. The via is formed on and electrically connected to the nickel-copper composite layer in the hole.

According to the other aspect of the present invention, a semiconductor chip manufacturing method includes forming a resin insulating layer on a surface of a semiconductor chip on a side of an aluminum electrode pad. Then a hole is formed in the resin insulating layer to reach the aluminum electrode pad. A zincate treatment is conducted to the aluminum electrode pad at a bottom of the hole. Then a nickel-copper composite plated layer is formed on the aluminum electrode pad. A via made of a copper plated member is formed on the nickel-copper composite plated layer in the hole.

According to the further aspect of the present invention, a semiconductor chip manufacturing method includes conducting a zincate treatment to a surface of an aluminum electrode pad of a semiconductor chip. Then a nickel-copper composite plated layer is formed on the surface of an aluminum electrode pad. A resin insulating layer is formed on an aluminum electrode pad-side surface of the semiconductor chip. Then a hole is formed in the resin insulating layer to reach the nickel-copper composite plated layer. A via made of a copper plated member is formed on the nickel-copper composite plated layer in the hole.

According to yet another aspect of the present invention, a semiconductor chip manufacturing method includes conducting a zincate treatment to a surface of an aluminum electrode pad of a semiconductor chip. Then a nickel-copper composite plated layer is formed on the surface of the aluminum electrode pad. An an electroless copper plated layer is formed on an aluminum electrode pad-side surface of the semiconductor chip. A plating resist layer is formed on a surface of the electroless copper plated layer of the semiconductor chip. Then a hole is formed to reach the electroless copper plated layer. The hole is filled with a copper plated member to form a via. The plating resist layer is removed. Then an etching treatment is conducted to remove the electroless plated layer below the plating resist layer.

According to yet another aspect of the present invention, a semiconductor chip includes a first insulating layer, a conductor circuit layer and a second insulating layer which are build up in this order on an electrode pad side of the semiconductor chip. An inner via electrically connects the electrode pad of the semiconductor chip to the conductor circuit layer. The inner via is formed in said first insulating layer. The second insulating layer is a soft insulating layer and is provided with a hole reaching the conductor circuit layer. A filled via is made of a copper plated member in the hole. The electrode pad of the semiconductor chip is a zincate treated aluminum electrode. A copper plated member is formed on the electrode pad in the inner via through a nickel-copper composite plated layer.

According to yet another aspect of the present invention, a semiconductor chip manufacturing method includes forming a first insulating layer on an aluminum electrode pad-side surface of a semiconductor chip. Then forming a first hole reaching an aluminum electrode pad. A zincate treatment is conducted to the aluminum electrode pad at a bottom portion of the first hole. Then a nickel-copper composite plated layer is formed. An inside of the hole and a surface of the first insulating layer are copper-plated. An inner via and a conductor circuit layer are formed. The first insulating layer and the conductor circuit layer are covered with a soft resin. A second insulating layer is formed. A second hole is formed in the second insulating layer. The second hole reaches the conductor circuit layer. The second hole is filled with a copper plated member. A filled via is formed.

According to the other aspect of the present invention, a semiconductor chip manufacturing method includes conducting a zincate treatment to a surface of an aluminum electrode pad of a semiconductor chip. Then a nickel-copper composite plated layer is formed. A a first insulating layer is formed on an aluminum electrode pad-side surface of the semiconductor chip. Then a first hole reaching the nickel-copper composite plated layer is formed. An inside of the first hole and a surface of the first insulating layer are copper-plated. An inner via and a conductor circuit layer are formed. The first insulating layer and the conductor circuit layer are covered with a soft resin. A second insulating layer is formed. A second hole is formed in the second insulating layer. The second hole reaches the conductor circuit layer. The second hole is filled with a copper plated member. A filled via is formed.

According to the further aspect of the present invention, a semiconductor chip includes an electrode pad. A first insulating layer is formed on a surface of the semiconductor chip on a side of the electrode pad. A conductor circuit layer is formed on first insulating layer. A second insulating layer is formed on the first insulating layer and the conductor circuit layer. The second insulating layer is a soft insulating layer and is provided with a hole reaching the conductor circuit layer. An inner via is formed in the first insulating layer and electrically connects the electrode pad to the conductor circuit layer. A filled via is formed in the second insulating layer and includes an electroless copper plated layer formed on a bottom portion and a wall surface of the hole in which a resin is filled.

According to the other aspect of the present invention, a semiconductor chip manufacturing method includes forming a first insulating layer on an aluminum electrode pad-side surface of a semiconductor chip. Then a first hole reaching an aluminum electrode pad is formed. A zincate treatment is conducted to the aluminum electrode pad on a bottom portion of the first hole. Then a nickel-copper composite plated layer is formed. An inside of the first hole and a surface of the first insulating layer are copper-plated.

An inner via and a conductor circuit layer are formed. The first insulating layer and the conductor circuit layer are covered with a soft resin. A second insulating layer is formed. A second hole is formed in the second insulating layer. The second hole reaches the conductor circuit layer. An electroless copper plated layer is formed on a bottom portion and a wall surface of said second hole. Then a resin is filled in the electroless copper plated layer. A filled via is formed.

According to yet further aspect of the present invention, a semiconductor chip manufacturing method includes conducting a zincate treatment to a surface of an aluminum electrode pad of a semiconductor chip. Then a nickel-copper composite plated layer is formed. A first insulating layer is formed on an aluminum electrode pad-side surface of the semiconductor chip. Then a first hole reaching the nickel-copper composite plated layer is formed. An inside of the first hole and a surface of the first insulating layer are copper-plated. An inner via and a conductor circuit layer are formed. The first insulating layer and the conductor circuit layer are covered with a soft resin. A second insulating layer is formed. A second hole is formed in the second insulating layer. The second hole reaches the conductor circuit layer. An electroless copper plated layer is formed on a bottom portion and a wall surface of said second hole. Then a resin is filled in the electroless copper plated layer. A filled via is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a manufacturing step view of the semiconductor chip according to the second embodiment;

FIG. 10 is a manufacturing step view of the semiconductor chip according to the third embodiment;

FIG. 11 is a manufacturing step view of the semiconductor chip according to the third embodiment;

FIG. 14 is a manufacturing step view of the semiconductor chip according to the fourth embodiment;

FIG. 23 is a manufacturing step view of the semiconductor chip according to the sixth embodiment;

FIG. 24 is a manufacturing step view of the semiconductor chip according to the sixth embodiment;

FIG. 25 is a manufacturing step view of the semiconductor chip according to the sixth embodiment;

FIG. 27 is a manufacturing step view of the semiconductor chip according to the seventh embodiment;

FIG. 30 is a manufacturing step view of the semiconductor chip according to the seventh embodiment;

FIG. 33 is a manufacturing step view of the semiconductor chip according to the eighth embodiment;

FIGS. 35(A) and 35(B) are cross-sectional views of a semiconductor chip according to a modification of the eighth embodiment of the present invention;

FIG. 38 is a manufacturing step view of the semiconductor chip according to the ninth embodiment;

FIG. 41 is a manufacturing step view of the semiconductor chip according to the tenth embodiment;

FIG. 42 is a manufacturing step view of the semiconductor chip according to the tenth embodiment; and FIG. 43 is a cross-sectional view of a conventional semiconductor chip.

DESCRIPTION OF THE PREFERRED EMBODIMENTS

Figure 1:
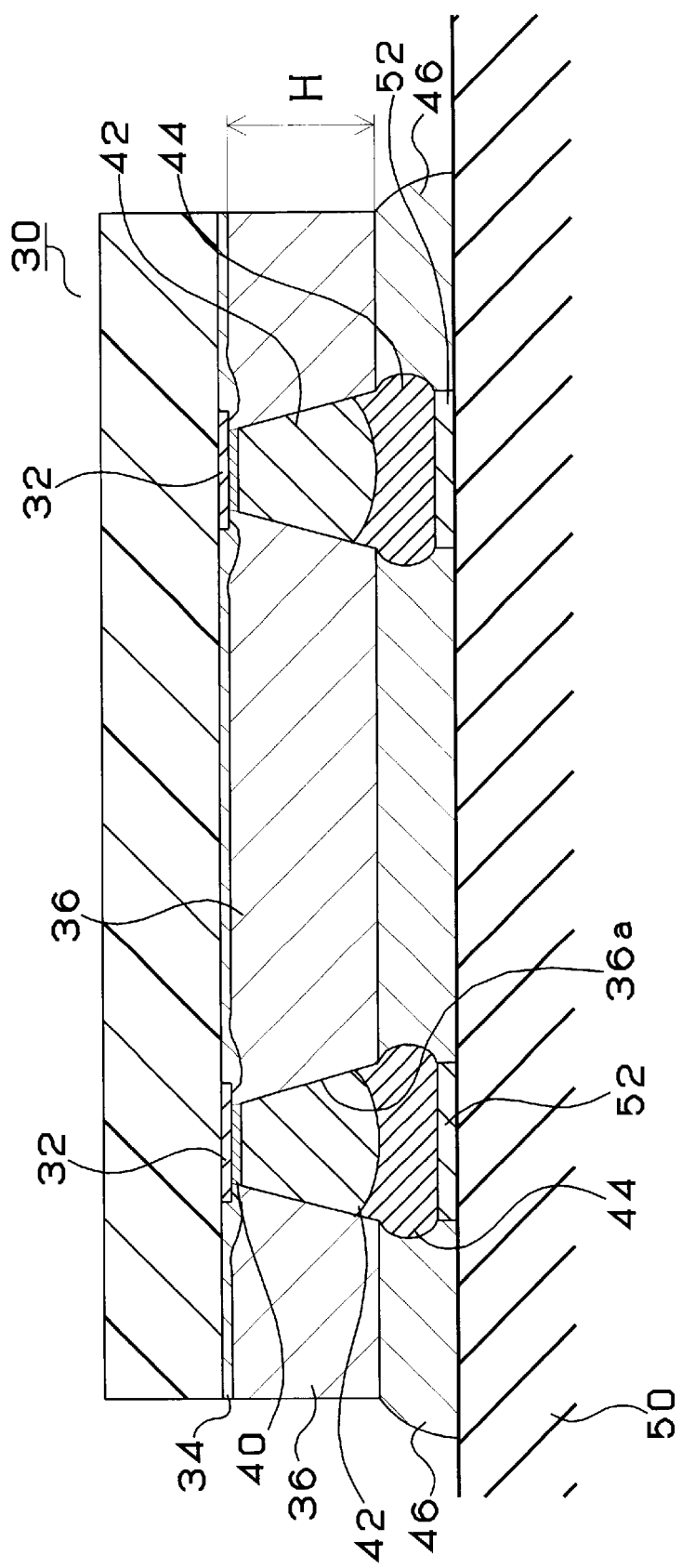
FIG. 1 is a cross-sectional view of a semiconductor chip according to the first embodiment of the present invention.

The preferred embodiments will now be described with reference to the accompanying drawings, wherein like reference numerals designate corresponding or identical elements throughout the various drawings.

Semiconductor chips and semiconductor chip manufacturing methods according to the embodiments of the present invention will be described hereinafter with reference to the drawings.

FIG. 1 shows a semiconductor chip according to the first embodiment of the present invention.

Aluminum electrode pads 32 which have been a zincate treatment are formed on the respective openings of a passivation film 34 on the lower surface of the semiconductor chip 30. In this embodiment, an insulating resin layer 36 is provided on the lower surface of the passivation film 34 and non-penetrating holes 36a reaching the respective aluminum electrode pads 32 are formed in the resin insulating layer 36.

A via 42 which is copper plated is formed to be electrically connected to each aluminum electrode pad through a nickel-copper composite plated layer 40. A protruding conductor (bump) 44 made of a low melting point metal such as a solder is provided at the via 42.

The nickel-copper composite plated layer 40 is formed to have a thickness of 0.01 to 5 $\mu$m and to have a nickel content of 1 to 70 wt % on the copper plated-side surface of the composite plated layer, thereby making it possible to form more appropriately the via 42 by copper plating.

The semiconductor chip 30 is mounted to be coupled to the pads 52 of a substrate 50 by the bumps 44. The resin insulating layer 36 and the substrate 50 are bonded to each other by an insulating resin 46.

According to the present invention, as the low melting point metal stated above, a Pb—Sn solder, an Ag—Sn solder or an indium solder can be used.

The via is formed by copper plating each non-penetrating hole 36a provided in the resin insulating layer 36 formed to have a thickness of 15 to 200 $\mu$m and the via has a diameter of 20 to 100. Since the via can absorb a stress generated by the difference in thermal expansion between the semiconductor chip 30 and the substrate 50 more appropriately, it is possible to mount the semiconductor chip on the substrate with high connection reliability without generating cracks on the electrical connection section.

Further, since the resin insulating layer 36 is a soft resin having an elastic modulus of 1.0 to 3.5 GPa, the flexibility of the via 42 is not deteriorated.

Next, a method of manufacturing the semiconductor chip 30 according to the first embodiment will be described with reference to FIGS. 2 to 4.

With respect to a semiconductor chip 30 having aluminum pad electrode pads 32 formed on the respective openings of a passivation film 34 shown in the step (A) of FIG. 2, bumps are formed in steps to be described hereinafter. Here, as shown in a step (B) of FIG. 2, a resin insulating layer 36 is formed first.

As a resin for forming this resin insulating layer 36, a photosensitive epoxy resin or polyimide resin is used if non-penetrating holes are formed by a chemical treatment. After conducting a drying treatment, exposure and development treatments are conducted as shown in a step (C) of FIG. 2. A heating treatment is then conducted to thereby form a resin insulating layer 36 having non-penetrating holes 36a reaching the respective aluminum electrode pads 32. If the non-penetrating holes are formed by laser, the resin used is not necessarily a photosensitive resin but a thermosetting epoxy resin or polyimide resin can be used. It is noted that the non-penetrating holes are preferably formed by exposure and development treatments so as not to denature the surfaces of the electrode pads 32. In addition, it is preferable that the surface layer portion of the above-stated resin insulating layer 36 is softer than a semiconductor chip side thereof.

Figure 2:
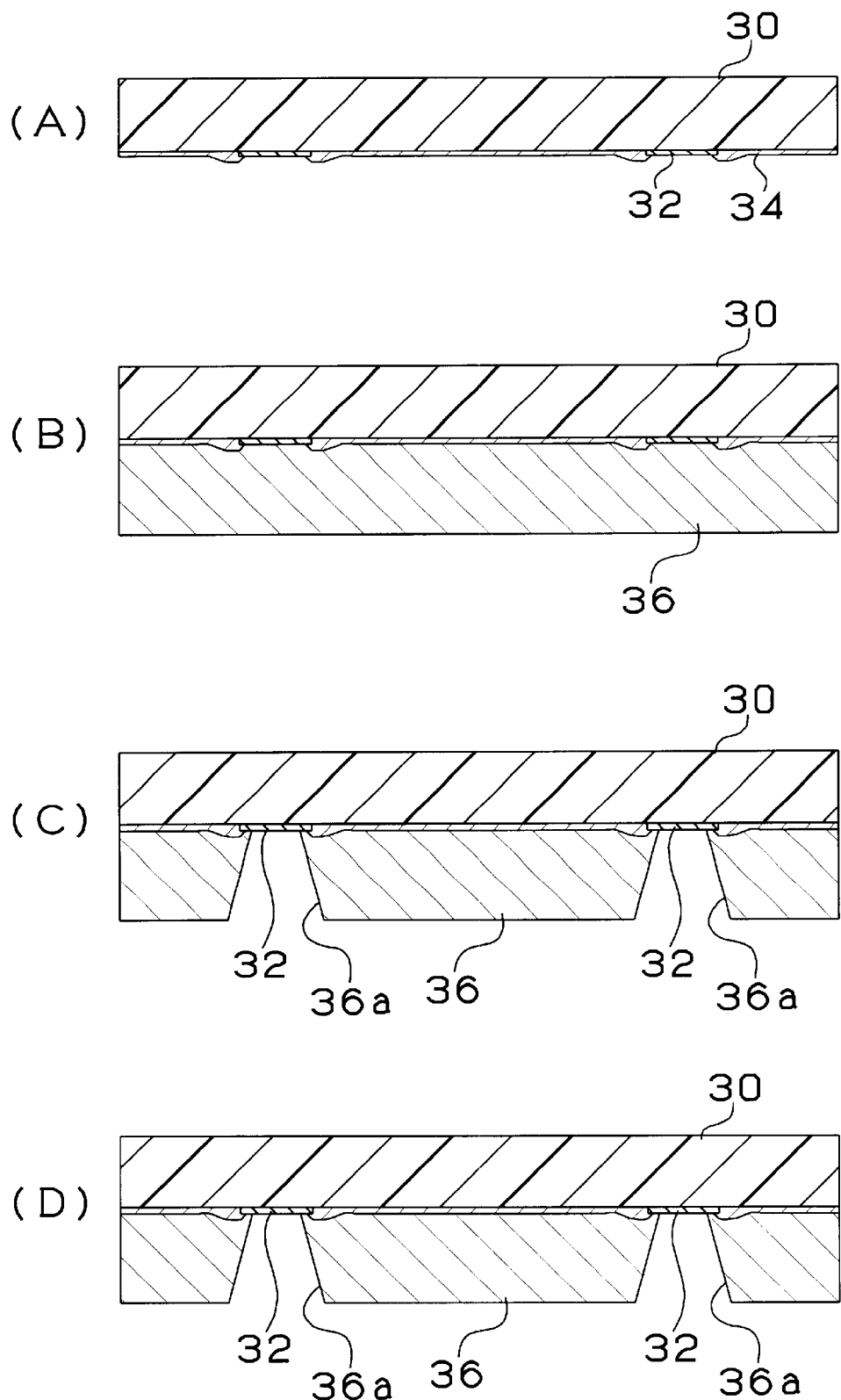
FIG. 2 is a manufacturing step view of the semiconductor chip according to the first embodiment.

Next, as shown in a step (D) of FIG. 2, the surfaces of the aluminum electrode pads 32 are subjected to a zincate treatment to facilitate depositing nickel from a plating solution. This zincate treatment can be carried out by, for example, immersing the semiconductor chip 30 in a mixture liquid of a zinc oxide which is a metallic salt and sodium hydroxide serving as an oxidizer at ordinary temperature for 10 to 30 seconds.

Figure 3:
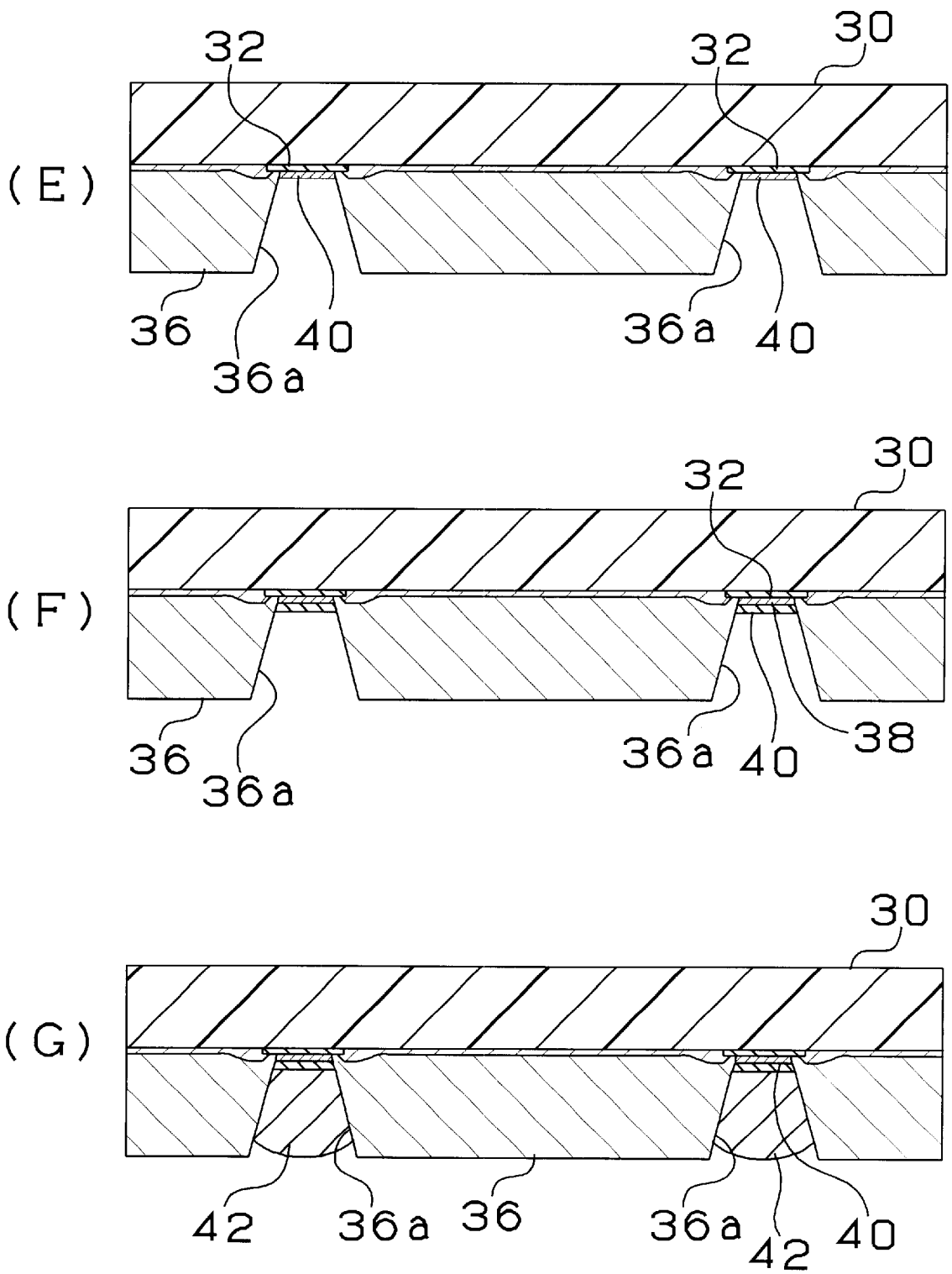
FIG. 3 is a manufacturing step view of the semiconductor chip according to the first embodiment.

Thereafter, as shown in a step (E) of FIG. 3, the semiconductor chip 30 is immersed in a nickel-copper composite plating solution, a nickel-copper composite plated layer 40 having a thickness of 0.01 to 5 µm is formed on each aluminum electrode pad 32 which has been subjected to the zincate treatment, and the surface of the composite plated layer is made have a composition containing 1 to 70 wt % of nickel. In this case, the component of the surface of the composite plated layer other than nickel is substantially copper and vias 42 can be, therefore, easily formed on the surfaces of the layers 40, respectively.

In this embodiment, the nickel-copper composite plated layers 40 are directly formed on the zincate-treated aluminum electrode pads, respectively. Alternatively, after depositing nickel plated layers 38, nickel-copper composite plated layers 40 can be formed on the zincate-treated aluminum electrode pads 32, respectively, as shown in a step (F) of FIG. 3.

Next, as shown in a step (G) of FIG. 3, vias 42 are formed in the non-penetrating holes 36a, respectively. For this plating, electroless plating is used. Since no current is applied, the semiconductor chip 30 is not damaged.

The vias are formed so as not to protrude from the respective non-penetrating holes 36a herein. It is also possible to conduct copper plating so that vias protrude from the non-penetrating holes 36a, then to remove resultant surfaces by polishing or the like and to flatten the vias.

Figure 4:
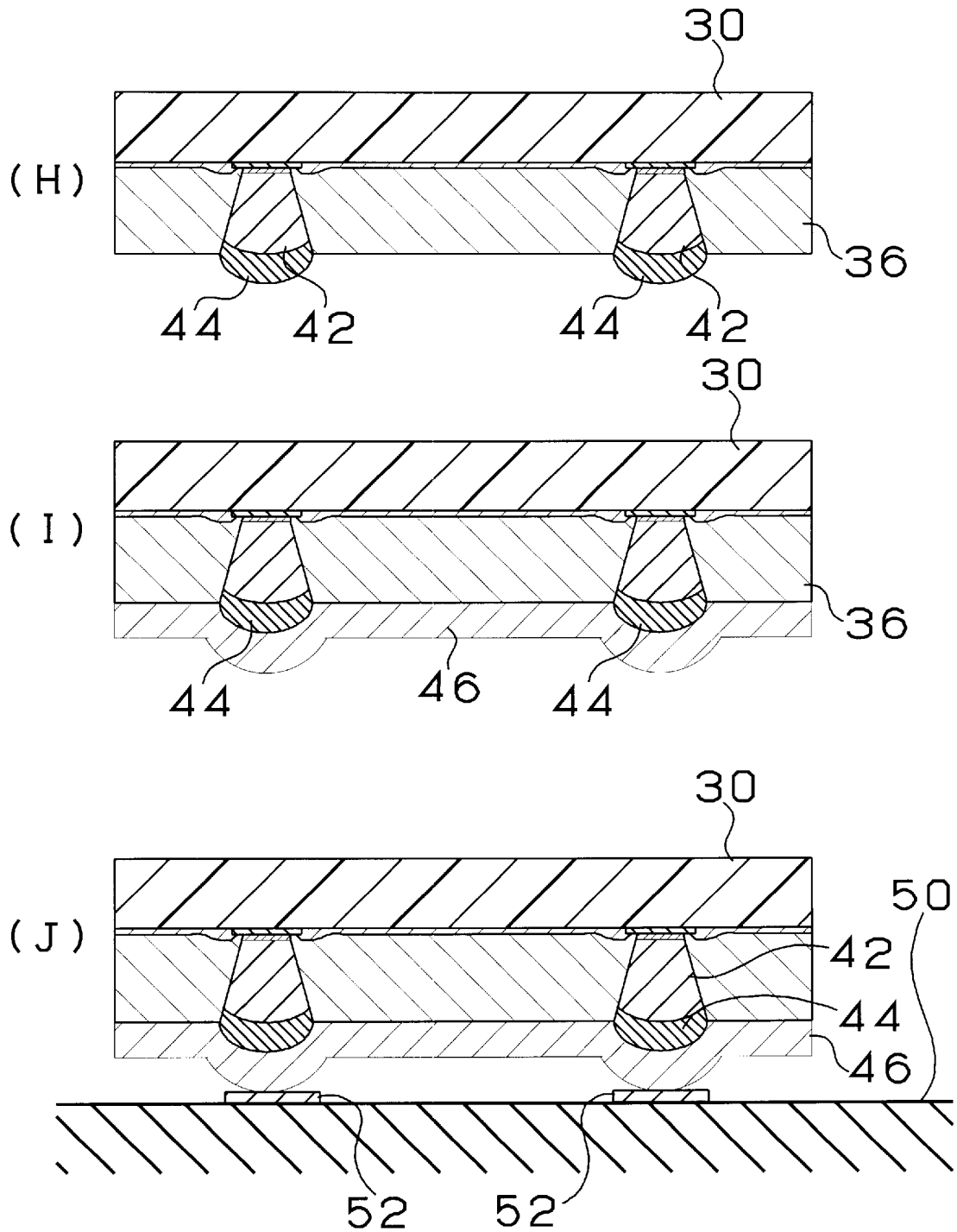
FIG. 4 is a manufacturing step view of the semiconductor chip according to the first embodiment.

Then, in a step (H) of FIG. 4, bumps (or protruding conductors) 44 are formed on the surfaces of the vias (or copper plated posts) 42, respectively. The bumps 44 can be formed by, for example, a method of screen-printing a conductive paste using a metal mask having openings formed at predetermined positions, a method of printing a solder paste which is a low melting point metal, a solder plating method or a method of immersing the vias in a solder-molten solution.

The height of each bump is preferably 3 to 60 µm. The reason is that if the height is smaller than 3 µm, the irregularity of the heights of the bumps due to the deformations thereof cannot be allowed. If the height exceeds 60 µm, the bumps are spread laterally when being molten to cause short circuit.

Finally, a resin is applied to the entire surface of the bump 44-side resin insulating layer 36 as shown in a step (I) or to the entire surface of the substrate 50-side resin insulating layer 36 as shown in a step (J), and dried, thereby forming an adhesive layer 46 made of an unhardened resin.

The adhesive layer 46 preferably comprising an organic adhesive. The organic adhesive is preferably at least one resin selected from an epoxy resin, a polyimide resin, a thermosetting polyphenylen ether (or PPE), a composite resin of an epoxy resin and a thermoplastic resin, a composite resin of an epoxy resin and a silicon resin and a BT resin.

To apply the unhardened resin which is the organic adhesive, a curtain coater, a spin coater, a roll coater, a spray coating, screen printing or the like can be used. In addition, the adhesive layer can be formed by laminating an adhesive sheet. The thickness of the adhesive layer is preferably 5 to 50 µm. The adhesive layer is preferably pre-cured because the pre-cured adhesive layer is easy to handle.

As shown in the step (J), the semiconductor chip 30 and the substrate 50 are bonded to each other by heating and pressurizing the semiconductor chip 30 and the substrate 50 using a heat press. Here, by first pressurizing the semiconductor chip 30 and the substrate 50, the bumps 44 of the semiconductor chip 30 extrude the unhardened adhesive (or insulating resin) present between the bumps 44 and the pads 52 of the substrate 50 to the surrounding and the bumps 44 abut on the respective pads 52 to thereby connect the semiconductor chip 30 to the substrate 50. Further, by pressurizing and, at the same time, heating the semiconductor chip 30 and the substrate 50, the adhesive layer 46 is hardened to thereby strongly bond the semiconductor chip 30 to the substrate 50. As the heat press, a vacuum heat press is preferably used. As a result, the attachment of the semiconductor chip 30 described above with reference to FIG. 1 to the substrate 50 is completed.

According to the present embodiment, a semiconductor chip capable of being mounted with high reliability may be obtained.

Figure 5:
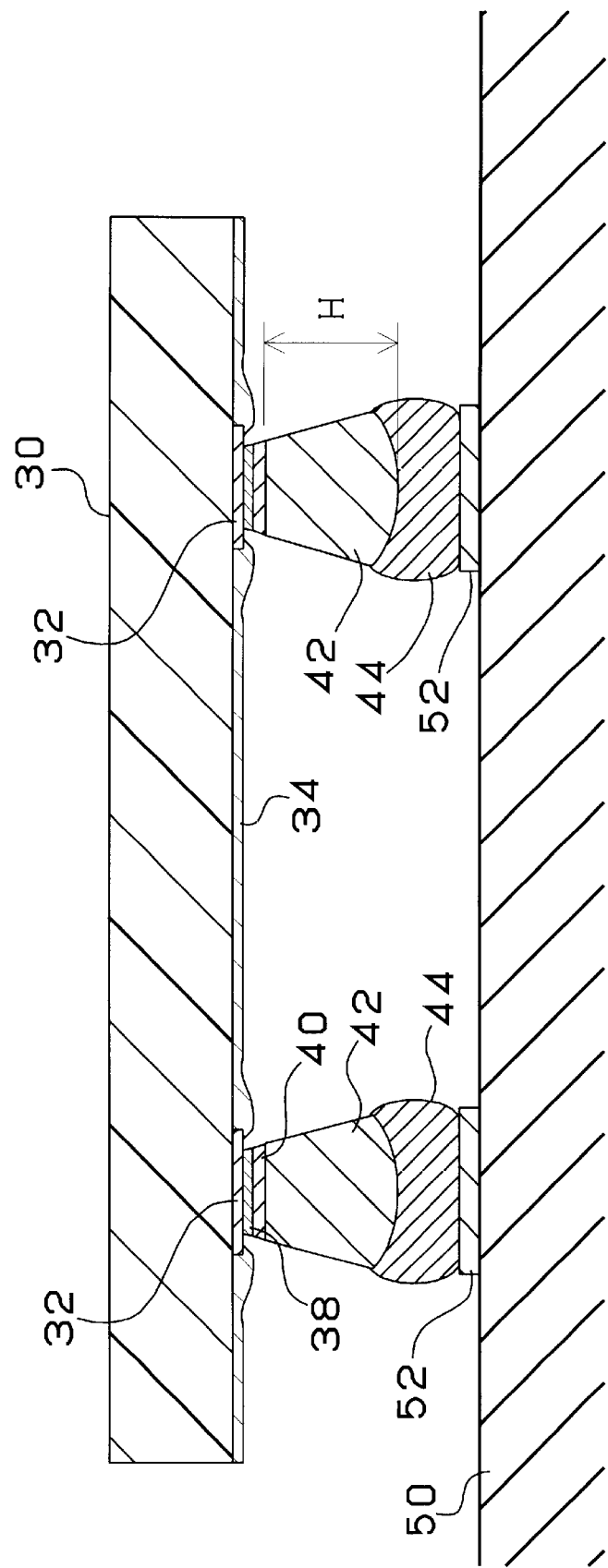
FIG. 5 is a cross-sectional view of a semiconductor chip according to the second embodiment of the present invention.

Next, a semiconductor chip and a semiconductor chip manufacturing method according to the second embodiment of the present invention will be described with reference to FIGS. 5 to 8. FIG. 5 shows a semiconductor chip according to the second embodiment of the present invention.

Aluminum electrode pads 32 which have been subjected to a zincate treatment are formed on the openings of a passivation film 34 on the lower surface of the semiconductor chip 30. A via 42 is formed on each aluminum electrode pad 32 through a nickel plated layer 38 and a nickel-copper composite plated layer 40. A protruding conductor (or bump) 44 made of a low melting point metal such as a solder is provided at the via 42.

The aluminum electrode pads 32 of the semiconductor chip 30 are connected to pads 52 on the side of a substrate 50 by the protruding conductors (or bumps) 44, respectively.

Here, each via 42 which is copper plated is formed to have a height (H) of 15 to 200 µm. Also, the via 42 is formed to have a diameter of 20 to 100 µm. Here, a stress is generated between the semiconductor chip 30 and the substrate 50 due to the difference in the coefficient of thermal expansion between the semiconductor chip 30 and the substrate 50 and heat generated when the semiconductor chip 30 operates. Since the stress can be absorbed by the vias 42 having flexibility, no cracks occur to electrical connection sections and high connection reliability is provided between the semiconductor chip 30 and the substrate 50.

In addition, the height H of each copper-plated via 42 is preferably 15 µm or more. This is because the vias 42 cannot sufficiently absorb the stress if the height H is smaller than 15 µm. On the other hand, the height H is preferably 200 µm or less. This is because the semiconductor chip 30 becomes less easy to handle if the height H is larger than 200 µm.

Next, the method of manufacturing the semiconductor chip 30 shown in FIG. 5 will be described with reference to FIGS. 6 to 8.

With respect to a semiconductor chip 30 having aluminum electrode pads 32 formed on the respective openings of a passivation film 34 shown in a step (A) of FIG. 6, copper plated posts and bumps are formed in the following steps. Here, as shown in a step (B) of FIG. 6, a photosensitive plating resist 37 is applied first.

Then, as shown in a step (C) of FIG. 6, a plating resist layer 37 having non-penetrating holes 37a reaching the respective aluminum electrode pads 32 is formed in the same manner as that in the first embodiment. The non-penetrating holes are formed by a chemical treatment herein. It is also possible to use layer to form the non-penetrating holes.

Next, as shown in a step (D) of FIG. 6, the aluminum electrode pads 32 are subjected to a zincate treatment. In this example, the non-penetrating holes 37a of the plating resist layer 37 are formed and then the aluminum electrode pads 32 are subjected to the zincate treatment. It is also possible to conduct a zincate treatment to the aluminum electrode pads 32 of the semiconductor chip 30 before forming the plating resist layer 37.

Figure 7:
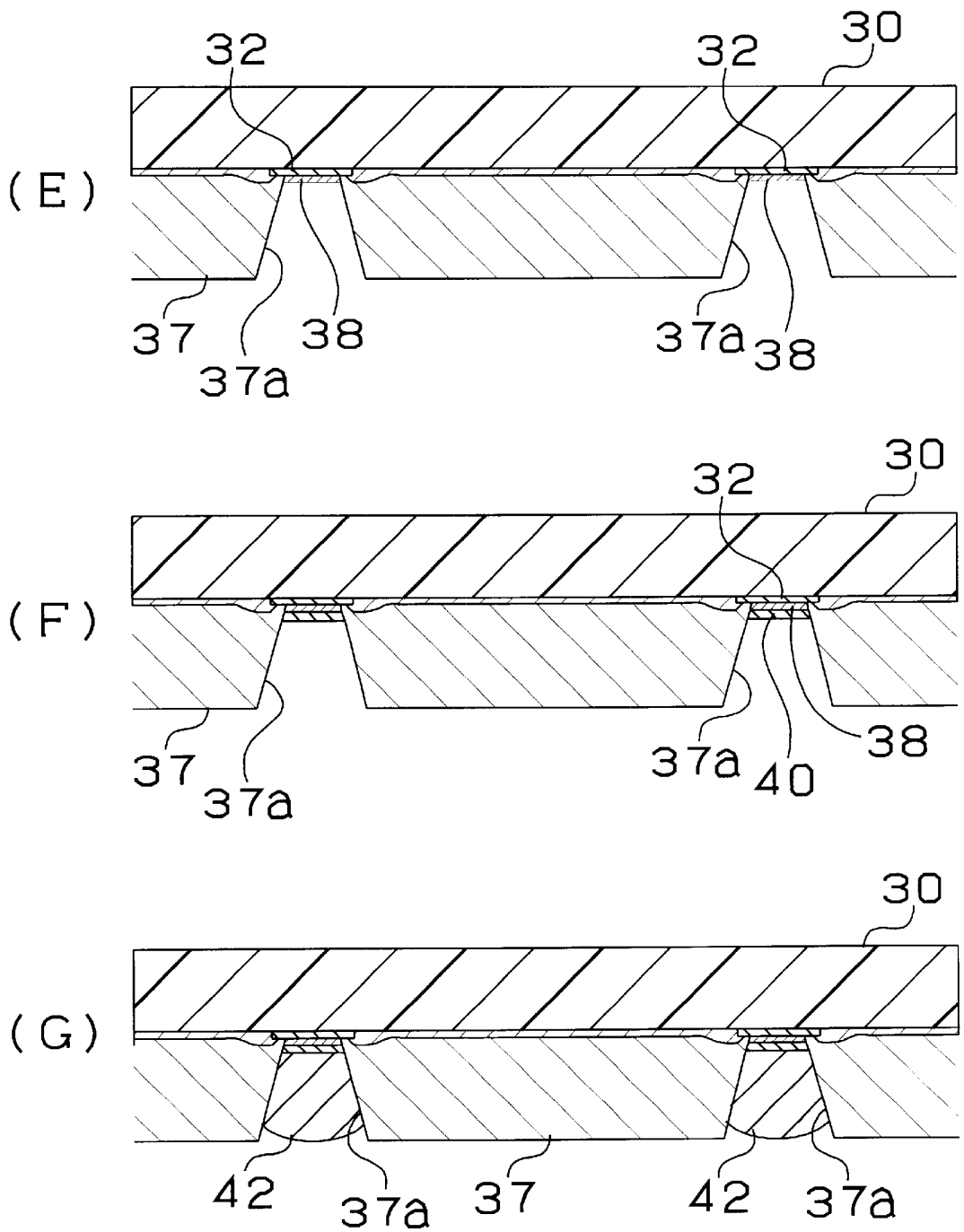
FIG. 7 is a manufacturing step view of the semiconductor chip according to the second embodiment.

Thereafter, as shown in a step (E) of FIG. 7, the semiconductor chip 30 is immersed in an electroless nickel plating solution to deposit nickel plated layers 38 on the surfaces of the respective aluminum electrode pads 32. It is possible to omit this nickel plated layer formation step and to directly form composite plated layers on the respective aluminum electrode pads 32.

As shown in a step (F) of FIG. 7, the semiconductor chip 30 is immersed in a nickel-copper composite plating solution to form nickel-copper plated layers 40 each having a thickness of 0.01 to 5 $\mu$m on the nickel plated layers 38, respectively. By constituting the surface of each composite plated layer to contain 1 to 70 wt % nickel with a main component other than nickel being copper, it is possible to easily form a copper plated member on the surface.

Next, as shown in a step (G) of FIG. 7, vias 42 are formed in the non-penetrating holes 37a, respectively. For this plating, electroless plating is used. Copper plated posts are formed so as not to be protrude from the respective non-penetrating holes 37a herein. It is also possible to conduct copper plating so that copper plated members protrude from the respective non-penetrating holes 37a, to remove resultant surfaces by polishing or the like and then to flatten the surfaces.

Figure 8:
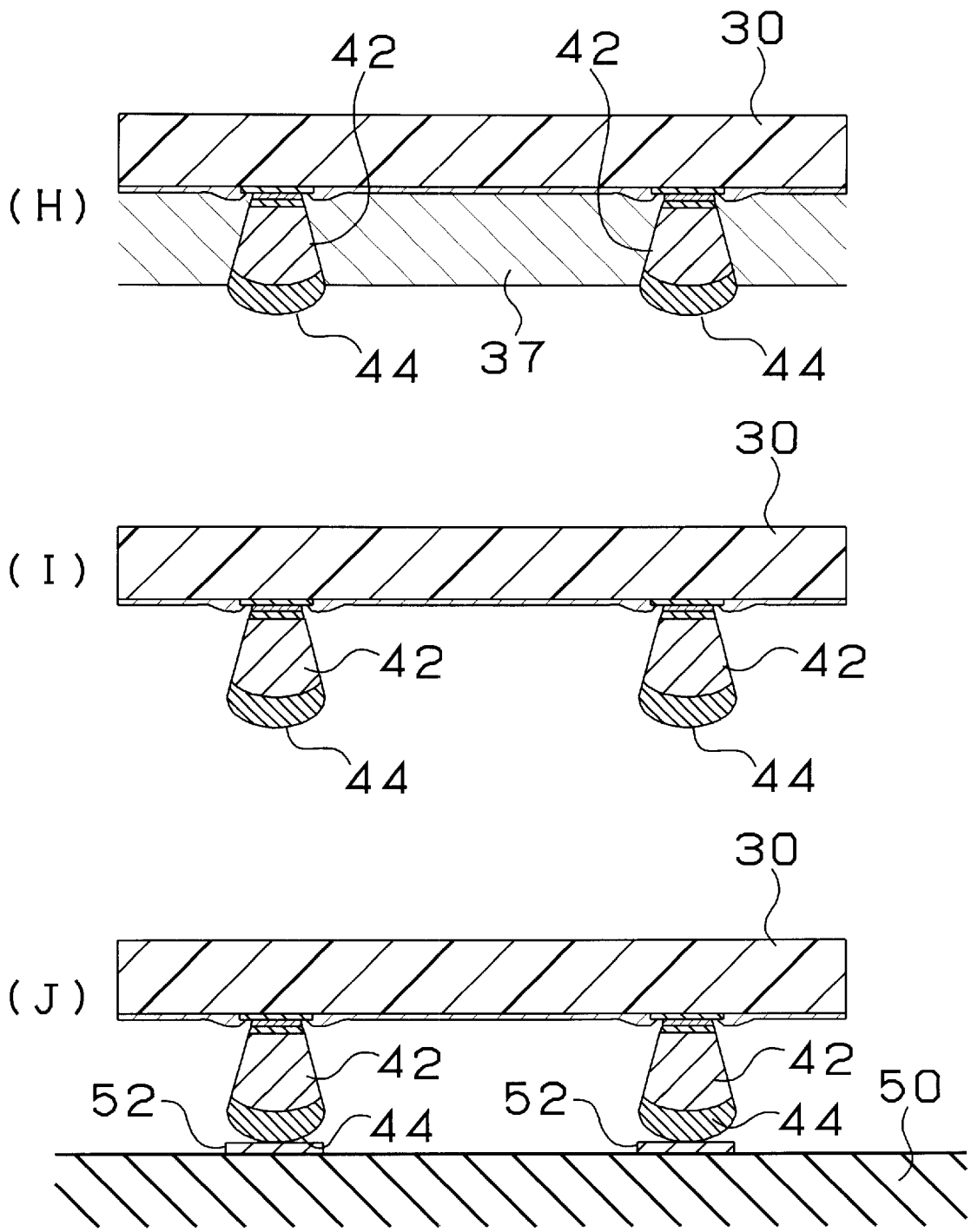
FIG. 8 is a manufacturing step view of the semiconductor chip according to the second embodiment.

Next, in a step (H) of FIG. 8, bumps (or protruding conductors) 44 are formed on the surfaces of the respective vias 42.

Finally, as shown in a step (I), the plating resist layer 37 is peeled off and removed. While the plating resist layer is peeled off and removed in this embodiment, it is also possible to use the plating resist layer 37 without being peeled off and removed.

The semiconductor chip 30 is mounted so that the bumps 44 of the semiconductor chip 30 correspond to the respective pads 52 of the substrate 50 and reflow is conducted, thereby attaching the semiconductor chip 30 to the substrate 50 as shown in a step (J) of FIG. 5.

In the second embodiment, the plating resist 37 is removed after forming the bumps 44. It is also possible to form the vias 42, to remove the plating resist 37 and then to form the bumps by the transfer of a solder or the like.

Further, in the second embodiment, high connection reliability can be obtained without using an under-fill between the semiconductor chip 30 and the substrate 50. It is also possible to further enhance the connection reliability by interposing an under-fill.

Figure 9:
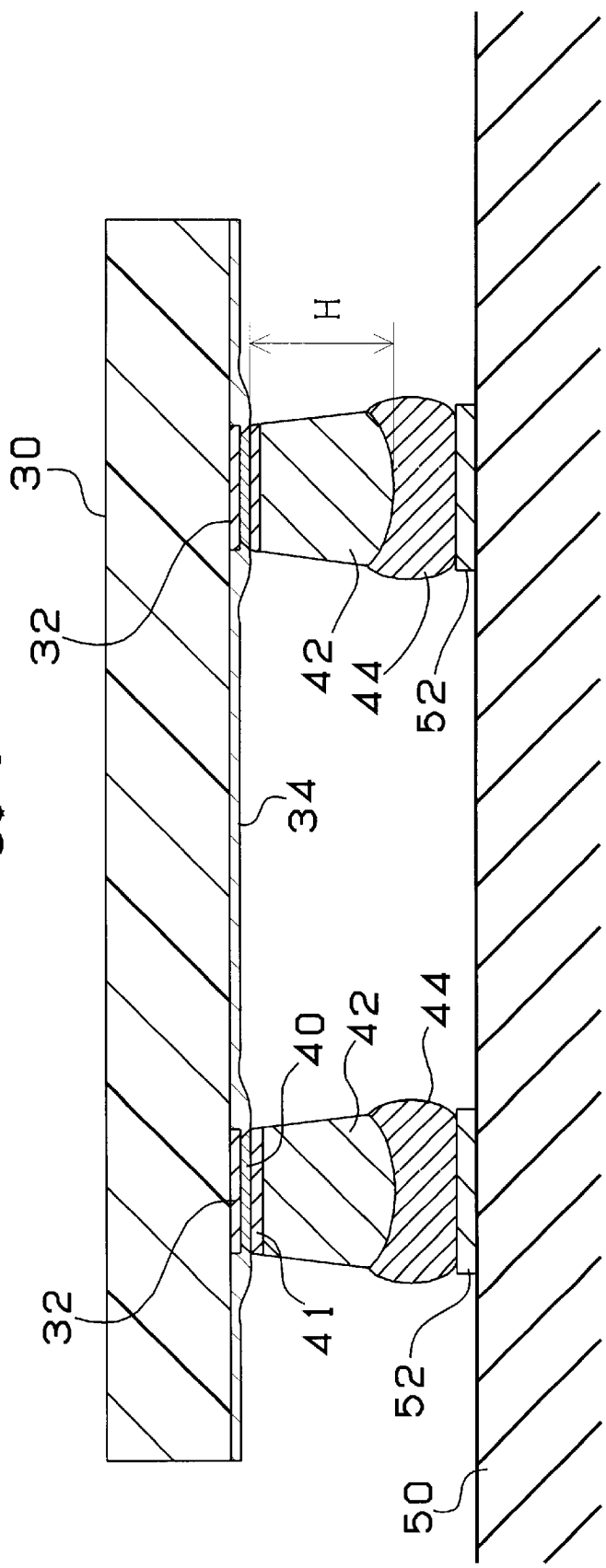
FIG. 9 is a cross-sectional view of a semiconductor chip according to the third embodiment of the present invention.

Next, a semiconductor chip and a semiconductor chip manufacturing method according to the third embodiment of the present invention will be described with reference to FIGS. 9 to 12. FIG. 9 shows a semiconductor chip according to the third embodiment of the present invention.

Aluminum electrode pads 32 are formed on the openings of a passivation film 34, respectively, on the lower surface of the semiconductor chip 30. A copper plated conductor 42 is formed on each aluminum electrode pad 32 with a nickel-copper composite plated layer 40 and an electroless copper plated layer 41 interposed between the copper plated conductor and the aluminum electrode pad. A protruding conductor (or bump) 44 made of a low melting point such as a solder is provided at the via 42.

The aluminum electrode pads 32 of the semiconductor chip 30 and corresponding pads 52 on a substrate 50 side are connected to one another by the protruding conductors (or bumps) 44, respectively.

Here, each copper plated via 42 is formed to have a height (H) of 15 to 200 $\mu$m. Also, the via 42 is formed to have a diameter of 20 to 100 $\mu$m. Here, a stress is generated between the semiconductor chip 30 and the substrate 50 due to the difference in the coefficient of thermal expansion between the semiconductor chip 30 and the substrate 50 and heat generated when the semiconductor chip 30 operates. However, since the stress can be absorbed by the copper-plated vias 42 having flexibility, no cracks occur to electrical connection sections and high connection reliability is provided between the semiconductor chip 30 and the substrate.

It is noted that the height H of the copper-plated via 42 is preferably 15 $\mu$m or more. This is because the vias cannot sufficiently absorb the stress if the height H is smaller than 15 $\mu$m. On the other hand, the height H is preferably 200 $\mu$m or less. This is because the semiconductor chip 30 becomes less easy to handle if the height exceeds 200 $\mu$m.

Next, the method of manufacturing the semiconductor chip 30 shown in FIG. 9 will be described with reference to FIGS. 10 to 12.

With respect to a semiconductor chip 30 having aluminum electrode pads 32 formed on the respective openings of a passivation film 34 shown in a step (A) of FIG. 10, copper-plated posts and bumps are formed in the following steps. Here, a zincate treatment is conducted first as shown in a step (B) of FIG. 10.

Then, the semiconductor chip 30 is immersed in a nickel-copper composite plating solution and nickel-copper composite plated layers 40 of 0.01 to 5 $\mu$m are formed on the respective aluminum electrode pads 32 as shown in a step (C) of FIG. 10. By constituting the surface of each composite plated layer to contain 1 to 70 wt % nickel with a main component other than nickel being copper, it is possible to easily form a copper plated member on the surface.

Next, the semiconductor chip 30 is immersed in an electroless copper plating solution and an electroless copper plated layer 41 is uniformly formed on the lower surface side of the chip 30 (in a step (D) of FIG. 10).

Thereafter, a photosensitive plating resist 37 is applied onto the electroless copper plated layer 41 (in a step (E) of FIG. 10).

Then, after a drying treatment is conducted to the plating resist, exposure and development treatments are conducted and non-penetrating holes 37a reaching the electroless copper plated layer 41 on the aluminum electrode pads 32 are formed, respectively (in a step (F) of FIG. 11). While the non-penetrating holes are formed by a chemical treatment herein, it is also possible to use laser to form the holes.

Next, as shown in a step (G) of FIG. 11, copper-plated vias 42 are formed in the non-penetrating holes 37a, respectively by electroplating. This plating is conducted by applying current through the electroless copper plated layer 41.

While the copper-plated posts are formed so as not to protrude from the respective non-penetrating holes 37a herein, it is also possible to conduct copper plating so that copper-plated members protrude from the respective non-penetrating holes 37a, then to remove resultant surfaces by polishing or the like and to flatten the surfaces.

Figure 12:
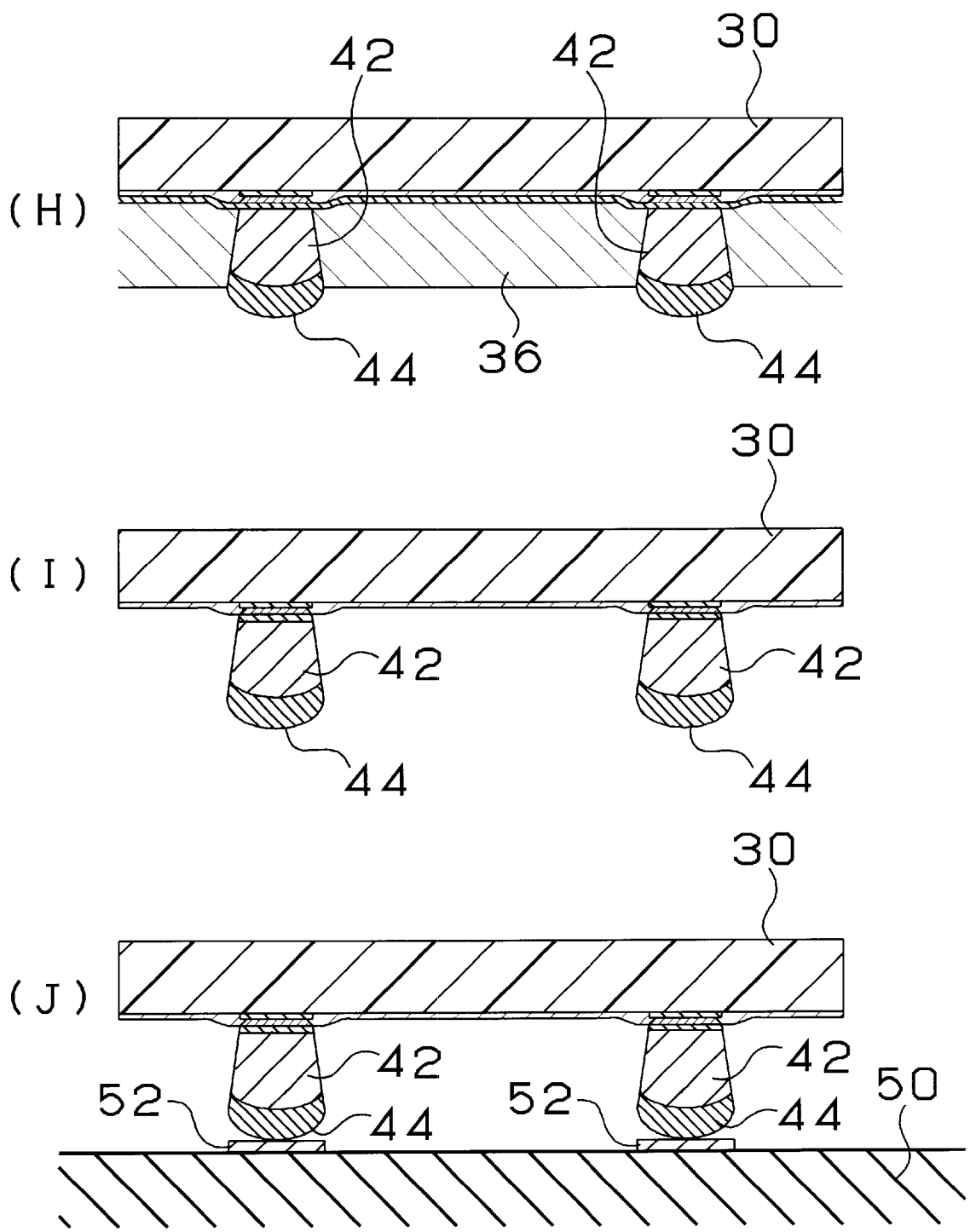
FIG. 12 is a manufacturing step view of the semiconductor chip according to the third embodiment.

Next, in a step (H) of FIG. 12, bumps (or protruding conductors) 44 are formed on the surfaces of the respective vias 42.

Finally, as shown in a step (I) of FIG. 12, the plating resist layer 37 is peeled off and removed, and the electroless copper plated layer 41 under the plating resist layer 37 is etched away.

As shown in a step (J) of FIG. 12, the semiconductor chip 30 is mounted so that the bumps 44 of the semiconductor chip 30 correspond to the respective pads 52 of the substrate 50 and reflow is conducted, thereby attaching the semiconductor chip 30 to the substrate 50 as shown in FIG. 9.

In the third embodiment, the plating resist layer 37 is removed after forming the bumps 44. It is also possible to form the vias 42, to remove the plating resist layer 37 and then to form the bumps by the transfer of a solder or the like.

Further, in the third embodiment, high connection reliability can be obtained between the semiconductor chip 30 and the substrate 50 without using an under-fill. It is also possible to further enhance the connection reliability by interposing an under-fill.

Next, a semiconductor chip and a semiconductor chip manufacturing method according to the fourth embodiment of the present invention will be described with reference to the drawings.

Figure 13:
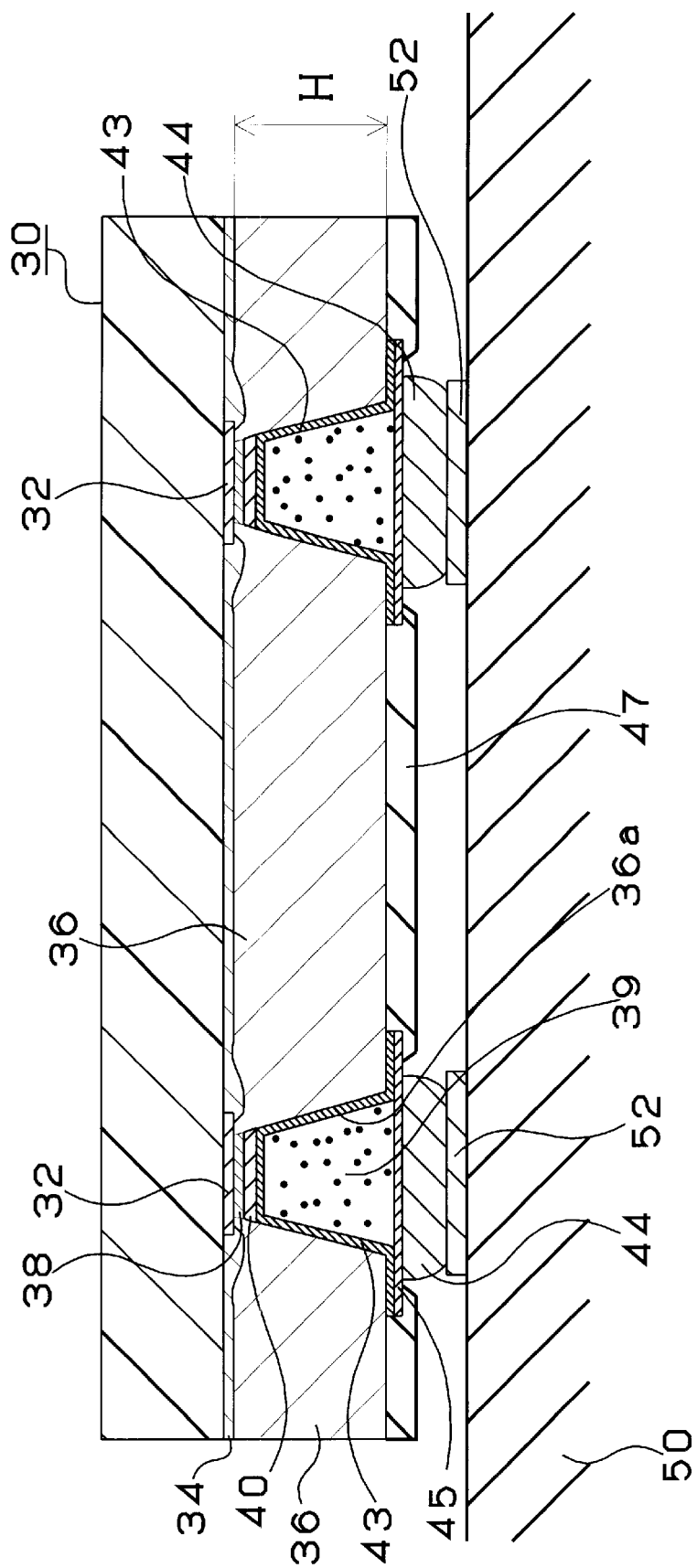
FIG. 13 is a cross-sectional view of a semiconductor chip according to the fourth embodiment of the present invention.

FIG. 13 shows a semiconductor chip according to the fourth embodiment of the present invention.

Aluminum electrode pads 32 which have been subjected to a zincate treatment are formed on the respective openings of a passivation film 34 on the lower surface of the semiconductor chip 30. In this embodiment, a resin insulating layer 36 is provided on the lower surface of the passivation film 34 and non-penetrating holes 36a reaching the respective aluminum electrode pads 32 are formed in the resin insulating layer 36. A via 43 which is copper plated and has a thickness of 5 to 25 $\mu$m is formed on each aluminum electrode pad 32 at the bottom of the non-penetrating hole 36a through a nickel plated layer 38 and a nickel-copper composite plated layer 40. A resin 39 containing a copper filler is filled in the via 43 and a plated cover (or metallic film) 45 formed by electroless copper plating is formed in each opening. A protruding conductor (or bump) 44 made of a low melting point metal such as a solder is provided on the plated cover 45.

The semiconductor chip 30 is connected to pads 52 on a substrate 50 side through the protruding conductors (or bumps) 44. Namely, the semiconductor chip 30 is connected to the substrate 50 through the aluminum electrode pads 32—nickel plated layers 38—composite plated layers 40—vias 43—plated covers 45. Here, the resin 39 filled in the vias 43 is not necessarily conductive.

Here, the thickness (H) of each resin insulating layer 36 and the height of each via 43 are formed to be 15 to 200 $\mu$m. The diameter of the via 43 is formed to be 20 $\mu$m to 250 $\mu$m. The resin insulating layer 36 is preferably a soft insulating layer having an elastic modulus of 1.0 to 3.5 GPa. A stress occurs between the semiconductor chip 30 and the substrate 50 due to the difference in the coefficient of thermal expansion between the semiconductor chip 30 and the substrate and heat generated when the semiconductor chip 30 operates. However, the stress can be absorbed by the resin insulating layer 36 having flexibility and the vias 43 filled with the resin 39 having elasticity. Due to this, no cracks occur to electrical connection sections and high connection reliability is provided between the semiconductor chip 30 and the substrate 50.

The thickness of the resin insulating layer 36 is preferably 15 $\mu$m or more. If the thickness is smaller than 15 $\mu$m, the resin insulating layer 36 cannot sufficiently absorb the stress. It is also preferable that the thickness is 200 $\mu$m or less. If the thickness exceeds 200 $\mu$m, the connection reliability between the semiconductor chip 30 and the substrate 50 deteriorates.

Next, the method of manufacturing the semiconductor chip 30 according to the fourth embodiment will be described with reference to FIGS. 14 to 16.

With respect to a semiconductor chip 30 having aluminum electrode pads 32 formed on the respective openings of a passivation film 34 shown in a step (A) of FIG. 14, bumps are formed in the following steps. An insulating resin layer 36 is formed first as shown in a step (B) of FIG. 14.

As a resin for forming this insulating resin layer 36, a thermosetting epoxy resin or polyimide resin is used so as to form non-penetrating holes by laser in this embodiment. Here, if non-penetrating holes are formed by a chemical treatment as in the case of the first embodiment, a photosensitive epoxy resin or polyimide resin can be used. Next, after conducting a drying treatment, non-penetrating holes 36a are formed by laser as shown in a step (C) of FIG. 14. Further, a heating treatment is conducted to thereby form the insulating resin layer 36 having non-penetrating holes 36a reaching the respective aluminum electrode pads 32. It is preferable that the surface layer portion of the plated insulating resin layer stated above is softer than a semiconductor chip side thereof.

Then, as shown in a step (D) of FIG. 14, a zincate treatment is conducted.

Figure 15:
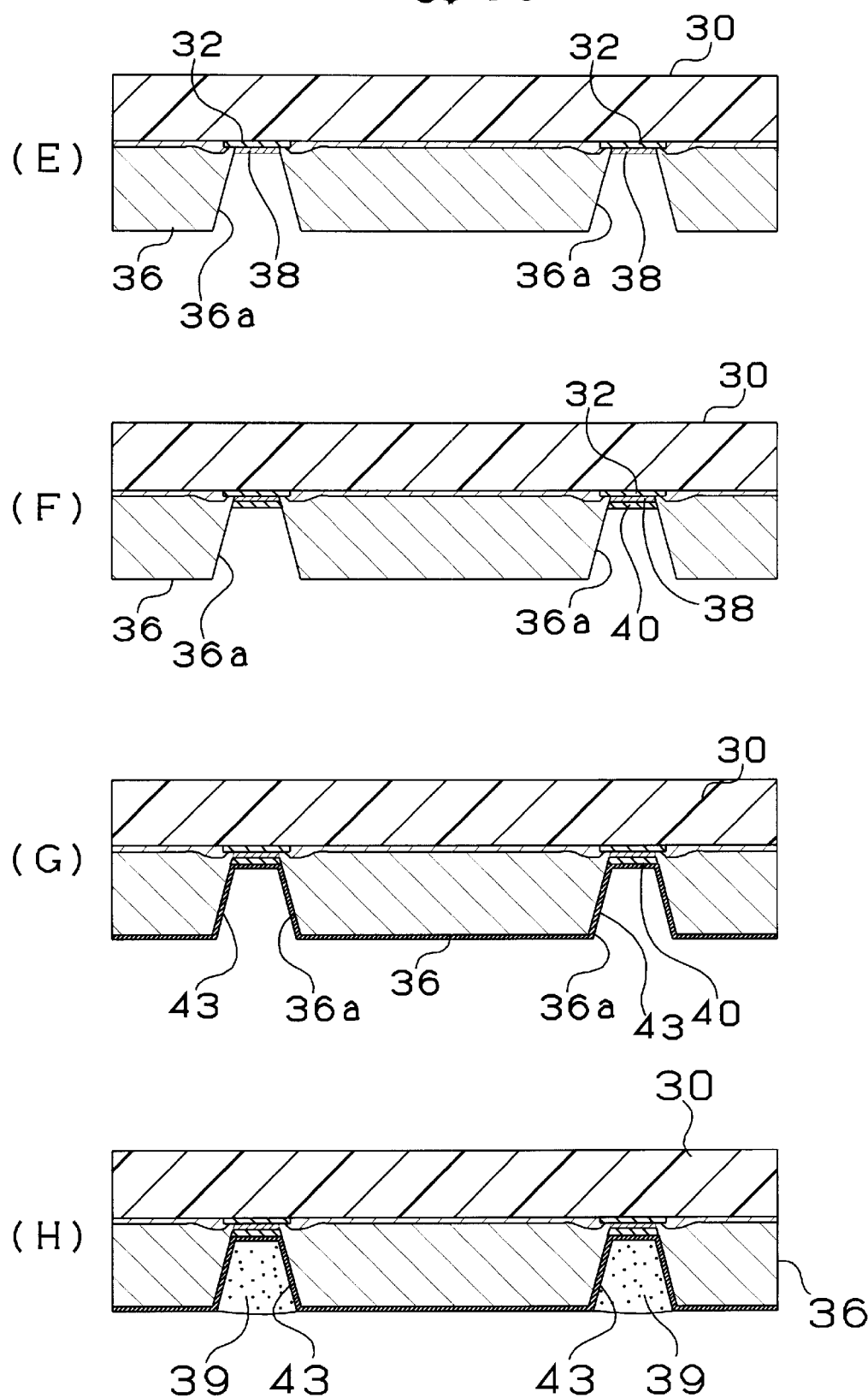
FIG. 15 is a manufacturing step view of the semiconductor chip according to the fourth embodiment.

Next, as shown in a step (E) of FIG. 15, the semiconductor chip 30 is immersed in an electroless nickel plating solution and a nickel plated layer 38 is deposited on each aluminum electrode pad 32. This nickel plated layer formation step may be omitted or a composite plated layer may be directly formed on each zincate-treated aluminum electrode pad 32.

As shown in a step (F) of FIG. 15, the semiconductor chip 30 is immersed in a nickel-copper composite plating solution and a nickel-copper composite plated layer 40 of 0.1 to 5 $\mu$m is formed on each nickel plated layer 38. By constituting this composite plated layer to contain 1 to 70 wt % of nickel with a main component other than nickel being copper, a copper plated member can be easily formed on the surface. While the plating resist is formed and then the composite plated layer is formed herein, it is also possible to form the composite plated layer and then to form the plating resist.

Next, as shown in a step (G) of FIG. 15, electroless plating is uniformly performed onto the surface of the insulating resin layer 36 (so as to have a thickness of 5 to 25 $\mu$m), thereby forming copper-plated vias 43 in the respective non-penetrating holes 36a.

Thereafter, in a step (H) of FIG. 15, a thermosetting epoxy resin or polyimide resin to which a copper filler is added is filled in the vias 43 and heated. While the resin containing the copper filler is used herein, it is also possible to use a resin which does not contain a copper filler.

Figure 16:
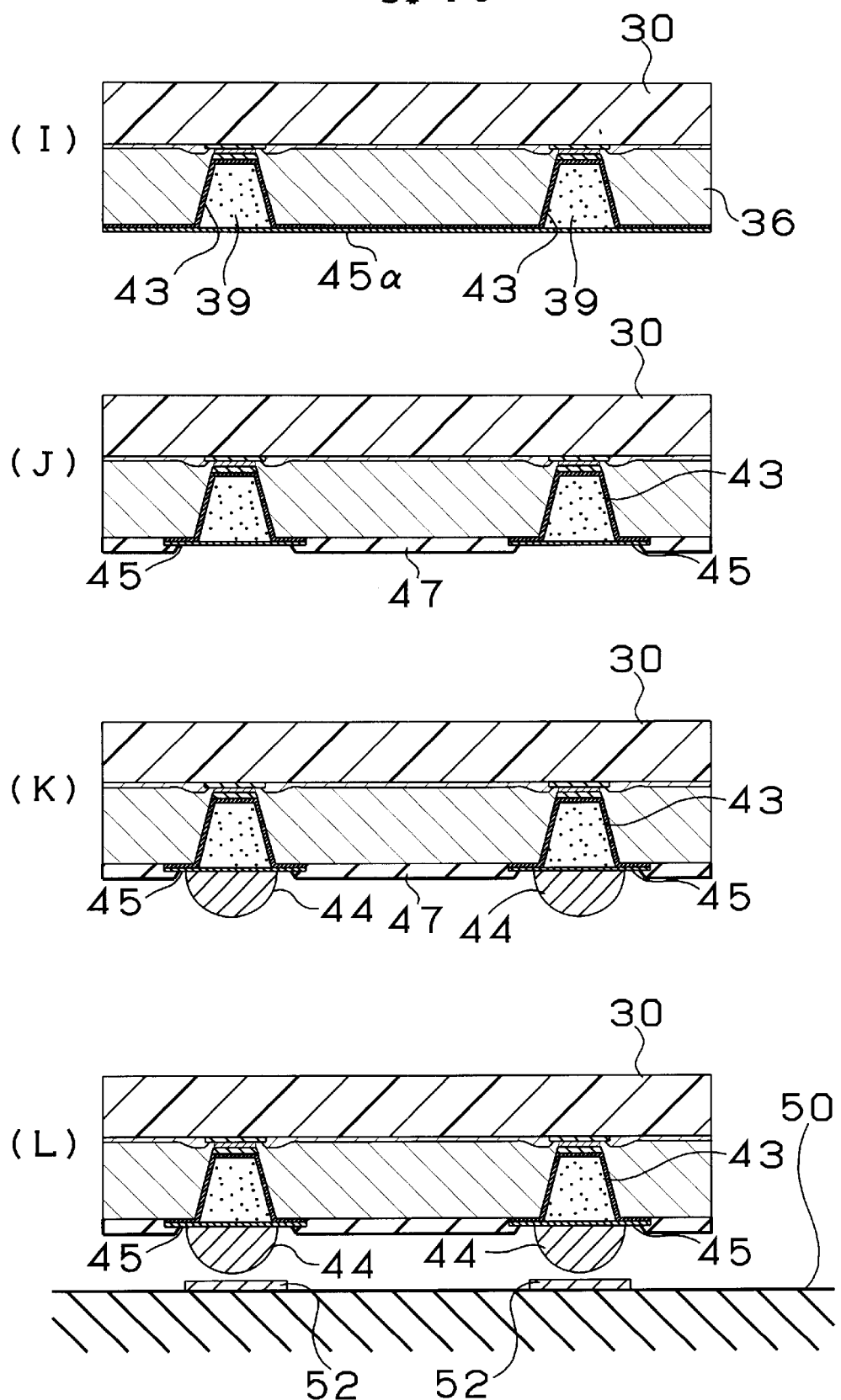
FIG. 16 is a manufacturing step view of the semiconductor chip according to the fourth embodiment.

Next, in a step (I) of FIG. 16, the semiconductor chip 30 is immersed in an electroless plating solution and an electroless plated layer 45α is uniformly formed. Here, the resin 39 filled in the vias 43 contains the copper filler as stated above. Due to this, the electroless plated layer 45α can be formed so as to cover the openings of the vias. Thereafter, in a step (J), the resist is formed and the electroless plated layer 45α and the electroless plated layer on the lower layer are removed, thereby forming plated covers 45. Then, a resist 47 having openings in the plated covers 45 is formed.

In a step (K) of FIG. 16, bumps (or protruding conductors) 44 are formed on the surfaces of the plated covers 45, respectively.

As shown in a step (L), the semiconductor chip 30 is mounted so that the bumps 44 of the semiconductor chip 30 correspond to the respective pads 52 of the substrate 52 and reflow is conducted, thereby attaching the semiconductor chip 30 to the substrate 50 as shown in FIG. 13.

In this fourth embodiment, the bumps 44 are subjected to reflow to thereby attach the semiconductor chip 30 to the substrate 50. It is also possible to attach the semiconductor chip to the substrate through an adhesive as in the case of the semiconductor chip in the first embodiment.

Next, description will be given to a semiconductor chip and a semiconductor chip manufacturing method according to the fifth embodiment of the present invention with reference to the drawings.

Figure 17:
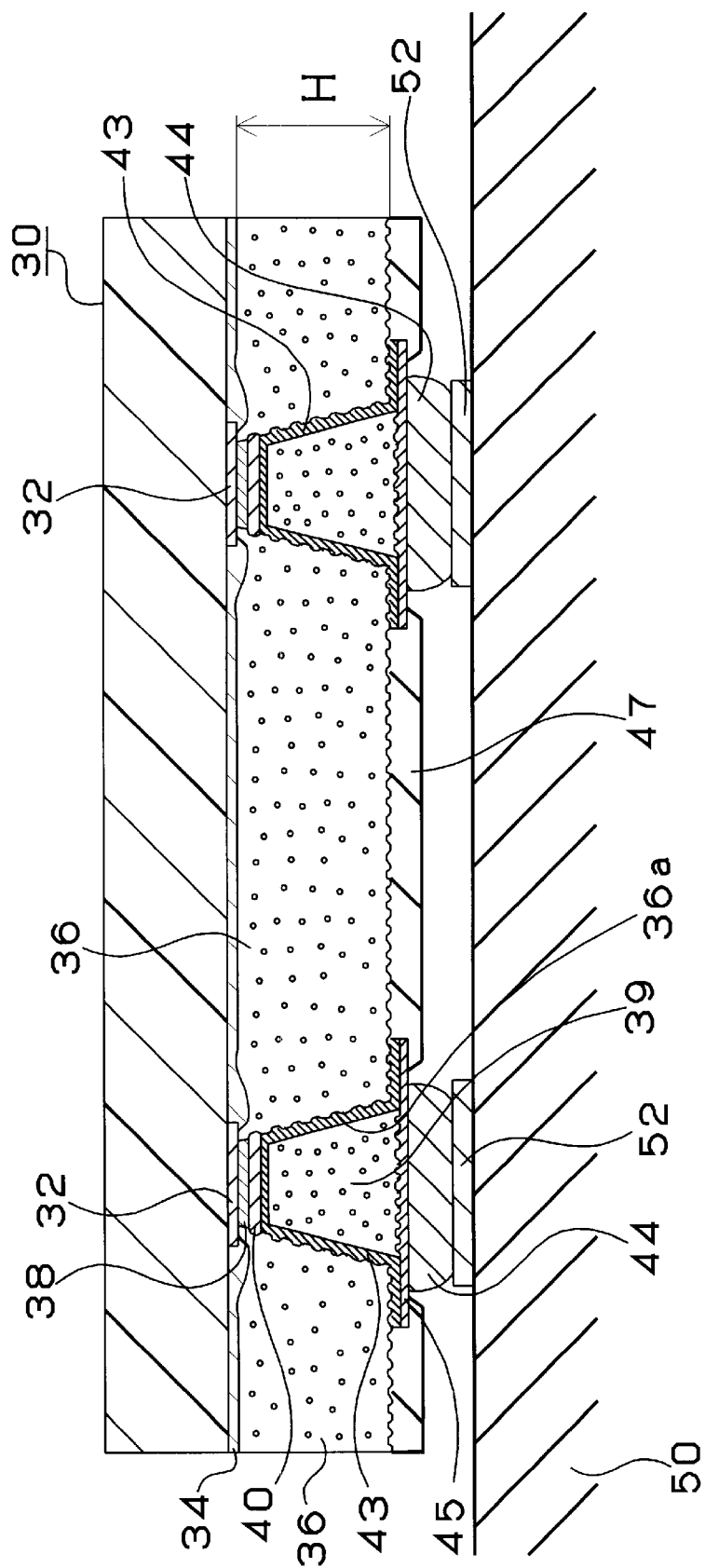
FIG. 17 is a cross-sectional view of a semiconductor chip according to the fifth embodiment of the present invention.

FIG. 17 shows a semiconductor chip according to the fifth embodiment.

Aluminum electrode pads 32 which have been subjected to a zincate treatment are formed on the respective openings of a passivation film 34 on the lower surface of the semiconductor chip 30. In this embodiment, a resin insulating layer 36 is provided on the lower surface of the passivation film 34 and non-penetrating holes 36a reaching the respective aluminum electrode pads 32 are formed in the resin insulating layer 36. A copper plated via 43 is formed on each aluminum electrode pad 32 at the bottom of each non-penetrating hole 36a through a nickel plated layer 38 and a nickel-copper composite plated layer 40. A resin 39 containing an epoxy filler is filled in the vias 43 and a plated cover (metallic film) 45 made of an electroless copper plated member is formed at the opening of each via. A protruding conductor (or bump) 44 made of a low melting point metal is provided at each plated cover 45.

The semiconductor chip 30 is connected to pads 52 on a substrate 50 side through the protruding conductors (or bumps) 44. Namely, the semiconductor chip 30 is connected to the substrate 50 through aluminum electrode pads 32—nickel plated layers 38—composite plated layers 40—vias 43—plated covers 45.

Here, the thickness (H) of the resin insulating layer 36 and the height of each via 43 are formed to be 15 to 200 μm. Also, the diameter of the via 43 is formed to be 20 μm to 250 μm. It is preferable that the resin insulating layer 36 is a soft insulating layer having an elastic modulus of 1.0 to 3.5 GPa. Here, a stress is generated between the semiconductor chip 30 and the substrate 50 due to the difference in the coefficient of thermal expansion between the semiconductor chip 30 and the substrate 50 and heat generated when the semiconductor chip 30 operates. However, since the resin insulating layer 36 having flexibility and the vias 43 filled with the resin 39 having flexibility can absorb the stress, no cracks occur to electrical connection sections and high connection reliability is provided between the semiconductor chip 30 and the substrate 50. In case of the semiconductor chip in this fifth embodiment, the resin 39 in the vias 43 contains the epoxy filler and is, therefore, excellent in flexibility compared with the resin 39 of the semiconductor chip containing a metallic filler in the fourth embodiment. By adjusting the resin to have the same elastic modulus as that of the resist layer 37, the stress can be absorbed more efficiently. In this embodiment, the epoxy filler is used as the above-stated filler. It is also possible to use the other resin filler or a rubber filler such as a silicon rubber filler.

Next, the method of manufacturing the semiconductor chip 30 according to the fifth embodiment will be described with reference to FIGS. 18 to 20.

With respect to a semiconductor chip 30 having aluminum pads 32 formed in the respective openings of a passivation film 34 shown in a step (A) of FIG. 18, bumps are formed in the following steps. Here, as shown in a step (B) of FIG. 18, a resin 36 containing an epoxy filler soluble in an oxidizer is first applied to the chip 30.

Figure 18:
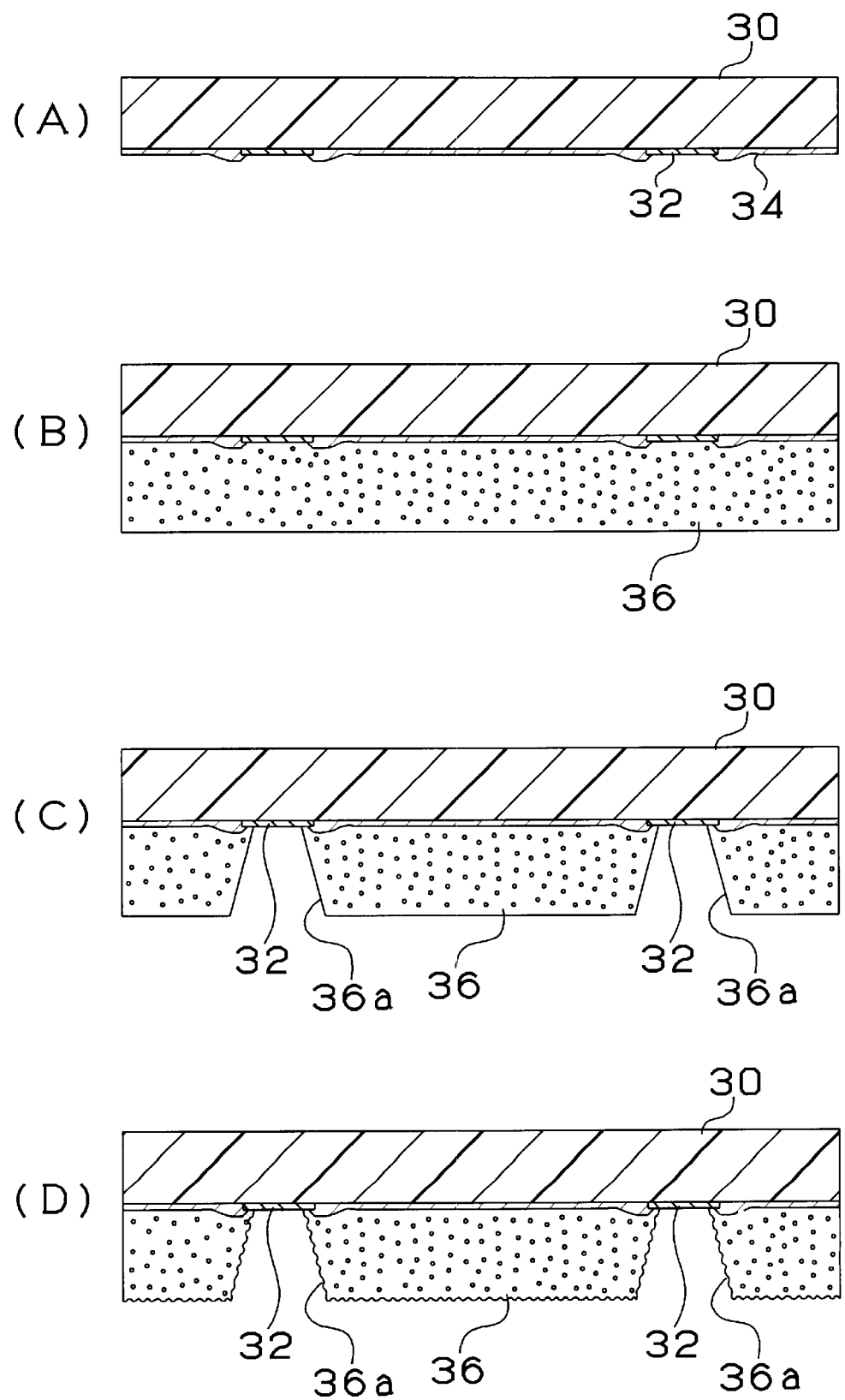
FIG. 18 is a manufacturing step view of the semiconductor chip according to the fifth embodiment.

Next, as shown in a step (C) of FIG. 18, non-penetrating holes 36a are formed by exposure and development treatments. A heating treatment is then conducted to thereby form a resin layer 36 having the non-penetrating holes 36a reaching the respective aluminum electrode pads 32.

The semiconductor chip is immersed in an oxidizer, and the epoxy filler present on the surface of the resin layer 36 is dissolved and removed to thereby roughen the surface of the resin layer 36 as shown in a step (D).

Next, the surface of each aluminum electrode pad 32 is subjected to a zincate treatment to facilitate depositing a nickel plated layer or a nickel-copper composite plated layer.

Figure 19:
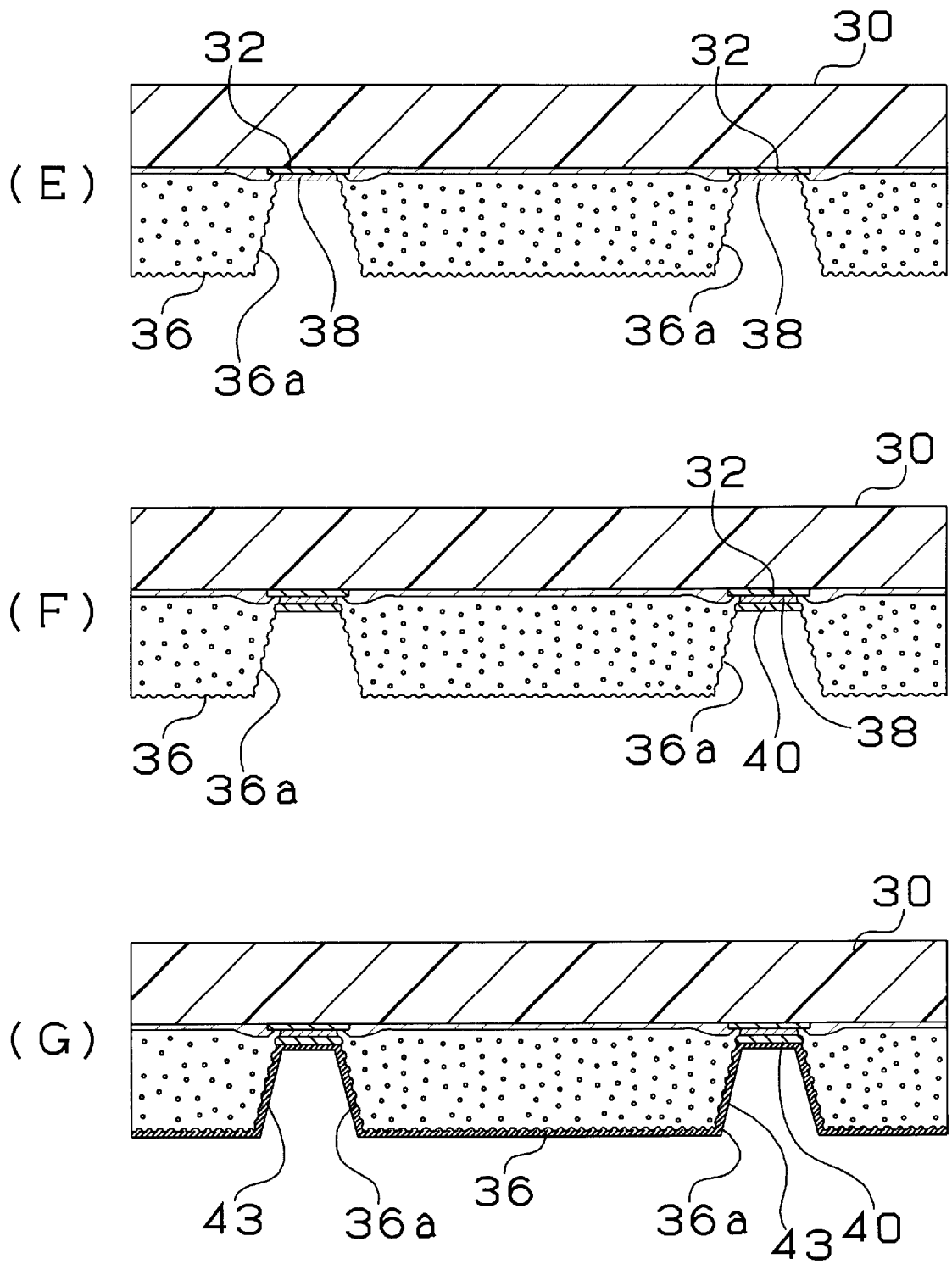
FIG. 19 is a manufacturing step view of the semiconductor chip according to the fifth embodiment.

Next, as shown in a step (E) of FIG. 19, the semiconductor chip 30 is immersed in an electroless plating solution to thereby deposit a nickel plated layer 38 on the surface of each aluminum electrode pad 32. This nickel plated layer formation step may be omitted or a composite plated layer may be. directly formed on the aluminum electrode pad 32.

Then, as shown in a step (F) of FIG. 19, the semiconductor chip 30 is immersed in a nickel-copper composite plating solution to thereby form a nickel-copper composite plated layer 40 of 0.01 to 5 μm on the nickel plated layer 38.

Next, as shown in a step (G) of FIG. 19, electroless plating is conducted to the surface of the resin layer 36 so as to have a thickness of 5 to 25 μm, thereby forming copper-plated vias 43 in the respective non-penetrating holes 36a.

Figure 20:
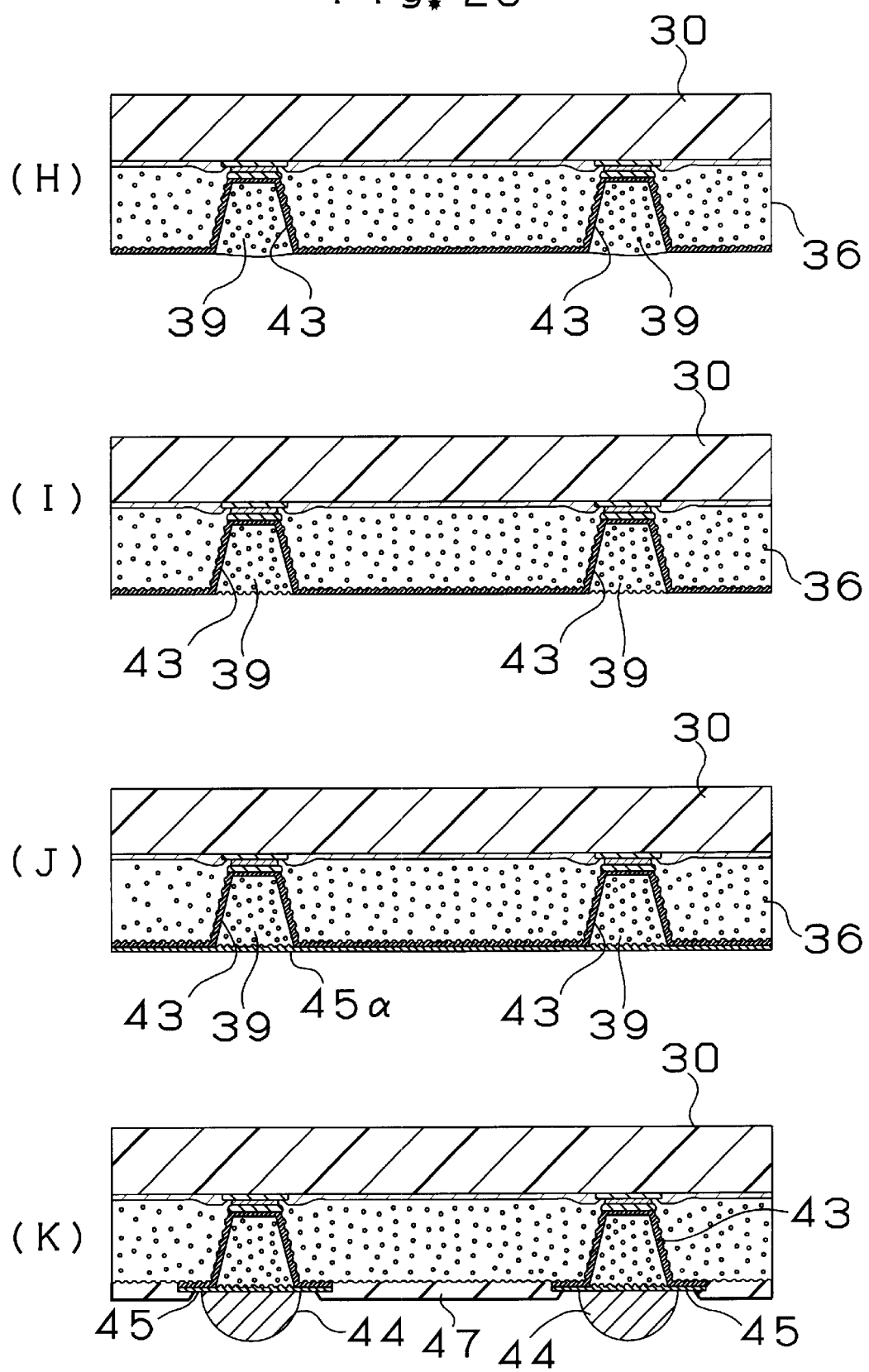
FIG. 20 is a manufacturing step view of the semiconductor chip according to the fifth embodiment.

Then, in a step (H) of FIG. 20, a resin having the same composition as that of the resin layer stated above is filled in the vias 43. Thereafter, the semiconductor chip is heated to thereby form the resin 39 in the vias 43.

Next, the semiconductor chip is immersed in an oxidizer and, as shown in a step (I), the epoxy filler present on the surface of the resin 39 is dissolved and removed, thereby roughening the surface.

In a step (J) of FIG. 20, the semiconductor chip 30 is immersed in an electroless copper plating solution and an electroless plated layer 45α is uniformly formed. Here, since the surface of the resin 39 is roughened, the openings of the vias 43 can be fixedly attached to the electroless plated layer 45α. Thereafter, in a step (K), the resist is formed and the electroless plated layer 45α, and the electroless plated layer on the lower layer are removed, thereby forming plated covers 45. A resist 47 having openings in the plated covers 45 is formed and bumps (or protruding conductors) 44 are formed on the surfaces of the respective plated covers 45.

The semiconductor chip 30 is mounted so that the bumps 44 of the semiconductor chip 30 correspond to the respective pads 52 of the substrate 50 and reflow is conducted, thereby attaching the semiconductor chip 30 to the substrate 50 as shown in FIG. 17.

In this fifth embodiment, the bumps 44 are subjected to reflow, thereby attaching the semiconductor chip to the substrate. It is also possible to attach the semiconductor chip in the first embodiment to the substrate by adhesive.

Now, a semiconductor chip and a semiconductor chip manufacturing method according to the sixth embodiment will be described with reference to the drawings.

Figure 21:
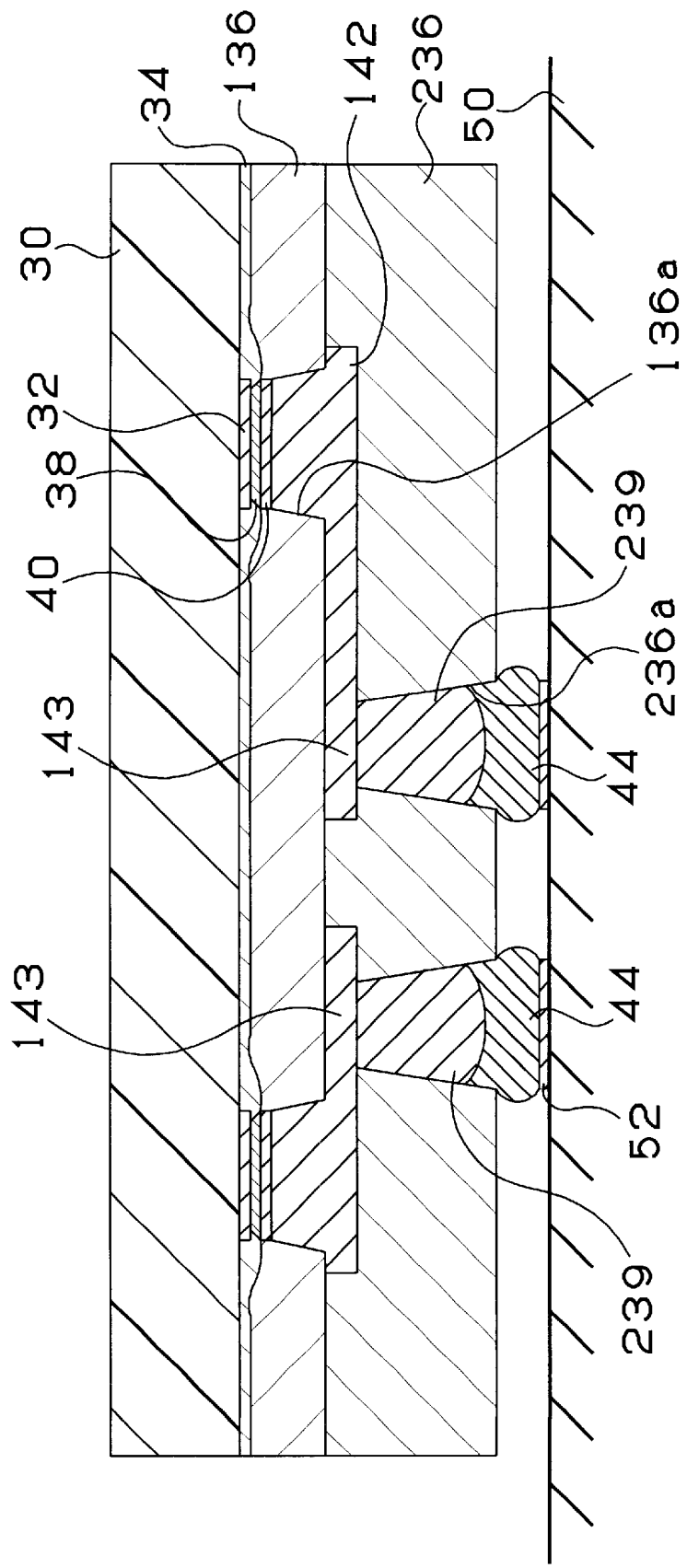
FIG. 21 is a cross-sectional view of a semiconductor chip according to the sixth embodiment of the present invention.

FIG. 21 shows a semiconductor chip according to the sixth embodiment of the present invention.

Aluminum electro de pads 32 which have been subjected to a zincate treatment are formed on the respective openings of a passivation film 34 on the lower surface of the semiconductor chip 30. In this embodiment, the first insulating layer 136 is provided on the lower surface of the passivation film 34 and non-penetrating holes 136a reaching the respective aluminum electrode pads are formed in the first insulating layer 136. Copper-plated inner vias 142 are formed in the non-penetrating holes 136a through nickel-copper composite plated layers 40 to be electrically connected to the aluminum electrode pads 32, respectively and electrically connected to conductor circuit layers 143 on the surface of the first insulating layer 136, respectively.

According to the present invention, an epoxy resin, a polyimide resin or the like can be used for the first insulating layer.

The first insulating layer 136 and the conductor circuit layers 143 are covered with the second insulating layer 236 and non-penetrating holes 236a reaching the respective conductor circuit layers 143 are provided in the second insulating layer 236. Filled vias made of copper plated members 239 are formed in the non-penetrating holes 236a, respectively. Protruding conductors (or bumps) 44 made of a low melting point metal such as a solder are provided at the filled vias 239, respectively. The semiconductor chip 30 is connected to pads 52 of a substrate 50 through the bumps 44.

Here, the second insulating layer 236 is formed out of a soft resin having an elastic modulus of 1.0 to 3.5 GPa and with a thickness of 15 to 200 $\mu$m. By setting the diameter of each non-penetrating hole 236a provided in the second insulating layer 236 at 20 to 100 $\mu$m, the filled vias 239 can exhibit excellent flexibility and can absorb a stress generated due to the difference in thermal expansion between the semiconductor chip and the substrate more appropriately. It is, therefore, possible to mount the semiconductor chip on the substrate with high connection reliability and without generating cracks in electrical connection sections.

According to the present invention, a thermosetting epoxy resin, polyimide resin or the like can be used for the second insulating layer.

By setting the nickel-copper composite plated layer 40 to have a thickness of 0.01 to 5 $\mu$m, setting a nickel content on the copper-plated layer-side composite layer at 1 to 70 wt % with a remaining component being substantially copper, the copper-plated inner vias 142 can be formed more appropriately.

Next, the method of manufacturing the semiconductor chip 30 according to the sixth embodiment will be described with reference to FIGS. 22 to 24.

With respect to a semiconductor chip 30 having aluminum electrode pads 32 formed on the respective openings of a passivation film 34 shown in a step (A) of FIG. 22, bumps are formed in the following steps.

Figure 22:
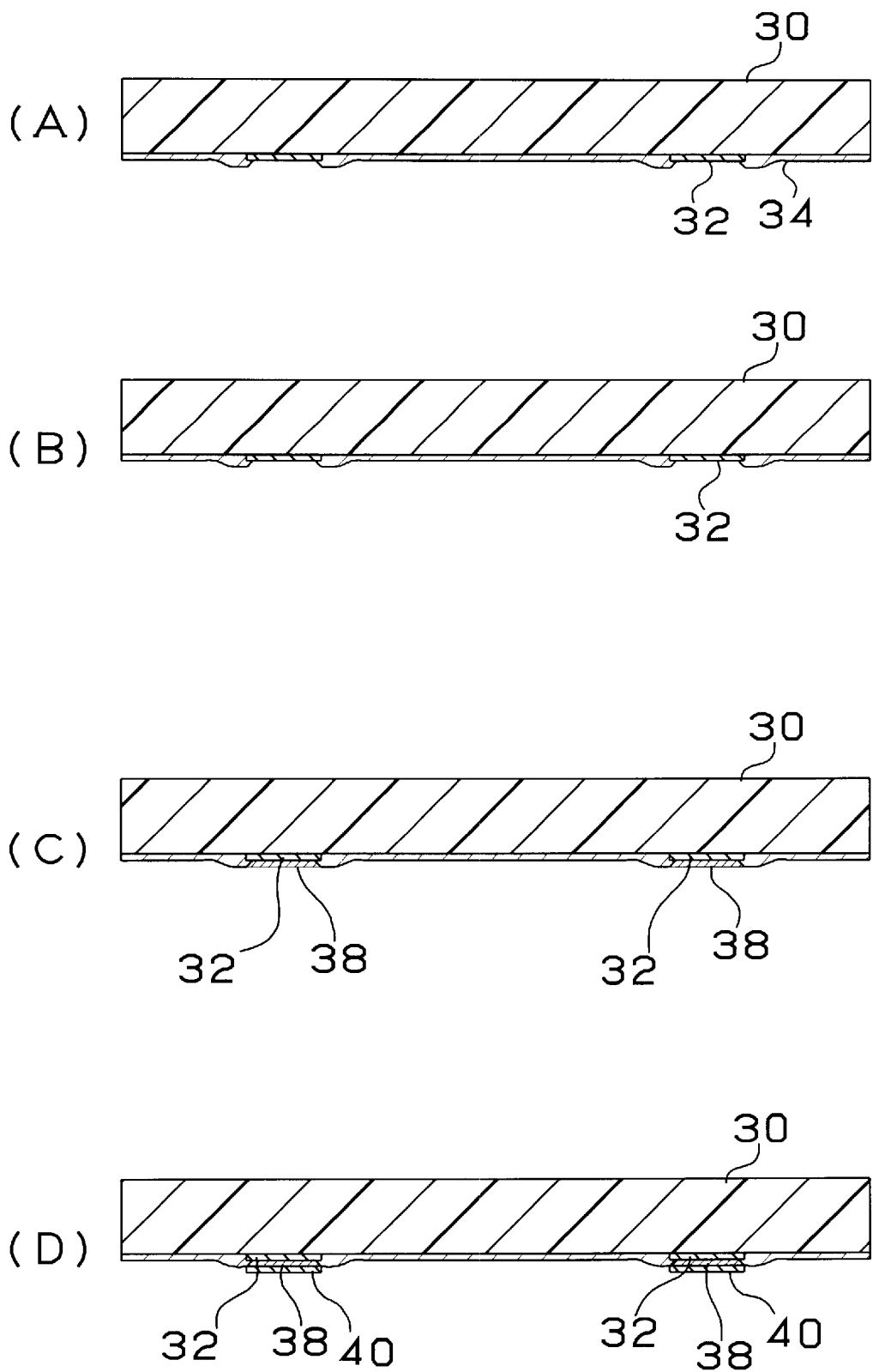
FIG. 22 is a manufacturing step view of the semiconductor chip according to the sixth embodiment.

First, as shown in a step (B) of FIG. 22, the surface of each aluminum electrode pad 32 is subjected to a zincate treatment to facilitate depositing a nickel plated layer or a nickel-copper composite plated layer.

As shown in a step (C) of FIG. 22, the semiconductor chip 30 is immersed in an electroless nickel plating solution and a nickel plated layer 38 is deposited on the surface of each aluminum electrode pad 32. This nickel plated layer formation step is intended to form a composite plated layer to be described later more promptly and more strongly. It is also possible to omit this step and to directly form a composite plated layer on each aluminum electrode pad 32.

Then, as shown in a step (D) of FIG. 22, the semiconductor chip 30 is immersed in an electroless nickel-copper composite plating solution to form a nickel-copper composite plated layer 40. In this case, by constituting the composite plated layer to have a thickness of 0.1 $\mu$m to 5 $\mu$m and to have a composition such that a nickel content on the surface of the layer falls within the range of 1 to 70 wt % and that the remaining component is substantially copper, it is possible to form copper plated members for forming inner vias 142 in a later step.

As the nickel-copper composite plating solution, an aqueous solution containing nickel sulfate, copper sulfate and sodium hypophosphite can be used, for example.

As shown in a step (E) of FIG. 23, an insulating resin is applied to the chip. As this insulating resin, a photosensitive epoxy resin or polyimide resin can be used. Instead of applying a resin, a dry film can be bonded to form the first insulating layer. Next, as shown in a step (F) of FIG. 23, non-penetrating holes 136a are formed by exposure and development treatments. Since the photosensitive resin is used as the first insulating layer and the non-penetrating holes can be formed by exposure and development, there is less fear of denaturing the surfaces of the electrode pads 32 or damaging the semiconductor chip. Further, a heat treatment is conducted to thereby form the first insulating layer 136 having the non-penetrating holes 136a reaching the respective aluminum electrode pads 32.

Next, as shown in a step (G) of FIG. 23, electroless copper plated members are filled in the non-penetrating holes 136a to thereby form inner vias 142 and, at the same time, conductor circuits 143 are formed on the first insulating layer 136. Since it is not necessary to apply current for electroless plating, there is no fear of damaging the semiconductor chip.

Next, a photosensitive resist 236 constituting the second insulating layer is applied (in a step (J) of FIG. 24).

Then, as shown in a step (K), after a drying treatment, a development treatment is conducted. By doing so, the second insulating layer 236 having non-penetrating holes 136a reaching the respective conductor circuits 143 are formed. While the non-penetrating holes are formed by a chemical treatment herein, it is also possible to use laser to form the non-penetrating holes.

Next, as shown in a step (L) of FIG. 25, copper plated members (vias) 239 are formed in the respective non-penetrating holes 136a. The copper plated members can be obtained by electroplating or electroless plating. While the copper plated members are formed so as not to protrude from the non-penetrating holes 136 herein, it is also possible to form the copper plated members 239 so as to protrude from the non-penetrating holes 136, then to remove the surfaces of the plated members by polishing or the like and to flatten the surfaces.

Thereafter, in a step (M), bumps (or protruding conductors) 44 are formed on the surfaces of the copper plated members 239, respectively.

The semiconductor chip is mounted so that the bumps 44 of the semiconductor chip 30 correspond to the respective pads 52 of the substrate 50 and reflow is conducted, thereby attaching the semiconductor chip 30 to the substrate 50 as shown in FIG. 21.

In this sixth embodiment, the bumps 44 are subjected to reflow, thereby attaching the semiconductor chip 30 to the substrate 50. It is also possible to attach the semiconductor chip to the substrate by an adhesive.

Next, a semiconductor chip and a semiconductor chip manufacturing method according to the seventh embodiment of the present invention will be described.

Figure 26:
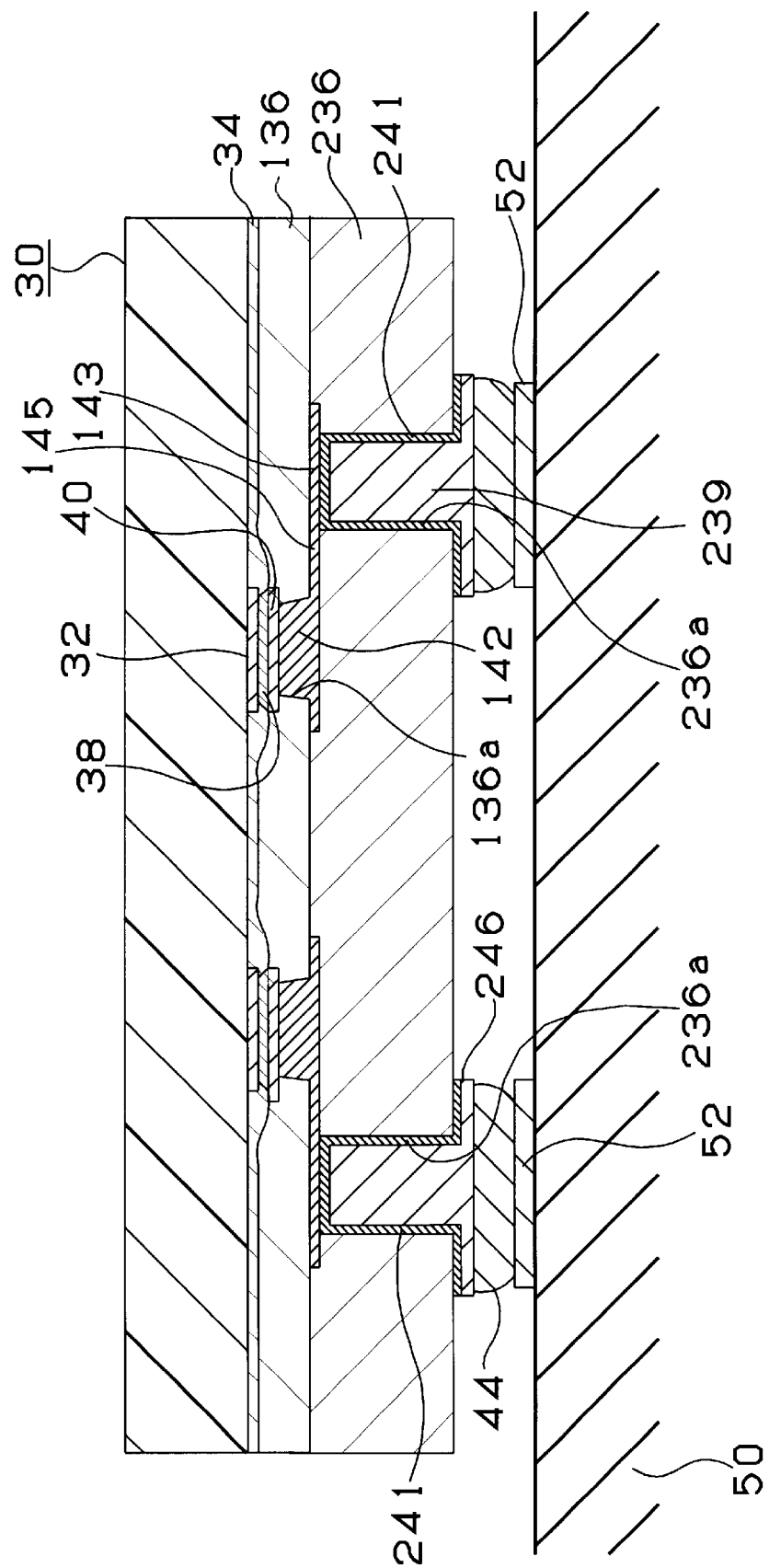
FIG. 26 is a cross-sectional view of a semiconductor chip according to the seventh embodiment of the present invention.

FIG. 26 shows a semiconductor chip according to the seventh embodiment of the present invention.

Aluminum electrode pads 32 which have been subjected to a zincate treatment are formed on the respective openings of a passivation film 34 on the lower surface of the semiconductor chip 30. In this embodiment, the first insulating layer 136 is provided on the lower surface of the passivation film 34 and non-penetrating holes 136a reaching the respective aluminum electrode pads 32 are formed in the first insulating layer 136. An inner via 142 filled with a copper plated member is formed on each aluminum electrode pad 32 at the bottom of each non-penetrating hole 136a through a nickel plated layer 38 and a nickel-copper composite plated layer 40.

The second insulating layer 236 having copper plated members 239 formed therein is provided on the first insulating layer 1136. A land 246 is formed on each copper plated member 239 and a protruding conductor (or bump) 44 made of a low melting point metal such as a solder is formed on the land 246. The semiconductor chip 30 is connected to pads 52 on a substrate 50 side through the protruding conductors (or bumps) 44.

Next, the method of manufacturing the semiconductor chip 30 according to the seventh embodiment will be described with reference to FIGS. 27 to 30.

Figure 28:
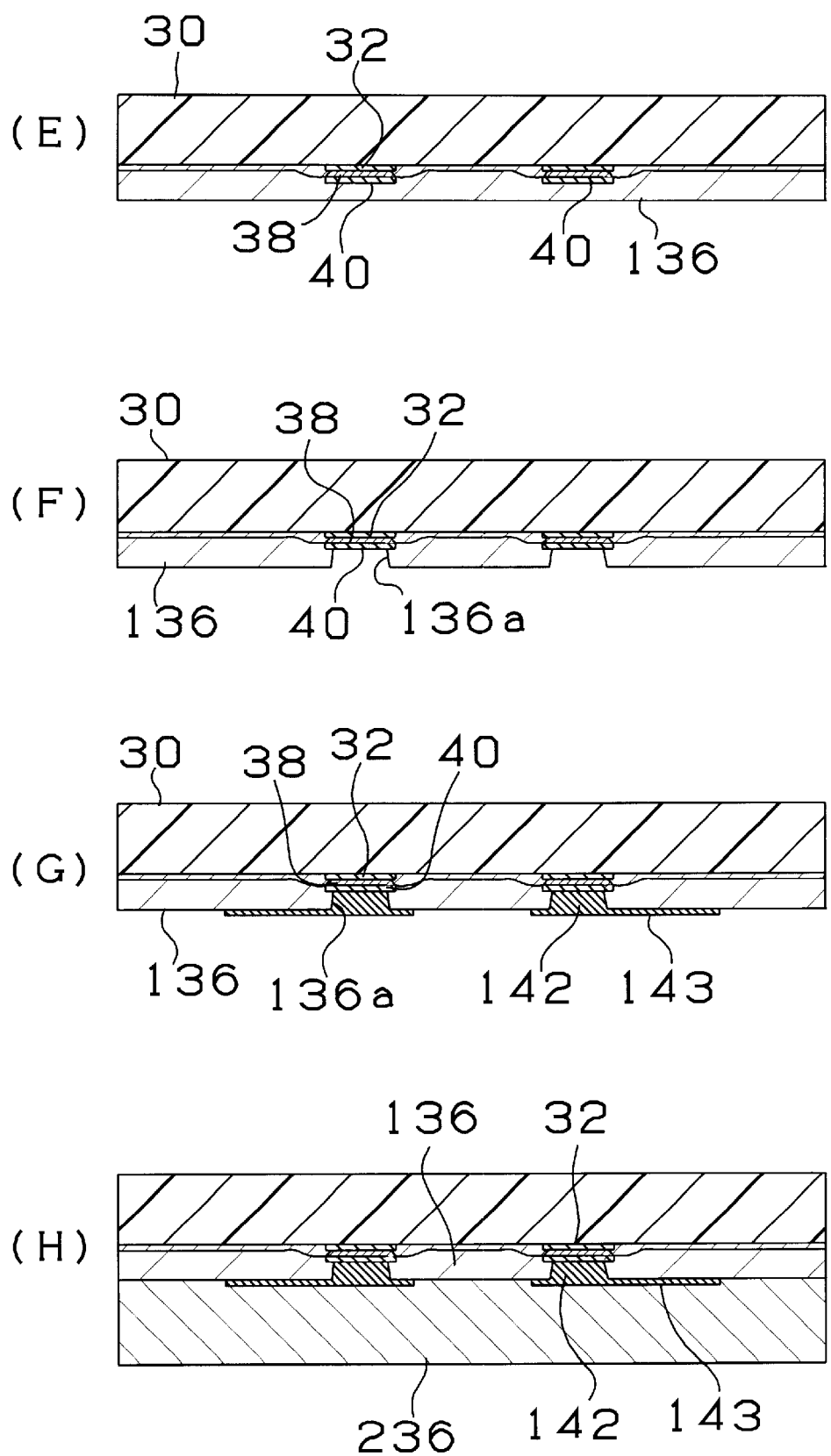
FIG. 28 is a manufacturing step view of the semiconductor chip according to the seventh embodiment.

As in the case of the semiconductor chip manufacturing method according to the fifth embodiment stated above with reference to the step (A) of FIG. 22 to the step (G) of FIG. 23, the first insulating layer 136 provided with inner vias 142 and conductor circuits 143 is formed on the semiconductor chip 30 in a step (A) of FIG. 27 to a step (G) of FIG. 28.

Next, as shown in a step (H) of FIG. 28, a thermosetting epoxy resin or polyimide resin is applied and then a drying treatment is conducted. Then, as shown in a step (I) of FIG. 29, non-penetrating holes (each having a diameter of 20 to 100 $\mu$m) reaching the respective conductor circuits 143 are formed by UV laser, a surface roughening treatment is carried out and the resultant semiconductor chip is heated, thereby forming the second insulating layer 236 having the second non-penetrating holes 236a. Since the non-penetrating holes 236a of the second insulating layer 236 are formed by UV laser, it is possible to form small-diameter non-penetrating holes in the thick second insulating layer 236.

Figure 29:
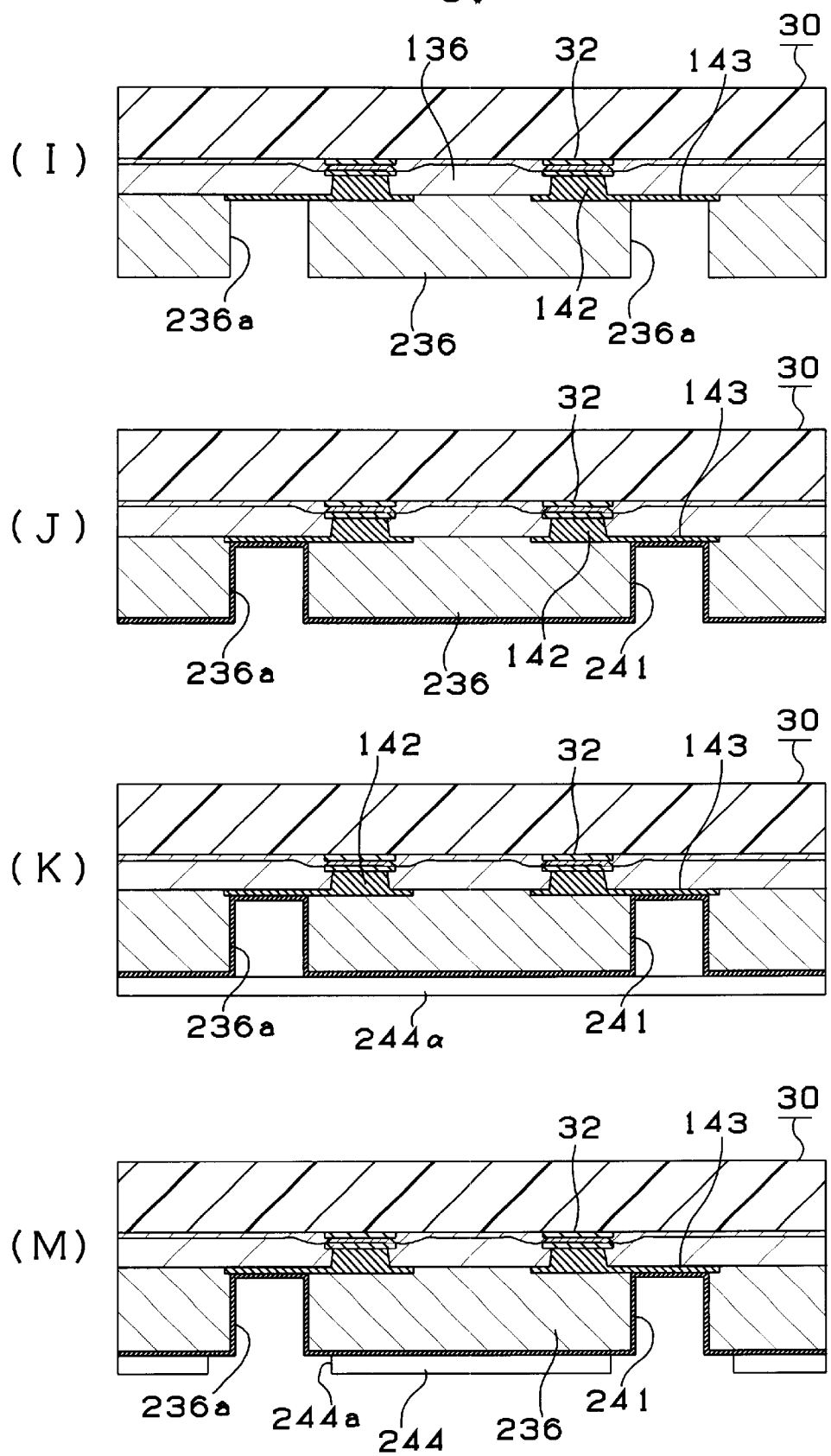
FIG. 29 is a manufacturing step view of the semiconductor chip according to the seventh embodiment.

Next, as shown in a step (J) of FIG. 29, a palladium catalyst (manufactured by Atotech) is added to thereby supply a Pb catalyst to an electroless plated layer 241. Then, the semiconductor chip 30 is immersed in an electroless plating solution and an electroless copper plated layer 241 is formed uniformly on the surface of the second insulating layer 236.

As shown in a step (K) of FIG. 29, a PET (polyethylene terephthalate) film 244α is bonded onto the electroless plated layer 241. Using laser, openings for forming the second non-penetrating holes 236a are provided in the PET film 244α. As shown in a step (M) of FIG. 29, a resist 244 having openings 244a is formed. In this embodiment, since the PET film is used and the openings 244a are provided by laser, the resist 244 can be economically formed.

The semiconductor chip 30 is immersed in an electroplating copper solution and a current is applied through the electroless copper plated layer 241, thereby filling copper in the second non-penetrating holes 236a and forming copper plated members (vias) 239 as shown in a step (N) of FIG. 30. Since the copper plated members are formed by filing copper in the second non-penetrating holes 236a by copper electroplating, it is possible to economically constitute high copper plated members. Besides, since the copper plated members are used, time required for immersing the semiconductor chip in a strong alkaline electroless copper plating solution is shorter than that required for electroless plating. Thus, the fear of damaging the circuits on the semiconductor chip is decreased.

Next, as shown in a step (O) of FIG. 30, solders are deposited on the copper plated members 239 to thereby form solder bumps 44, respectively. In this embodiment, since the PET film (resist) 244 is used, the solder bumps can be economically formed. While solder plating is used herein, it is also possible to use solder printing.

Finally, as shown in a step (P) of FIG. 30, after the resist 244 is removed, the electroless copper plated layer 241 under the resist is peeled off by light etching, thereby completing the formation of the bumps.

The semiconductor chip 30 is mounted so that the bumps 44 of the semiconductor chip 30 correspond to the respective pads 52 of the substrate 50 and reflow is conducted, as shown in FIG. 26, thereby attaching the semiconductor chip 30 to the substrate 50.

Next, a semiconductor chip and a semiconductor chip manufacturing method according to the eighth embodiment of the present invention will be described with reference to the drawings.

Figure 31:
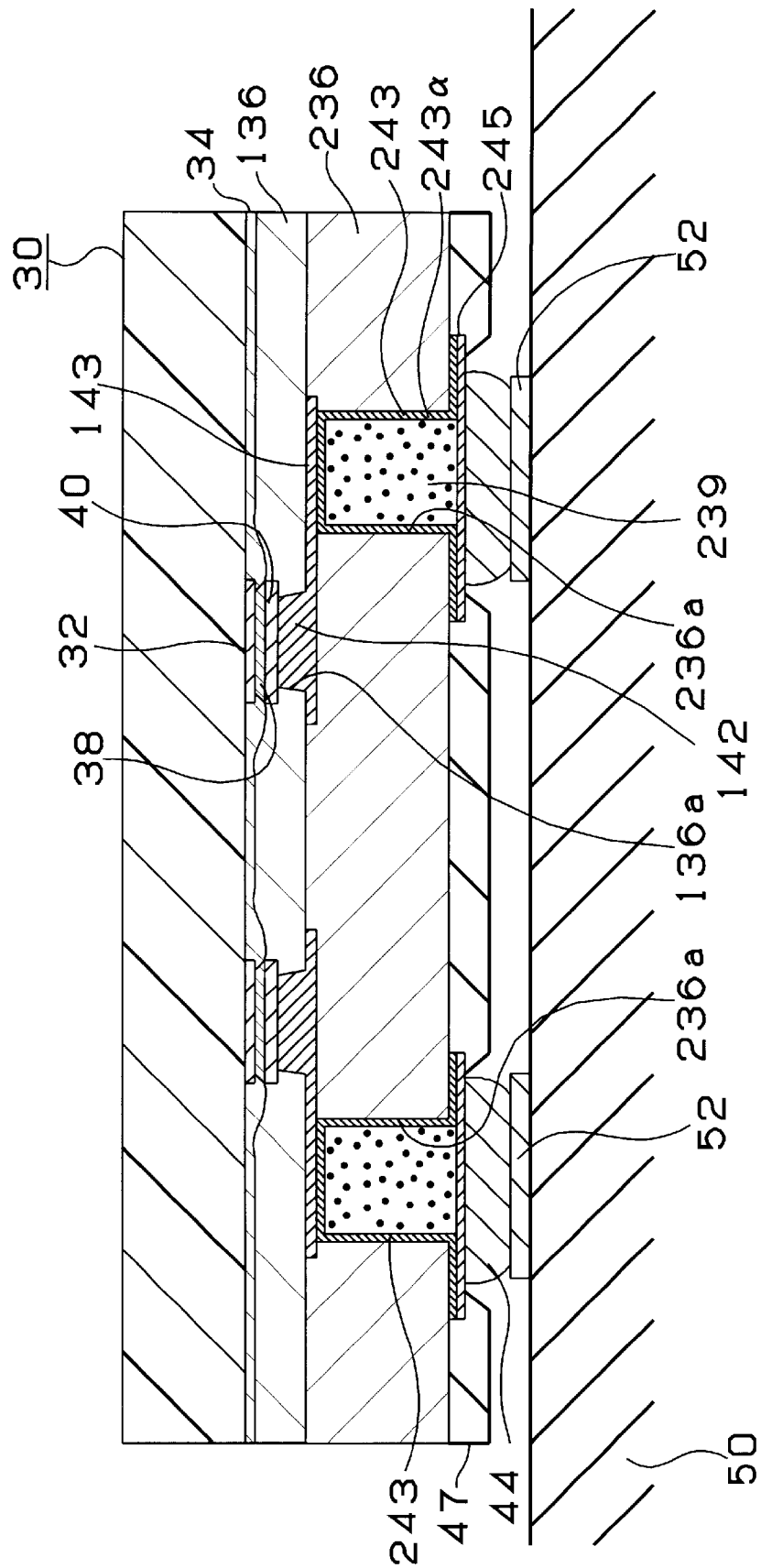
FIG. 31 is a cross-sectional view of a semiconductor chip according to the eighth embodiment of the present invention.

FIG. 31 shows a semiconductor chip according to the eighth embodiment of the present invention.

Aluminum electrode pads 32 which have been subjected to a zincate treatment are formed on the respective openings of a passivation film 34 on the lower surface of the semiconductor chip 30. In this embodiment, the first insulating layer 136 is provided on the lower surface of the passivation film 34 and non-penetrating holes 136a reaching the respective aluminum electrode pads 32 are formed in the first insulating layer 136. Then, an inner via 142 made of a copper plated member is formed on the aluminum electrode pad 32 at the bottom of the non-penetrating hole 136a through a nickel plated layer 38 and a nickel-copper composite plated layer 40 to be electrically connected to the aluminum electrode pad 32 and electrically connected to the conductor circuit 143 on the surface of the first insulating layer 136.

The first insulating layer 136 and the conductor circuits 143 are covered with the second insulating layer 236, non-penetrating holes 236a reaching the respective conductor circuits 143 are provided in the second insulating layer 236 and filled vias each comprising a copper plated layer 243 formed on the bottom and the side surface of each non-penetrating hole 236a and a resin 239 filled in the hole 236a. A metallic film 245 is formed on the surface of the resin 239 filled in the hole. Further, protruding conductors (or bumps) 44 made of a low melting point metal such as a solder are provided. The semiconductor chip 30 is connected to pads 52 on a substrate 50 side through the bumps 44.

Here, the second insulating layer 236 is formed out of a soft resin having an elastic modulus of 1.0 to 3.5 GPa with a thickness of 15 to 200 $\mu$m. By setting the diameter of each non-penetrating hole 236a provided in the second insulating layer 236 at 20 $\mu$m to 250 $\mu$m and thickness of each copper plated layer 243 at 5 to 25 $\mu$m, the filled vias 239 can prohibit excellent flexibility and can absorb a stress generated between the semiconductor chip and the substrate due to the difference in thermal expansion more appropriately. It is, therefore, possible to mount the semiconductor chip to the substrate with high connection reliability and without generating cracks in electrical connection sections.

According to the present invention, a thermosetting epoxy resin, epoxy acrylate resin, polyolefin resin or the like can be used for the second insulating layer.

By constituting the nickel-copper composite plated layer 40 to have a thickness of 0.01 to 5 µm and to have a composition such that a nickel content of the copper plated member-side composite plated layer is 1 to 70 wt % and that the remaining component is substantially copper, it is possible to form the copper-plated inner vias 142 more appropriately.

Next, the method of manufacturing the semiconductor chip 30 according to the eighth embodiment will be described with reference to FIGS. 32 to 34.

Figure 32:
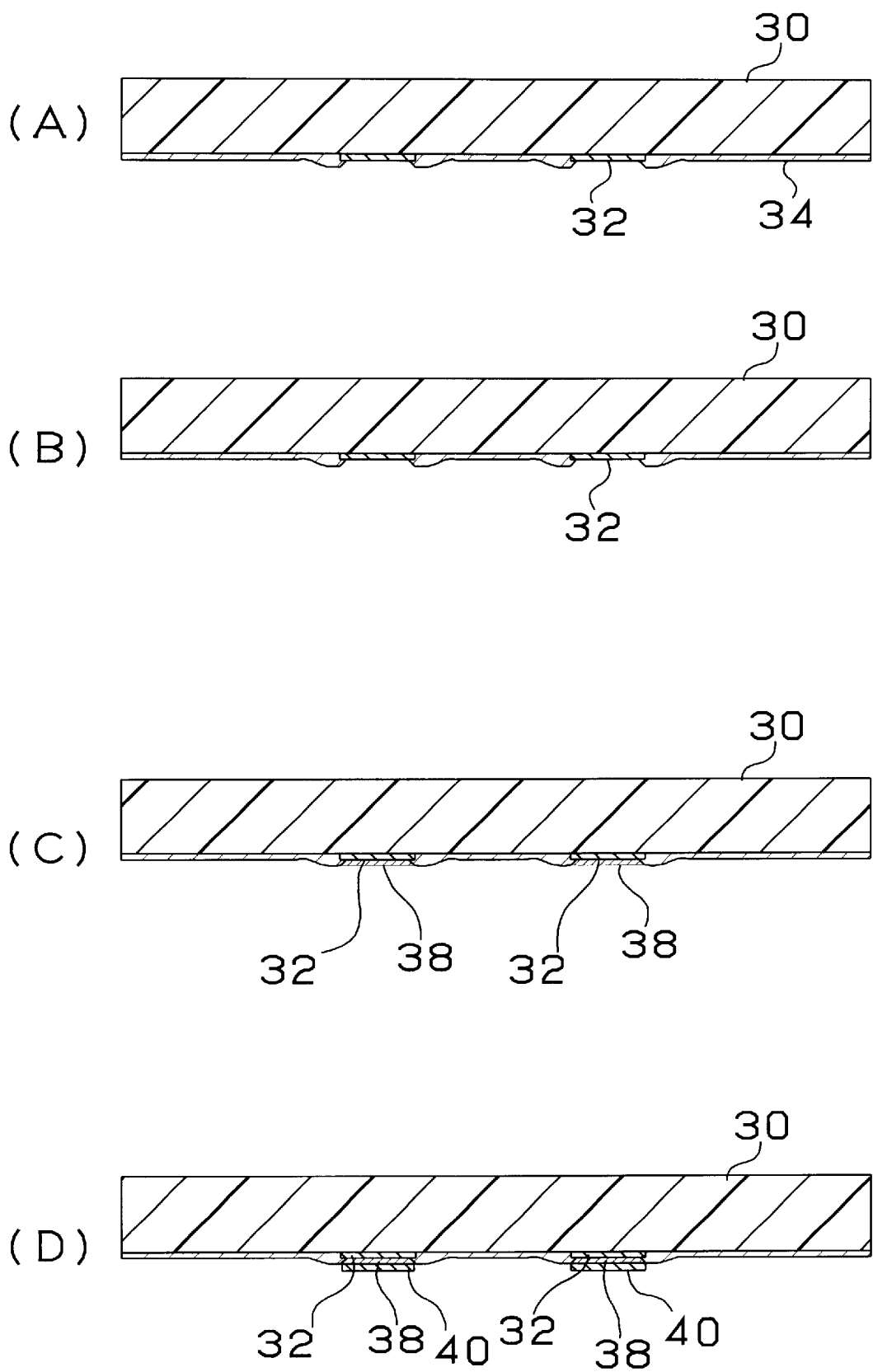
FIG. 32 is a manufacturing step view of the semiconductor chip according to the eighth embodiment.

As in the case of the semiconductor manufacturing method according to the fifth embodiment described above with reference to the step (A) of FIG. 22 to the step (G) of FIG. 23, the first insulating layer 136 having inner vias 143 and conductor circuits 143 is formed on the semiconductor chip 30 in a step (A) of FIG. 32 to a step (G) of FIG. 33.

Figure 34:
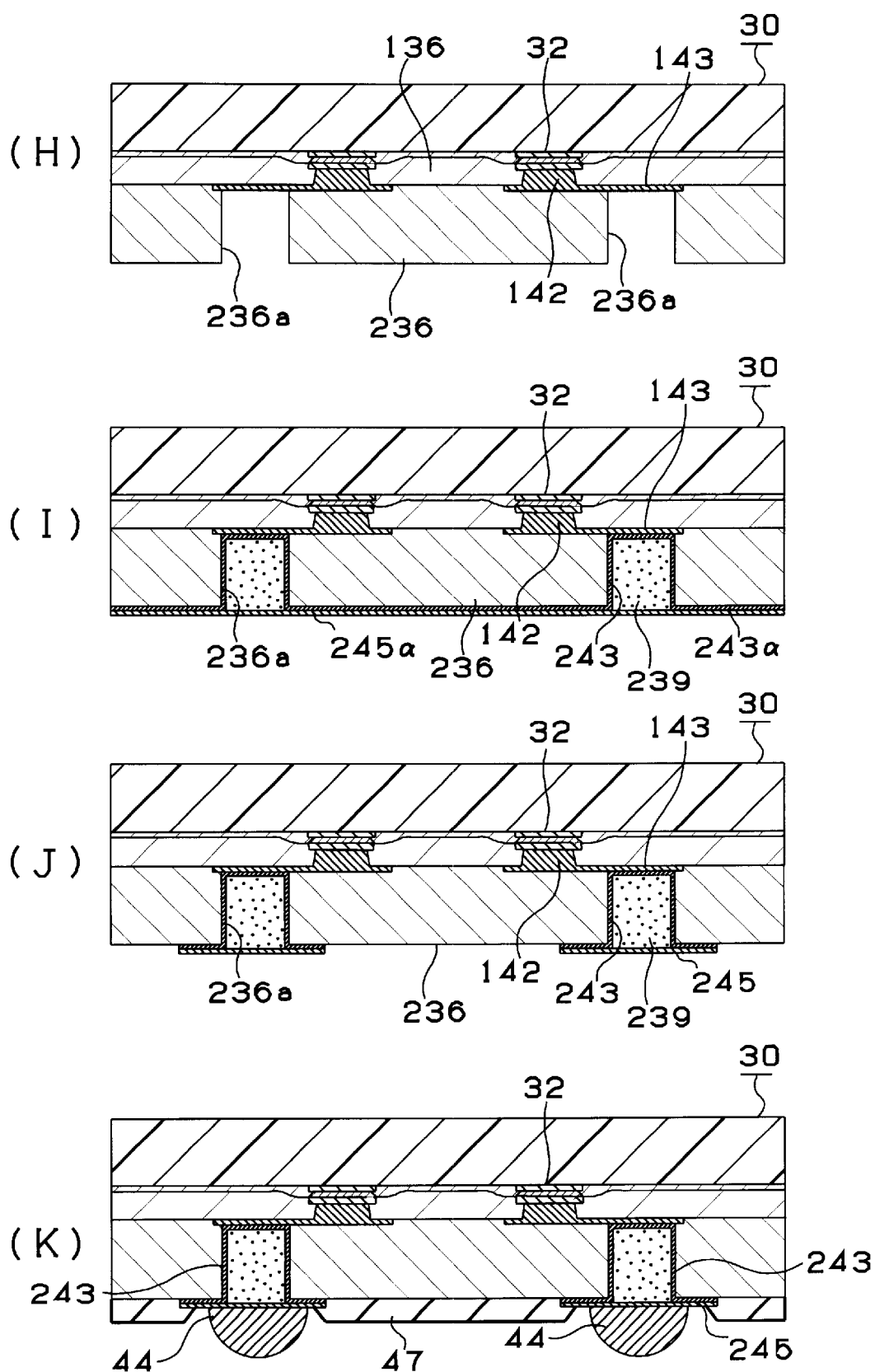
FIG. 34 is a manufacturing step view of the semiconductor chip according to the eighth embodiment.

Next, a thermosetting resin is applied and dried to form the second insulating layer 236 having a thickness of 15 to 200 µm and then non-penetrating holes 236a are formed by CO2 laser as shown in a step (H) of FIG. 34. By using laser, it is possible to form non-penetrating holes having a small diameter (20 to 25 µm) in the thick (15 to 200 µm), second insulating layer 236.

Then, as shown in a step (I) of FIG. 34, an electroless copper plated layer 243a having a thickness of 5 to 25 µm is formed in each non-penetrating hole 236a and a thermosetting resin to which a copper filler is added is filled in the hole. Thereafter, a heating treatment is conducted. The semiconductor chip 30 is immersed in an electroless copper plating solution to thereby form an electroless copper plated layer 245α. Next, as shown in a step (J), the electroless copper plated layer 245α and the electroless copper plated layer 243α are etched away, thereby forming plated covers 245 on the openings of the respective filled vias 243. Here, since a resin 239 filled contains the copper filler as described above, the plated covers 245 can be easily formed.

After forming a resist 47 in a step (K) of FIG. 34, bumps (or protruding conductors) 44 are formed on the surfaces of the respective plated covers 245. The height of each bump is preferably 3 to 60 µm.

The semiconductor chip 30 is mounted so that the bumps 44 of the semiconductor chip 30 correspond to the respective pads 52 of the substrate 50 and reflow is conducted, as shown in FIG. 31, thereby attaching the semiconductor chip 30 to the substrate 50.

In this eighth embodiment, the bumps 44 are subjected to reflow, thereby attaching the semiconductor chip 30 to substrate 50. It is also possible to attach the semiconductor chip to the substrate by an adhesive.

A modification of the semiconductor chip according to this eighth embodiment will be described with reference to FIG. 35. According to the above-stated constitution, the filled vias were formed by filling the thermosetting epoxy resin 239, to which the copper filler is added, in the holes. According to the modification shown in FIG. 35(A), by contrast, a thermosetting epoxy resin 239B which does not contain a copper filler was filled first and a thermosetting epoxy resin 239, to which the copper filler is added, was provided only in the vicinity of the opening portions.

According to a modification shown in FIG. 35(B), after a thermosetting epoxy resin 239B, to which a copper filler is not added, is filled, copper powder 333 are pressed against the surface of the unhardened epoxy resin 239B, heat is applied and then the epoxy resin 239B is hardened.

With the constitution of this modification, by making the copper filler and copper powder exist in the openings of the filled vias 243, it is possible to easily form an electroless copper plated layer 243α by electroless plating. In addition, by not mixing the copper filler, it is possible to enhance the flexibility of the resin in the filled vias 243.

Next, a semiconductor chip and a semiconductor chip manufacturing method according to the ninth embodiment of the present invention will be described with reference to the drawings.

Figure 36:
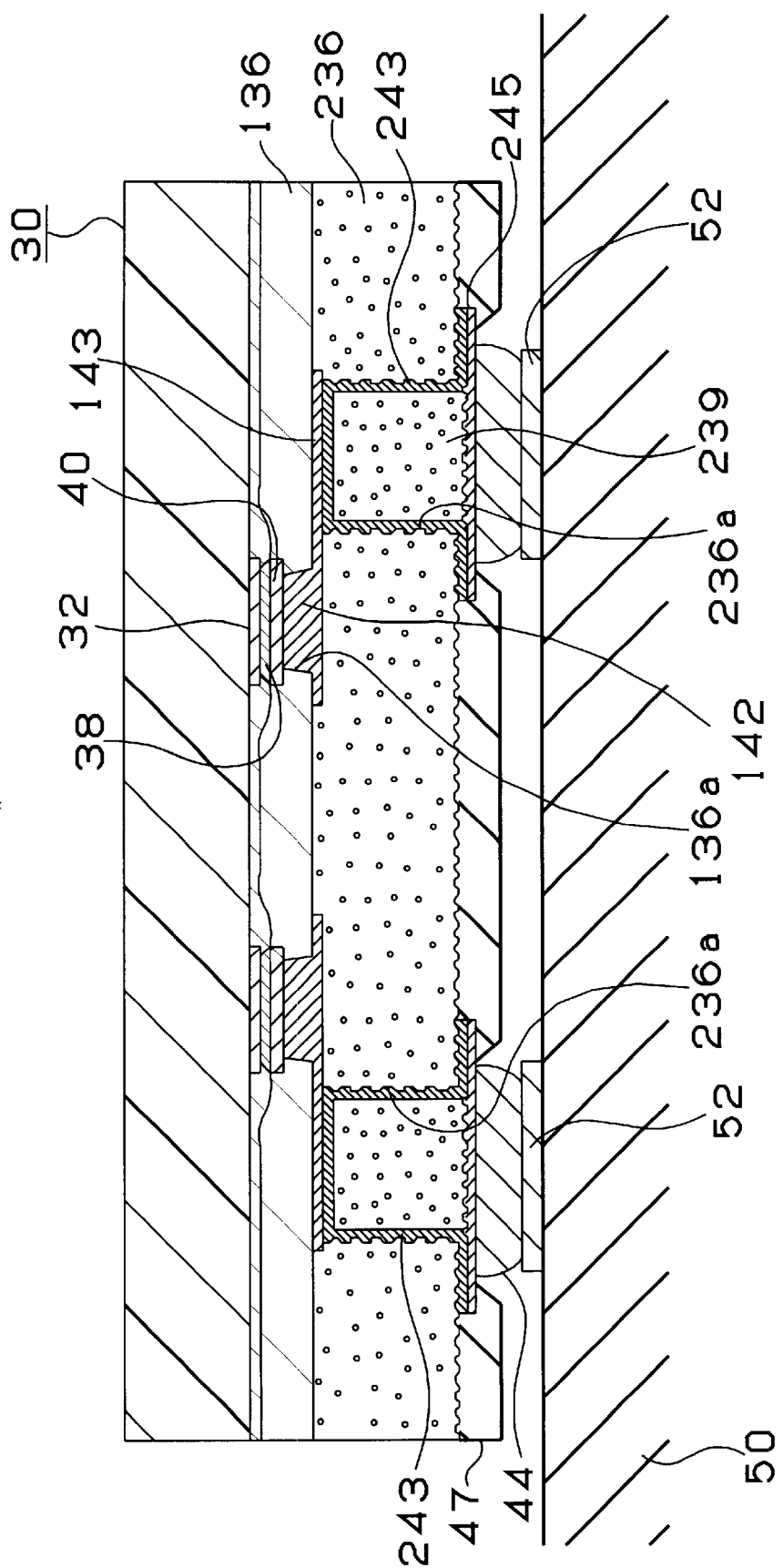
FIG. 36 is a cross-sectional view of a semiconductor chip according to the ninth embodiment of the present invention.

FIG. 36 shows a semiconductor chip according to the ninth embodiment of the present invention.

Aluminum electrode pads 32 which have been subjected to a zincate treatment are formed on the respective openings of a passivation film 34 on the lower surface of the semiconductor chip 30. In this embodiment, the first insulating layer 136 is provided on the lower surface of the passivation film 34 and non-penetrating holes 136a reaching the respective aluminum electrode pads 32 are formed in the first insulating layer 136. An inner via 142 filled with a copper plated member is formed in each aluminum electrode pad 32 at the bottom of each non-penetrating hole 136a through a nickel plated layer 38 and a nickel-copper composite plated layer 40.

The second insulating layer 236 having filled vias 243 filled with a resin 239 is formed on the first insulating layer 136 in the same manner as that in the eighth embodiment. Here, both the resin which forms the second insulating layer and the resin which is filled in the filled vias 243 contain an epoxy filler soluble in an oxidizer, and plated covers (or metallic films) 245 each comprising an electroless copper plated member are formed in the openings of the respective filled vias 243. Protruding conductors (or bumps) 44 made of a low melting point metal such as a solder are provided in the respective plated covers 245. The semiconductor chip 30 is connected to pads 52 on a substrate 50 through the protruding conductors (or bumps) 44.

In this embodiment, the epoxy filler is used as the soluble filler. It is also possible to use the other resin filler or a rubber filler such as a silicon rubber filler.

Next, the method of manufacturing the semiconductor chip 30 according to the ninth embodiment will be described with reference to FIGS. 37 to 39.

Figure 37:
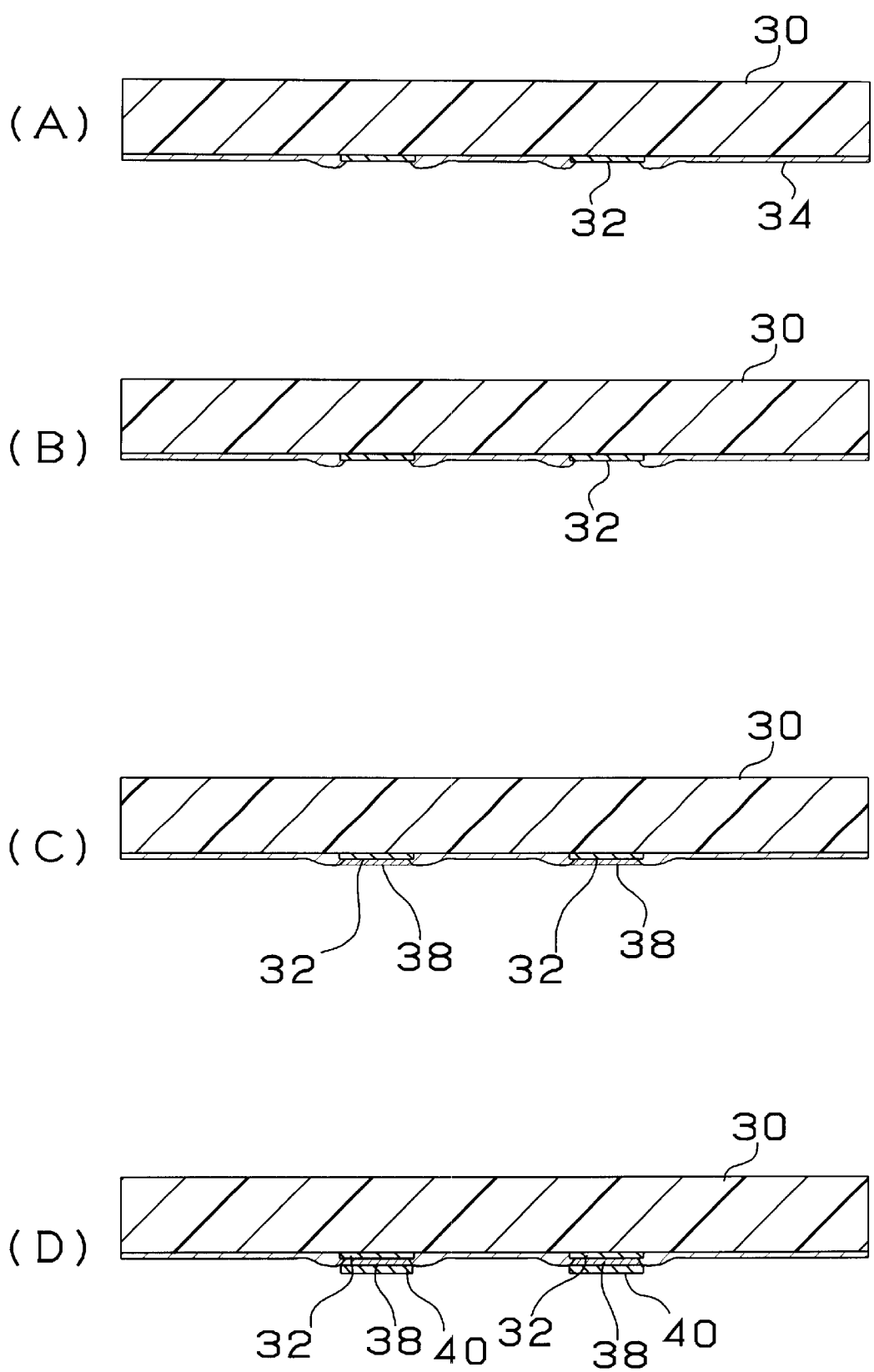
FIG. 37 is a manufacturing step view of the semiconductor chip according to the ninth embodiment.

The first insulating layer 136 having inner vias 142 and conductor circuits 143 is formed on the semiconductor chip 30 in a step (A) of FIG. 37 to a step (G) of FIG. 38 as in case of the semiconductor chip manufacturing method according to the fifth embodiment described above with reference to the step (A) of FIG. 22 to the step (G) of FIG. 23.

Figure 39:
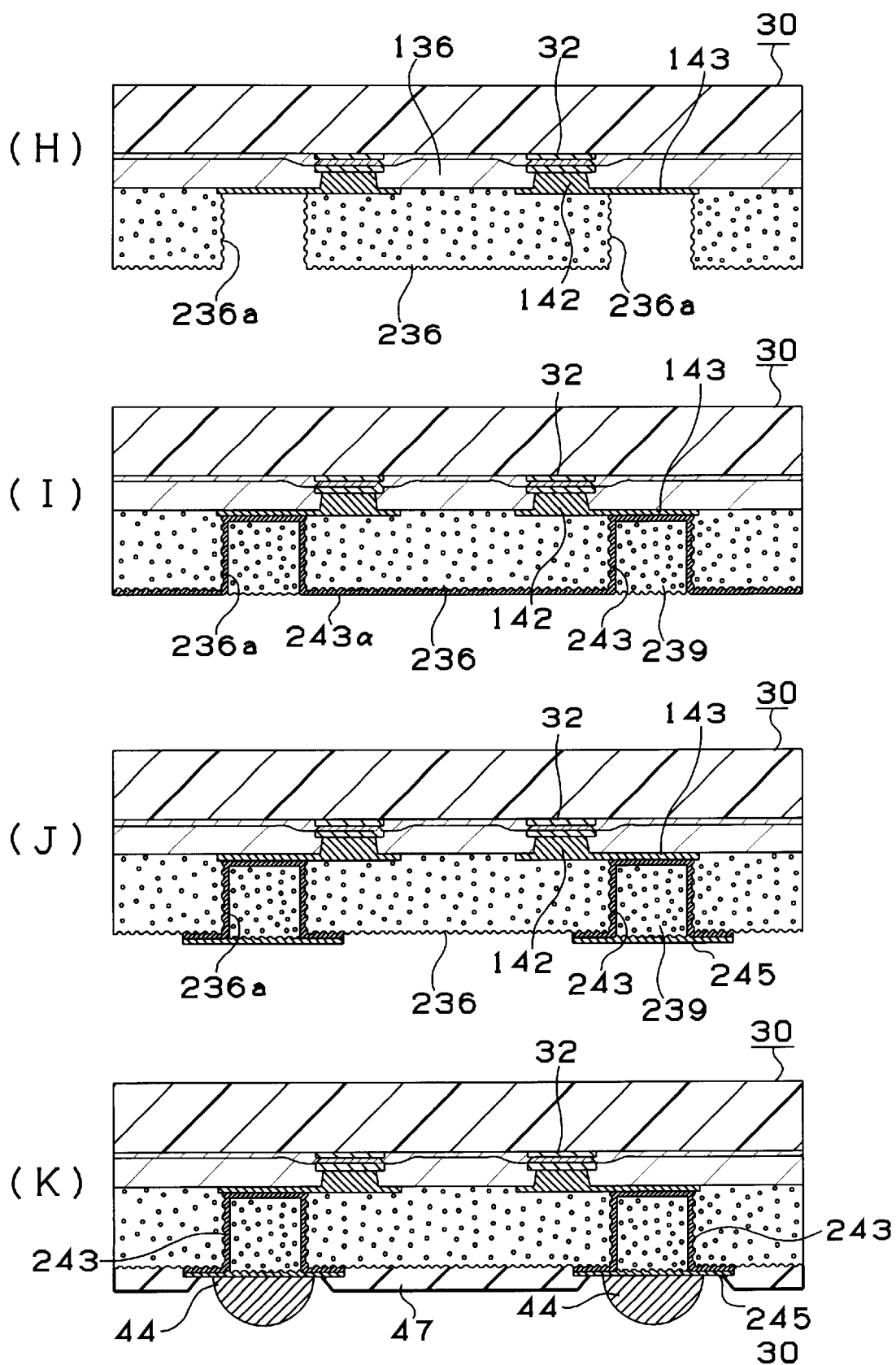
FIG. 39 is a manufacturing step view of the semiconductor chip according to the ninth embodiment.

Next, as shown in a step (H) of FIG. 39, an epoxy acrylate resin composition containing a filler is applied and a hardening treatment is conducted, thereby forming the second insulating layer 236 having a thickness of 15 to 200 µm. Using CO2 laser, non-penetrating holes 236a are formed in the second insulating layer 236. Then, the epoxy filler existing on the surface of the second insulating layer 236 is selectively dissolved and removed with an oxidizer, thereby roughening the surface.

Next, as shown in a step (I) of FIG. 39, filled vias 243 are formed out of electroless copper plated members 243α each having a thickness of 5 to 25 µm in the non-penetrating holes 236a, respectively, the above-stated composition is filled in the filled vias 243 and heat is applied. Then, the epoxy filler existing on the surface of the resin filled in the filled vias is selectively dissolved and removed with an oxidizer, thereby roughening the surface.

The semiconductor chip 30 is immersed in an electroless copper plating solution and an electroless copper plated layer 245α is formed. Here, since the surface of the resin 239 is roughened, it is possible to fixedly attach the openings of the filled vias 245 to the plated covers 245, respectively.

In a step (K) of FIG. 39, bumps (or protruding conductors) 44 are formed as in the same manner as the eighth embodiment.

The semiconductor chip 30 is mounted so that the bumps 44 of the semiconductor chip 30 correspond to the respective pads of the substrate 50 and reflow is conducted, thereby attaching the semiconductor chip 30 to the substrate 50 as shown in FIG. 36.

Next, a semiconductor chip and a semiconductor chip manufacturing method according to the tenth embodiment will be described with reference to FIGS. 40 and 41.

Figure 40:
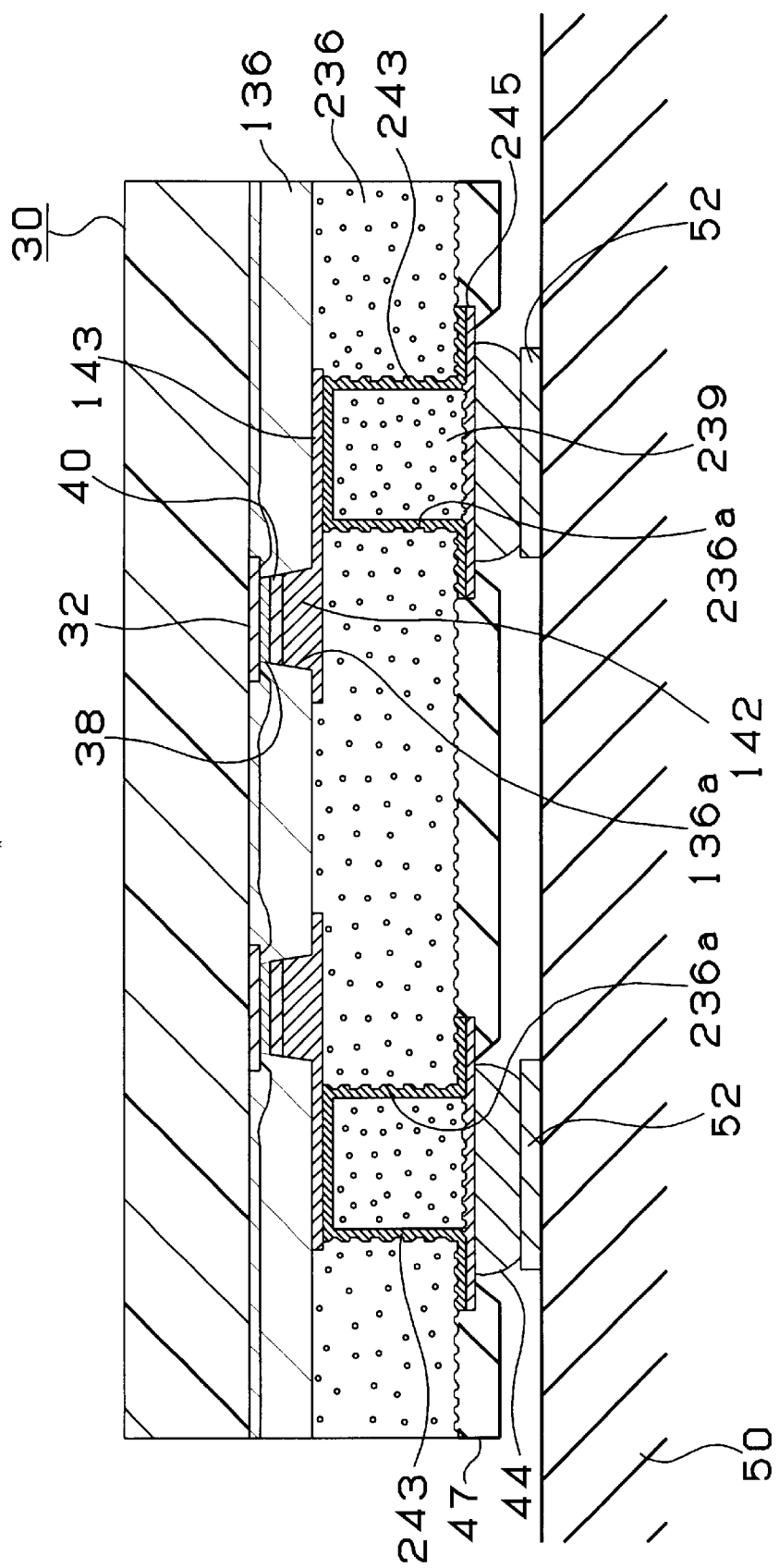
FIG. 40 is a cross-sectional view of a semiconductor chip according to the tenth embodiment of the present invention.

FIG. 40 shows a semiconductor chip according to the tenth embodiment. The semiconductor chip in the tenth embodiment is similar to the semiconductor chip in the ninth embodiment. However, in the ninth embodiment, the nickel plated layer 38 and the nickel-copper composite plated layer 40 are formed on each aluminum electrode pad 32 and then the first insulating layer 136 is formed. In the tenth embodiment, by contrast, the first insulating layer 136 is formed and then a nickel plated layer 38 and a nickel-copper composite plated layer 40 are formed.

The method of manufacturing the semiconductor chip 30 according to the tenth embodiment will be described with reference to FIG. 41.

First, as shown in a step (A) of FIG. 41, an insulating resin is applied to a semiconductor chip. Then, as shown in a step (B), non-penetrating holes 136a are formed by exposure and development treatments. Further, a heating treatment is conducted to thereby form the first insulating layer 136 having non-penetrating holes 136a reaching the respective aluminum pads 32.

Thereafter, the surface of each aluminum electrode pad 32 is subjected to a zincate treatment to facilitate depositing a nickel plated layer or a nickel-copper composite plated layer. Then, as shown in a step (C) of FIG. 41, the semiconductor chip 30 is immersed in an electroless nickel plating solution to thereby deposit a nickel plated layer 38 on the surface of each aluminum electrode pad 32.

As shown in a step (D) of FIG. 41, the semiconductor chip 30 is immersed in a nickel-copper composite plating solution, thereby forming a nickel-copper composite plated layer 40 of 0.1 to 5 μm on the nickel plated layer 38. As shown in a step (E), a copper plated member is filled in each non-penetrating hole 136a to thereby form an inner via 142 and, at the same time, conductor circuits 143 are formed on the first insulating layer 136. The following manufacturing steps are the same as those in the ninth embodiment stated above with reference to FIG. 39, which description will not be given herein.

Next, another example of the semiconductor chip manufacturing method according to the tenth embodiment of the present invention will be described with reference to FIG. 42.

First, as shown in a step (A) of FIG. 42, an insulating resin is applied to the semiconductor chip. Then, as shown in a step (B), first insulating layer 136 having non-penetrating holes 136a are formed by exposure and development treatments. Next, as shown in a step (C), a nickel-copper composite plated layer 40 is directly formed on the surface of each aluminum electrode pad 32. As shown in a step (D), a copper plated member is filled in each non-penetrating hole 136a to thereby form an inner via 142, and conductor circuits are formed on the first insulating layer 136. The following manufacturing steps are the same as those in the ninth embodiment stated above with reference to FIG. 39, which description will not be, therefore, given herein.

While the filled vias are shown to be cylindrical in the drawing showing the eighth embodiment of the present invention, it is also possible to form the filled via in a spread shape in a truncated fashion.

According to the embodiments, a copper-plated via is formed on the surface of an aluminum electrode pad. Since the copper-plated via having flexibility absorbs a stress generated due to the difference in thermal expansion between the semiconductor chip and the substrate, it is possible to mount the semiconductor chip onto the substrate with high reliability and to enhance the connection reliability of the semiconductor chip. Here, it is difficult to copper-plate the surface of the aluminum electrode pad of the semiconductor chip. According to the present embodiments, since a nickel-copper composite plated layer is formed after conducting a zincate treatment to the surface of the aluminum electrode pad, it is possible to form the via on the composite plated layer by copper plating.

The resin insulating layer 36 is a soft insulating layer having an elastic modulus (or tensile elastic modulus) of 1.0 to 3.5 GPa and the flexibility of the copper-plated via is not, therefore, hampered.

By setting the nickel-copper composite plated layer to have a thickness of 0.01 to 5 μm and a nickel content of the copper plated member-side surface of the composite plated layer at 1 to 70 wt %, the via can be formed by copper plating more appropriately.

The via is a filled via formed in the hole provided in the resin insulating layer having a thickness of 15 to 200 μm by copper plating and the via has a diameter of 20 to 100 μm, whereby the via has flexibility appropriate to absorb a stress generated due to the difference in thermal expansion between the semiconductor chip and the substrate.

The via is a filled via which includes an electroless copper plated layer having a thickness of 5 to 25 μm and formed on the bottom portion and the wall surface of the non-penetrating hole having a diameter of 20 to 250 μm and provided in the resin insulating layer having a thickness of 15 to 200 μm, and the resin filled inside of the via. The via has flexibility appropriate to absorb a stress generated due to the difference in thermal expansion between the semiconductor chip and the substrate.

A metallic film is formed on the surface of the filled via filed with the resin, whereby a connection bump such as a solder can be formed on the via.

A hole is formed in the second insulating layer constituted out of a soft resin, a filled via is formed in the hole by copper plating and a stress generated due to the difference in thermal expansion between the semiconductor chip and a substrate is low and not concentrated. Due to this, it is possible to mount the semiconductor chip onto the substrate with high connection reliability without generating cracks in electrical connection sections.

The second insulating layer is a resin insulating layer having an elastic modulus of 1.0 to 3.5 GPa and more appropriately absorbs a stress occurring to the filled via due to the difference in thermal expansion between the semiconductor chip and the substrate.

The second insulating layer has a thickness of 15 to 200 μm, the non-penetrating hole has a diameter of 20 to 100 μm and the filled via has excellent flexibility. Due to this, it is possible to make higher the stress generated due to the difference in thermal expansion between the semiconductor chip and the substrate.

The nickel-copper composite plated layer is formed on the surface of the zincate treated aluminum electrode pad, it is, therefore, possible to form an inner via on the composite plated layer by copper plating. Here, by setting the composite plated layer to have a thickness of 0.01 to 5 μm, the copper plated member-side surface of the plated layer to have a nickel content of 1 to 70 wt % with a remaining component being substantially copper, it is possible to form the inner via by copper plating more appropriately.

The first insulating layer is a photosensitive resin and the non-penetrating hole can be formed by exposing and developing the resin. Due to this, unlike laser, the surface of the electrode pad is not denatured.

Since the inner via is made of an electroless plated member, there is no need to apply current and there is no fear of damaging the semiconductor chip.

The non-penetrating hole is provided in the second insulating layer by laser. Due to this, it is possible to provide the small-diameter hole in the thick second insulating layer. It is noted that any elastic modulus to be explained in the description of the present application is a tensile elastic modulus.

A hole is formed in the second insulating layer constituted out of a soft resin having an elastic modulus (or tensile elastic modulus) of 1.0 to 3.5 GPa, a filled via comprising an electroless copper plated layer deposited on the bottom portion and the wall surface of the non-penetrating hole and a resin filled in the via, and the second insulating layer constituted by the filled via and the soft resin can absorb a stress generated due to the difference in thermal expansion between the semiconductor chip and a substrate. It is, therefore, possible to mount the semiconductor chip onto the substrate with high connection reliability and without generating cracks in electrical connection sections.

The second insulating layer is a resin insulating layer having an elastic modulus of 1.0 to 3.5 GPa and absorbs a stress which occurs to the filled via due to the difference in thermal expansion between the semiconductor chip and the substrate more appropriately.

The second insulating layer has a thickness of 15 to 200 μm, the non-penetrating hole has a diameter of 20 to 250 μm, the copper plated layer has a thickness of 5 to 25 μm and the filled via has excellent flexibility. Due to this, it is possible to make lower the stress generated due to the difference in thermal expansion between the semiconductor chip and the substrate.

The nickel-copper composite plated layer is formed on the surface of the zincate treated aluminum electrode pad. Due to this, it is possible to form an inner via on the composite plated layer by copper plating. Here, by setting the composite plated layer to have a thickness of 0.01 to 5 μm and the copper plated member-side surface of the plated layer to contain 1 to 70 wt % of nickel, with the remaining component being substantially copper, the inner via can be formed more appropriately by copper plating.

The first insulating layer is a photosensitive resin and the non-penetrating hole can be formed by exposing and developing the resin. Due to this, unlike laser, the surface of the electrode pad is not denatured.

The inner via is formed by electroless copper plating. Due to this, there is no need to apply current and there is no fear of damaging the semiconductor chip.

The hole is provided in the second insulating layer by laser. Due to this, it is possible to provide the small-diameter non-penetrating hole in the thick second insulating layer.

A metallic film is formed on the surface of the filled via filled with the resin, it is possible to directly form a bump on the filled via. It is noted that any elastic modulus to be explained in the description of the present application is a tensile elastic modulus.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the Unites States is:

1. A semiconductor chip comprising:
   an aluminum electrode pad a surface of which is subjected to a zincate treatment;
   a nickel-copper composite layer formed on and electrically connected to the surface of the aluminum electrode pad; and
   a copper plated member formed on and electrically connected to the nickel-copper composite layer.

2. A semiconductor chip according to claim 1, wherein said nickel-copper composite layer has a thickness of 0.01 to 5 μm, a composite layer surface of the nickel-copper composite layer on a side of the copper plated member contains 1 to 70% by weight of nickel, and said copper plated member is an electroless copper plated member.

3. A semiconductor chip comprising:
   an aluminum electrode pad which is provided on a chip surface of the semiconductor chip and an electrode surface of which is subjected to a zincate treatment;
   a resin insulating layer provided on the chip surface of the semiconductor chip and having a hole in which the electrode surface of the aluminum electrode pad locates;
   a nickel-copper composite layer formed on and electrically connected to the surface of the aluminum electrode pad in the hole; and
   a via made of a copper plated member, the via being formed on and electrically connected to the nickel-copper composite layer in the hole.

4. A semiconductor chip according to claim 3, wherein said resin insulating layer has an elastic modulus of 1.0 to 3.5 GPa.

5. A semiconductor chip according to claim 2, wherein the resin insulating layer has a thickness of 15 to 200 μm, and wherein said via has a diameter of 20 to 100 μm and is a filled via which is formed in the hole by a copper plating.

6. A semiconductor chip according to claim 3, wherein said via is a filled via comprising an electroless copper plated layer having a thickness of 5 to 25 μm and formed at a bottom portion and a wall surface of the hole provided in the resin insulating layer having a thickness of 15 to 200 μm, having a diameter of 20 to 250 μm and reaching the surface of the aluminum electrode pad, and a resin filled in the via.

7. A semiconductor chip according to claim 6, wherein a metallic film is formed on a surface of the filled via which is filled with the resin.

8. A semiconductor chip according to claim 3, wherein said nickel-copper composite layer has a thickness of 0.01 to 5 μm, a composite layer surface of the nickel-copper composite layer on a side of the copper plated member contains 1 to 70% by weight of nickel, and said copper plated member is an electroless copper plated member.

9. A semiconductor chip manufacturing method comprising:
  (1) forming a resin insulating layer on a surface of a semiconductor chip on a side of an aluminum electrode pad, and then forming a hole in said resin insulating layer to reach the aluminum electrode pad;
  (2) conducting a zincate treatment to the aluminum electrode pad at a bottom of said hole, and then forming a nickel-copper composite plated layer on the aluminum electrode pad; and
  (3) forming a via made of a copper plated member on the nickel-copper composite plated layer in said hole.

10. A semiconductor chip manufacturing method according to claim 9, wherein said resin insulating layer is a photosensitive resin and is exposed and developed to form the hole.

11. A semiconductor chip manufacturing method according to claim 9, wherein said copper plated member is an electroless copper plated member.

12. A semiconductor chip manufacturing method according to claim 9, wherein said nickel-copper composite plated layer has a thickness of 0.01 to 5 $\mu$m, a copper plated member-side surface of said composite plated layer contains 1 to 70% by weight of nickel, and said copper plated member is an electroless copper plated member.

13. A semiconductor chip manufacturing method according to claim 9, wherein said via is a filled via made of the copper plated member and formed in the hole which is formed in the resin insulating layer having a thickness of 15 to 200 $\mu$m, and wherein said via has a diameter of 20 to 100 $\mu$m.

14. A semiconductor chip manufacturing method according to claim 9, wherein said via is a filled via comprising an electroless copper plated layer having a thickness of 5 to 25 $\mu$m and formed on a bottom portion and a wall surface of the hole having a diameter of 20 to 250 $\mu$m provided in the resin insulating layer having a thickness of 15 to 200 $\mu$m, and a resin filled in the via.

15. A semiconductor chip manufacturing method according to claim 14, wherein a metallic film is formed on a surface of the filled via filled with the resin.

16. A semiconductor chip manufacturing method comprising:
  (1) conducting a zincate treatment to a surface of an aluminum electrode pad of a semiconductor chip, and then forming a nickel-copper composite plated layer on the surface of an aluminum electrode pad;
  (2) forming a resin insulating layer on an aluminum electrode pad-side surface of said semiconductor chip, and then forming a hole in said resin insulating layer to reach the nickel-copper composite plated layer; and
  (3) forming a via made of a copper plated member on said nickel-copper composite plated layer in said hole.

17. A semiconductor chip manufacturing method according to claim 16, wherein said resin insulating layer is a photosensitive resin and is exposed and developed to form the hole.

18. A semiconductor chip manufacturing method according to claim 16, wherein said copper plated member is an electroless copper plated member.

19. A semiconductor chip manufacturing method according to claim 16, wherein said nickel-copper composite plated layer has a thickness of 0.01 to 5 $\mu$m, a copper plated member-side surface of said composite plated layer contains 1 to 70% by weight of nickel, and said copper plated member is an electroless copper plated member.

20. A semiconductor chip manufacturing method according to claim 16, wherein said via is a filled via made of the copper plated member and formed in the hole which is formed in the resin insulating layer having a thickness of 15 to 200 $\mu$m, and wherein said via has a diameter of 20 to 100 $\mu$m.

21. A semiconductor chip manufacturing method according to claim 16, wherein said via is a filled via comprising an electroless copper plated layer having a thickness of 5 to 25 $\mu$m and formed on a bottom portion and a wall surface of the hole having a diameter of 20 to 250 $\mu$m provided in the resin insulating layer having a thickness of 15 to 200 $\mu$m, and a resin filled in the via.

22. A semiconductor chip manufacturing method comprising:
  (1) conducting a zincate treatment to a surface of an aluminum electrode pad of a semiconductor chip, and then forming a nickel-copper composite plated layer on the surface of the aluminum electrode pad;
  (2) forming an electroless copper plated layer on an aluminum electrode pad-side surface of said semiconductor chip;
  (3) forming a plating resist layer on a surface of the electroless copper plated layer of said semiconductor chip, and then forming a hole to reach said electroless copper plated layer;
  (4) filling said hole with a copper plated member to form a via; and
  (5) removing said plating resist layer, and then conducting an etching treatment to remove the electroless plated layer below the plating resist layer.

23. A semiconductor chip manufacturing method according to claim 22, wherein the copper plated member in said step (4) is an electroplated member.

24. A semiconductor chip manufacturing method according to claim 22, wherein said via is a filled via made of the copper plated member and formed in the hole which is formed in the resin insulating layer having a thickness of 15 to 200 $\mu$m, and wherein said via has a diameter of 20 to 100 $\mu$m.

25. A semiconductor chip manufacturing method according to claim 22, wherein said via is a filled via comprising an electroless copper plated layer having a thickness of 5 to 25 $\mu$m and formed on a bottom portion and a wall surface of the hole having a diameter of 20 to 250 $\mu$m provided in the resin insulating layer having a thickness of 15 to 200 $\mu$m, and a resin filled in the via.

26. A semiconductor chip comprising:
  a first insulating layer, a conductor circuit layer and a second insulating layer which are build up in this order on an electrode pad side of the semiconductor chip;
  an inner via electrically connecting the electrode pad of the semiconductor chip to the conductor circuit layer, the inner via being formed in said first insulating layer; and
  said second insulating layer being a soft insulating layer and provided with a hole reaching the conductor circuit layer, a filled via being made of a copper plated member in the hole,
  wherein the electrode pad of said semiconductor chip is a zincate treated aluminum electrode, and a copper plated member is formed on said electrode pad in said inner via through a nickel-copper composite plated layer.

27. A semiconductor chip according to claim 26, wherein said nickel-copper composite plated layer has a thickness of 0.01 to 5 $\mu$m, and wherein a copper plated member-side surface of said composite plated layer contains 1 to 70% by weight of nickel.

28. A semiconductor chip manufacturing method comprising:
(1) forming a first insulating layer on an aluminum electrode pad-side surface of a semiconductor chip, and then forming a first hole reaching an aluminum electrode pad;
(2) conducting a zincate treatment to the aluminum electrode pad at a bottom portion of said first hole, and then forming a nickel-copper composite plated layer;
(3) copper-plating an inside of said hole and a surface of the first insulating layer, and forming an inner via and a conductor circuit layer;
(4) covering said first insulating layer and said conductor circuit layer with a soft resin, and forming a second insulating layer;
(5) forming a second hole in said second insulating layer, the second hole reaching the conductor circuit layer; and
(6) filling said second hole with a copper plated member, and forming a filled via.

29. A semiconductor chip manufacturing method according to claim 28, wherein said second insulating layer is a resin insulating layer having an elastic modulus of 1.0 to 3.5 GPa.

30. A semiconductor chip manufacturing method according to claim 28, wherein said first insulating layer is a photosensitive resin and said first insulating layer is exposed and developed to form the first hole.

31. A semiconductor chip manufacturing method according to claim 28, wherein said inner via is made of an electroless copper plated member.

32. A semiconductor chip manufacturing method according to claim 28, wherein the second hole of said second insulating layer is formed by laser.

33. A semiconductor chip manufacturing method according to claim 28, wherein said nickel-copper composite plated layer is formed to have a thickness of 0.01 to 5 µm, and wherein a nickel content of a copper plated member-side surface of the composite plated layer is 1 to 70% by weight.

34. A semiconductor chip manufacturing method according to claim 28, wherein said second interlayer insulating layer is formed to have a thickness of 15 to 200 µm, and wherein the second hole having a diameter of 20 to 100 µm is formed.

35. A semiconductor chip manufacturing method comprising:
(1) conducting a zincate treatment to a surface of an aluminum electrode pad of a semiconductor chip, and then forming a nickel-copper composite plated layer;
(2) forming a first insulating layer on an aluminum electrode pad-side surface of said semiconductor chip, and then forming a first hole reaching the neckel-coppre composite plated layer;
(3) copper-plating an inside of said first hole and a surface of the first insulating layer, and forming an inner via and a conductor circuit layer;
(4) covering said first insulating layer and said conductor circuit layer with a soft resin, and forming a second insulating layer;
(5) forming a second hole in said second insulating layer, the second hole reaching the conductor circuit layer; and
(6) filling said second hole with a copper plated member, and forming a filled via.

36. A semiconductor chip manufacturing method according to claim 23, wherein said second insulating layer is a resin insulating layer having an elastic modulus of 1.0 to 3.5 GPa.

37. A semiconductor chip manufacturing method according to claim 35, wherein said first insulating layer is a photosensitive resin and said first insulating layer is exposed and developed to form the first hole.

38. A semiconductor chip manufacturing method according to claim 35, wherein said inner via is made of an electroless copper plated member.

39. A semiconductor chip manufacturing method according to claim 35, wherein the second hole of said second insulating layer is formed by laser.

40. A semiconductor chip manufacturing method according to claim 35, wherein said nickel-copper composite plated layer is formed to have a thickness of 0.01 to 5 µm, and wherein a nickel content of a copper plated member-side surface of the composite plated layer is 1 to 70% by weight.

41. A semiconductor chip manufacturing method according to claim 35, wherein said second interlayer insulating layer is formed to have a thickness of 15 to 200 µm, and wherein the second hole having a diameter of 20 to 100 µm is formed.

42. A semiconductor chip comprising:
an electrode pad;
a first insulating layer formed on a surface of the semiconductor chip on a side of the electrode pad;
a conductor circuit layer formed on first insulating layer;
a second insulating layer formed on the first insulating layer and the conductor circuit layer, said second insulating layer being a soft insulating layer and being provided with a hole reaching the conductor circuit layer;
an inner via formed in said first insulating layer and electrically connecting the electrode pad to the conductor circuit layer; and
a filled via formed in the second insulating layer and including an electroless copper plated layer formed on a bottom portion and a wall surface of the hole in which a resin is filled.

43. A semiconductor chip according to claim 42, wherein said second insulating layer is a resin insulating layer having an elastic modulus of 1.0 to 3.5 GPa.

44. A semiconductor chip according to claim 42, wherein said second insulating layer has a thickness of 15 to 200 µm, the hole has a diameter of 20 to 250 µm, and said copper plated layer has a thickness of 5 to 25 µm.

45. A semiconductor chip according to claim 42, wherein the electrode pad of said semiconductor chip is a zincate treated aluminum electrode, and a copper plated member is formed on said electrode pad in said inner via through a nickel-copper composite plated layer.

46. A semiconductor chip according to claim 45, wherein said nickel-copper composite plated layer has a thickness of 0.01 to 5 µm, a copper plated member-side surface of the plated layer contains 1 to 70% by weight of nickel, and a remaining composition mainly comprises copper.

47. A semiconductor chip according to claim 42, wherein a metallic film is formed on a surface of the filled via filled with the resin.

48. A semiconductor chip manufacturing method comprising:
(1) forming a first insulating layer on an aluminum electrode pad-side surface of a semiconductor chip, and then forming a first hole reaching an aluminum electrode pad;

(2) conducting a zincate treatment to the aluminum electrode pad on a bottom portion of said first hole, and then forming a nickel-copper composite plated layer;

(3) copper-plating an inside of said first hole and a surface of the first insulating layer, and forming an inner via and a conductor circuit layer;

(4) covering said first insulating layer and the conductor circuit layer with a soft resin, and forming a second insulating layer;

(5) forming a second hole in said second insulating layer, the second hole reaching the conductor circuit layer; and (6) forming an electroless copper plated layer on a bottom portion and a wall surface of said second hole, then filling a resin in the electroless copper plated layer, and forming a filled via.

49. A-semiconductor chip manufacturing method according to claim 48, wherein said first insulating layer is a photosensitive resin, and exposed and developed to thereby form the first hole.

50. A semiconductor chip manufacturing method according to claim 48, wherein said inner via is made of an electroless copper plated member.

51. A semiconductor chip manufacturing method according to claim 48, wherein said second insulating layer is a resin insulating layer having an elastic modulus of 1.0 to 3.5 GPa.

52. A semiconductor chip manufacturing method according to claim 48, wherein the second hole of said second insulating layer is formed by laser.

53. A semiconductor chip manufacturing method according to claim 48, wherein said nickel-copper composite plated layer has a thickness of 0.01 to 5 μm, a copper plated member-side surface of the plated layer contains 1 to 70% by weight of nickel, and a remaining component is substantially copper.

54. A semiconductor chip manufacturing method according to claim 48, wherein said second insulating layer has a thickness of 15 to 200 μm, the second hole has a diameter of 20 to 250 μm, and the copper plated layer has a thickness of 5 to 25 μm.

55. A semiconductor chip manufacturing method according to claim 48, wherein a metallic film is formed on a surface of the filled via filled with the resin.

56. A semiconductor chip manufacturing method according to claim 55, wherein the resin filled in said via contains a soluble filler, and the resin at an opening of said via is roughened by dissolving the soluble filler.

57. A semiconductor chip manufacturing method according to claim 55, wherein the resin filled in said via contains a soluble filler, and the resin constituting said insulating layer also contains a filler so as to have almost an equal elastic modulus as an elastic modulus of the filled resin.

58. A semiconductor chip manufacturing method comprising:

(1) conducting a zincate treatment to a surface of an aluminum electrode pad of a semiconductor chip, and then forming a nickel-copper composite plated layer;

(2) forming a first insulating layer on an aluminum electrode pad-side surface of said semiconductor chip, and then forming a first hole reaching the nickel-copper composite plated layer;

(3) copper-plating an inside of said first hole and a surface of the first insulating layer, and forming an inner via and a conductor circuit layer;

(4) covering said first insulating layer and the conductor circuit layer with a soft resin, and forming a second insulating layer;

(5) forming a second hole in said second insulating layer, the second hole reaching the conductor circuit layer; and (6) forming an electroless copper plated layer on a bottom portion and a wall surface of said second hole, then filling a resin in the electroless copper plated layer, and forming a filled via.

59. A semiconductor chip manufacturing method according to claim 58, wherein said first insulating layer is a photosensitive resin, and exposed and developed to thereby form the first hole.

60. A semiconductor chip manufacturing method according to claim 58, wherein said inner via is made of an electroless copper plated member.

61. A semiconductor chip manufacturing method according to claim 58, wherein said second insulating layer is a resin insulating layer having an elastic modulus of 1.0 to 3.5 GPa.

62. A semiconductor chip manufacturing method according to claim 58, wherein the second hole of said second insulating layer is formed by laser.

63. A semiconductor chip manufacturing method according to claim 58, wherein said nickel-copper composite plated layer has a thickness of 0.01 to 5 μm, a copper plated member-side surface of the plated layer contains 1 to 70% by weight of nickel, and a remaining component is substantially copper.

64. A semiconductor chip manufacturing method according to claim 58, wherein said second insulating layer has a thickness of 15 to 200 μm, the second hole has a diameter of 20 to 250 μm, and the copper plated layer has a thickness of 5 to 25 μm.

65. A semiconductor chip manufacturing method according to claim 58, wherein a metallic film is formed on a surface of the filled via filled with the resin.

* * * * *